United States Patent
Nakamura et al.

(10) Patent No.: US 7,075,305 B2
(45) Date of Patent: Jul. 11, 2006

(54) METHOD AND DEVICE FOR JUDGING THE CONDITION OF SECONDARY BATTERIES AND METHOD FOR REGENERATING SECONDARY BATTERIES

(75) Inventors: Kenji Nakamura, Toyota (JP); Takashi Ito, Toyota (JP); Taketoshi Minohara, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 11/129,493

(22) Filed: May 16, 2005

(65) Prior Publication Data

US 2005/0206389 A1    Sep. 22, 2005

Related U.S. Application Data

(60) Division of application No. 10/161,693, filed on Jun. 5, 2002, now Pat. No. 6,924,623, which is a continuation-in-part of application No. 09/779,466, filed on Feb. 9, 2001, now abandoned, which is a continuation of application No. PCT/JP99/03866, filed on Jul. 16, 1999.

(30) Foreign Application Priority Data

| Aug. 10, 1998 | (JP) | ................................. 10-226307 |
| Dec. 15, 1998 | (JP) | ................................. 10-356664 |
| Feb. 12, 1999 | (JP) | ................................. 11-34890 |
| Apr. 26, 1999 | (JP) | ................................. 11-18732 |

(51) Int. Cl.
*G01N 27/416* (2006.01)
(52) U.S. Cl. ................................ 324/430
(58) Field of Classification Search ........ 324/430, 324/426
See application file for complete search history.

(56) References Cited

U.S. PATENT DOCUMENTS

| 4,290,021 | A | | 9/1981 | Theron et al. ............... 324/429 |
| 4,342,954 | A | | 8/1982 | Griffith .......................... 4/131 |
| 5,204,611 | A | | 4/1993 | Nor et al. .................... 320/145 |
| 5,705,929 | A | * | 1/1998 | Caravello et al. ........... 324/430 |
| 5,717,336 | A | * | 2/1998 | Basell et al. ................ 324/430 |
| 5,744,962 | A | * | 4/1998 | Alber et al. ................ 324/426 |
| 5,773,978 | A | * | 6/1998 | Becker ....................... 324/430 |
| 5,874,168 | A | | 2/1999 | Kiyokawa et al. .......... 428/407 |
| 5,986,435 | A | | 11/1999 | Koenck ...................... 320/136 |

(Continued)

FOREIGN PATENT DOCUMENTS

EP        0 905 810        3/1999

(Continued)

*Primary Examiner*—Pia Tibbits
(74) *Attorney, Agent, or Firm*—Buchanan Ingersoll PC

(57) ABSTRACT

The internal resistance related value which is related to the internal resistance of a secondary battery is compared with a previously obtained relation between the internal resistance related value and battery condition to judge the battery condition of the secondary battery. Since the internal resistance related value is a value related to the internal resistance which closely depends on the battery condition, the battery condition can be judged in detail based on the above relation. And the internal resistance related value can be obtained more speedily with a predetermined method. On the other hand, when the level of the degradation of a negative electrode is low, an electrolyte is supplemented, and when the level of the degradation of the negative electrode is high, a reducing agent is added to the electrolyte to regenerate the secondary battery. With this regenerating method, the performance of the negative electrode can be recovered without degrading a positive electrode.

3 Claims, 24 Drawing Sheets

U.S. PATENT DOCUMENTS

| | | | |
|---|---|---|---|
| 6,081,098 A | 6/2000 | Bertness et al. | 320/134 |
| 6,172,505 B1 | 1/2001 | Bertness | 324/430 |
| 6,310,481 B1 | 10/2001 | Bertness | 324/430 |

FOREIGN PATENT DOCUMENTS

| | | |
|---|---|---|
| JP | 53-43842 | 4/1978 |
| JP | 56-126774 | 5/1981 |
| JP | 62-285360 | 12/1987 |
| JP | 7-22073 | 1/1995 |
| JP | 7-29614 | 1/1995 |
| JP | 8-17477 | 1/1996 |
| JP | 8-43506 | 2/1996 |
| JP | 8-43507 | 2/1996 |
| JP | 8-115752 | 5/1996 |
| JP | 8-222279 | 8/1996 |
| JP | 9-045319 | 2/1997 |
| JP | 9-61505 | 3/1997 |
| JP | 09-061505 | 3/1997 |
| JP | 09-084275 | 3/1997 |
| JP | 09-161853 | 6/1997 |
| JP | 9-232005 | 9/1997 |
| JP | 10-56744 | 2/1998 |
| JP | 10-221418 | 8/1998 |

\* cited by examiner

METHOD AND DEVICE FOR JUDGING THE CONDITION OF SECONDARY BATTERIES AND METHOD FOR REGENERATING SECONDARY BATTERIES

This application is a divisional of U.S. application Ser. No. 10/161,693 filed Jun. 5, 2002 now U.S. Pat. No. 6,924,623, which is a continuation-in-part of U.S. application Ser. No. 09/779,466, filed Feb. 9, 2001 (now abandoned), which is a continuation of Application Ser. No. PCT/JP99/03866 filed Jul. 16, 1999, which designated the United States of America, and was published in Japanese on Feb. 24, 2000.

TECHNICAL FIELD

The present invention relates to a method for judging the condition of a secondary battery such as a nickel-hydrogen battery and lithium secondary battery and, more particularly, to a method for judging the initial activity and degradation thereof. The present invention further relates to a method for regenerating a secondary battery and, more particularly, to a method for regenerating a nickel-hydrogen battery.

BACKGROUND ART

Secondary batteries are essential parts of moving motors such as portable electron equipments and electric motor vehicles as power sources thereof. These secondary batteries generate electrochemical reactions to obtain an electric energy. So, the properties of facilitating the generation of electrochemical reaction, that is activity, greatly affects various battery performance such as the discharge capacity, output characteristic, cycle charging and discharging characteristic, and safety. Accordingly, the activity of the battery can be used as the index of various battery performance. If the initial activity, for example, of the secondary battery can be detected, it can be known whether the secondary battery exhibits desired battery performance or not, and it can be judged whether the battery is inferior or not.

The secondary batteries, such as nickel-hydrogen batteries, may not exhibit a high initial activity, because electrodes thereof do not sufficiently react with electrolytes just after production thereof, so that the potential battery performance thereof may not be obtained. To overcome this problem, these secondary batteries have been charged or discharged prior to using thereof, and consequently the activity thereof has been increased until a required battery performance can be effected.

After the secondary batteries, such as nickel-hydrogen batteries, were produced, they have been initially subjected to a predetermined number of charging and discharging cycles from a fully charged condition to the discharged condition with a predetermined final discharge voltage until the initial capacity activity (potential discharge capacity/ theoretical discharge capacity) increases to a predetermined standard or more, before shipping or practically using thereof.

However, when the predetermined number of charging and discharging cycles are performed, as described above, the initial capacity activity of almost all secondary batteries reached a satisfactory level, but the maximum power density (W/kg) which can be discharged by the secondary batteries did not partly reach a required level.

With respect to the secondary batteries of which the initial activity after production is low, it cannot be confirmed before performing the charging and discharging operation whether a required battery performance is effected or not. Accordingly, conventionally, inferior secondary batteries have been also required to be charged and discharged.

If the initial activity can be known, it can be judged before using whether the secondary battery is inferior or not, and consequently it becomes unnecessary to charge and discharge the inferior secondary batteries. This results in the overall production costs of the secondary batteries being decreased by the production costs which have been conventionally needed to charge and discharge the inferior secondary batteries.

On the other hand, when the power of the secondary battery decreases in the course of the motor device being driven by the secondary battery, there occurs the problem that the motor device cannot be driven with high performance. In particular, in the above-described moving motor, it is difficult to supplement power thereto by another power source during driving thereof. So, a secondary battery capable of constantly supplying necessary power has been required.

The secondary battery, however, cannot supply identical power constantly. The supplying power varies with the number of using times. More specifically, as the charging and discharging cycle of the secondary battery is repeated, the electrodes, electrolyte or the like are degraded to gradually decrease the discharging capacity of the battery. Thus, battery degradation occurs and the battery performance decreases. As described above, the battery performance of the secondary battery is lowered due to a large number of using thereof. Consequently, it has become impossible to generate necessary charging and discharging even by applying prescribed charging operation to the secondary battery. Thus, the supplying power decreases. At last, the battery life has ended to require changing thereof.

The secondary battery which has been degraded with the repetition of charging and discharging cycle may be changed to a new one after required battery performance has not been effected thereby, but in accordance with their use like the preceding moving motor, the secondary battery may have to be changed to a new one before required battery performance has not been effected thereby. In this case, the degraded condition of the secondary battery must be determined before the required battery performance is not effected.

In order to supply a sufficient amount of electric energy to a motor device driven by a secondary battery in a proper time period, it has been demanded to provide the method capable of determining the battery condition of the secondary battery as the power source thereof, particularly the activity thereof as required at any time.

With one example of the method for determining the degraded condition of the secondary battery, it can be considered to forecast the degradation time of electrodes, electrolytes or the like before using the secondary battery. However, since the degradation manner of the electrodes and electrolytes or the like, and the process to the degradation thereof depend on the using conditions of the secondary batteries. Accordingly, the degradation time is extremely difficult to forecast beforehand.

To solve this problem, it is possible to calculate the capacity degradation (1-(potential discharge capacity/theoretical discharge capacity)) and determining the degradation condition from the obtained capacity degradation. This method, however, has the defect that degradation of the outputable discharge power, that is output degradation, becomes great even when the capacity degradation is not so great, to prevent the output of a desired power.

Under the above circumstances, conventionally, the internal resistance has been mainly used as the index of the degradation and initial activity of the batteries. For example, as is disclosed in Publication of unexamined patent application No. Hei 7-29614, there has been widely known the method of measuring the current and voltage of the secondary battery (storage battery), obtaining the internal resistance (DC-IR characteristic) from their relation (incline of I–V line), and judging the initial activity and degradation of the secondary battery based on the obtained internal resistance.

However, by merely measuring the internal resistance, the battery condition cannot be sufficiently understood. If a high internal resistance is measured, for example, the reason therefor has been not understood. In addition, in the case the discharge output of the battery being not obtained sufficiently, conventionally, there has been a problem that the reason therefor is not clear, and it is difficult to increase the discharge output. For example, if the battery output is small, because the internal resistance is great though the open voltage of the battery is sufficiently great, it has been difficult to judge whether the increase of the internal resistance results from inferior welding of members such as electrode of the battery, for example, which is impossible to recover, or the initial activity which is able to be overcome by repeated charge and discharge cycles. Furthermore, With this method, the judgement of the degradation of the battery is possible, but the manner of degradation (degradation mode) cannot be judged.

Furthermore, with the method for judging the degradation and initial activity of the secondary battery, which is disclosed in the above-described publication, the variations of both voltage and current must be measured. Consequently, there occurs the problem that the time and cost for measuring the variations of voltage and current are both increased.

In addition, for judging the initial activity and degradation of the battery based on the initial capacity activity and capacity degradation, the battery which has been fully charged under predetermined charging conditions must be discharged completely under predetermined discharging conditions, and then the discharge capacity of the battery must be actually measured. This measurement is troublesome and requires a long period of time. Additionally, there arises another problem that this completely discharging of the battery accelerates the degradation of the battery.

On the other hand, many nickel-hydrogen batteries include a positive electrode which uses nickel oxide or the like as a positive electrode active material, a negative electrode which uses a hydrogen-occluding alloy as a negative electrode active material, and an electrolyte interposed between the positive electrode and negative electrode.

In these nickel-hydrogen batteries, the electrolyte may be dried up during using thereof to deteriorate the battery performance. And as the charging and discharging cycle is repeated may times, the surface of the negative electrode (negative electrode alloy) may be oxidized to degrade the negative electrode, thereby lowering the battery performance.

The manner of degradation (degradation mode) of the secondary battery generally depends on the using conditions thereof. When the nickel-hydrogen battery, for example, is used in electric cars or hybrid cars at about a normal temperature, the negative electrode thereof is gradually oxidized to be degraded. On the other hand, the nickel-hydrogen battery is used in an environment of which the temperature varies greatly to an extremely high temperature, the battery is dried up to be degraded.

Where the battery performance is lowered due to drying of the electrolyte, it can be recovered readily by supplementing the electrolyte. On the other hand, where the battery performance is lowered due to the oxidization of the surface of the negative electrode, it can be recovered by changing the degraded negative electrode for a new one. The hydrogen-occluding alloy for use as the negative electrode active material, however, is relatively expensive, so that changing costs of batteries may increase. Consequently, there has been demanded to provide a method for recovering the battery performance without changing the degraded negative electrode for a new one when the negative electrode is degraded and the battery performance is lowered.

There has been known the method for recovering the battery performance of lead acid batteries by adding a reducing agent to an electrolyte thereof when electrodes thereof are oxidized and the battery performance is lowered (Publication of unexamined patent application No. Sho 53-43842). Similarly, to recover the battery performance of the nickel-hydrogen batteries, which is lowered due to the degradation of the negative electrodes thereof, there can be contemplated the method of adding a reducing agent to electrolyte thereof to reduce the surface of the negative electrodes. This regenerating method, however, causes the reduction of the positive electrodes as well as the negative electrodes, and consequently causes the lowering of Ni valance number so that the battery performance may be lowered.

The present invention has been made in consideration of the above circumstances, and a first object of the present invention is to provide a method and device for judging the condition of secondary batteries, which are capable of judging the same more quickly and in more detail, as compared to the conventional method and device.

A second object of the present invention is to provide a method and device for judging the condition of secondary batteries, which are capable of judging the level of the degradation and initial activity thereof in detail and quickly.

And a third object of the present invention is to provide a method for regenerating secondary batteries such as nickel-hydrogen batteries, which is capable of regenerating degraded secondary batteries properly in accordance with the degraded condition thereof.

DISCLOSURE OF INVENTION

A first aspect of the present invention, which is the method for judging the condition of secondary batteries, is characterized in that the method includes the steps of varying the charging current or discharging current of the secondary batteries, calculating the quantity of electricity which is related to the follow-up variation characteristic of a terminal voltage of the secondary batteries, relative to the variation of the charging current or discharging current, and judging the condition related to the charging and discharging performance of the secondary batteries based on the quantity of electricity.

A second aspect of the present invention, which is a preferred embodiment of the first aspect of the present invention, is characterized in that the charging current or discharging current is varied stepwise between predetermined two electric currents, and calculating the quantity of electricity based on the variation wave form of the terminal voltage after the variation of the charging current or discharging current starts stepwise.

A third aspect of the present invention, which is a preferred embodiment of the second aspect of the present invention, is characterized in that the quantity of electricity includes both that related to the variation of the terminal voltage at the time the terminal voltage rapidly varies just after the variation of the charging current or discharging current starts stepwise, and that related to the variation of the terminal voltage while the terminal voltage gently varies after varying rapidly.

A fourth aspect of the present invention, which is a preferred embodiment of the third aspect of the present invention, is characterized in that the quantity of electricity is calculated based on a first quantity of electricity composed of the variation of the terminal voltage at the time the terminal voltage rapidly varies just after the variation of the charging current or discharging current starts stepwise and a second quantity of electricity composed of the variation of the terminal voltage during a predetermined period of time while the terminal voltage gently varies after varying rapidly.

A fifth aspect of the present invention, which is a preferred embodiment of the fourth aspect of the present invention, is characterized in that the battery performance is judged low when the first quantity of electricity or second quantity of electricity exceeds a predetermined threshold.

A sixth aspect of the present invention, which is a preferred embodiment of the third aspect of the present invention, is characterized in that the charging current or discharging current is varied stepwise between electric current 0 and a predetermined electric current.

A seventh aspect of the present invention, which is a preferred embodiment of the third aspect of the present invention, is characterized in that the quantity of electricity is calculated based on the relation between an AC current component composed of the charging current or discharging current, which periodically varies with a predetermined frequency, and an AC voltage component having the predetermined frequency, which is included in the terminal voltage.

An eighth aspect of the present invention, which is a preferred embodiment of the first aspect of the present invention, is characterized in that where the internal impedance of the secondary battery is defined as a parallel impedance which is composed of predetermined parallel resistance and parallel electrostatic capacity, which are connected in parallel, and a series resistance which is connected in series with the parallel impedance, the quantity of electricity is composed of the quantity of electricity, which varies with impedance value of the parallel impedance or resistance of the parallel resistance, and the quantity of electricity, which varies with the resistance of the series resistance.

A ninth aspect of the present invention, which is a preferred embodiment of the eighth aspect of the present invention, is characterized in that the level of the degradation of the ion conduction performance of the electrolyte is estimated based on the resistance of the serial resistance.

A tenth aspect of the present invention, which is a preferred embodiment of the eighth aspect of the present invention, is characterized in that the increase of the film thickness on the surfaces of the electrodes is estimated based on the impedance of the parallel impedance or the resistance of the parallel resistance.

An eleventh aspect of the present invention, which is the method for judging the condition of secondary battery, further includes the steps of stopping charging or discharging after charging or discharging with a predetermined current is performed in the secondary battery for a predetermined period of time, obtaining variations of the terminal voltage in a predetermined period of time the terminal voltage rapidly varies just after the charging or discharging is stopped, and in a predetermined period of time the terminal voltage gently varies after the terminal voltage rapidly varies, and obtaining an internal resistance related value which is related to the internal resistance of the secondary battery based on the variations of the terminal voltage and the predetermined current, and comparing the internal resistance related value with a previously obtained relation between the internal resistance related value and battery condition, thereby judging the battery condition of the secondary battery.

A twelfth aspect is characterized in that the predetermined period of time the terminal voltage rapidly varies is the period of time the variation rate of the terminal voltage is a predetermined value or more after the charging or discharging is stopped.

A thirteenth aspect is characterized in that the predetermined period of time the terminal voltage gently varies is the period of time the variation rate of the terminal voltage is less than a predetermined value after the charging or discharging is stopped.

A fourteenth aspect of the present invention, which is a preferred embodiment of the twelveth or thirteenth aspect of the present invention, is characterized in that the predetermined rate is the variation rate of the terminal voltage at the time the approximately linear variation of the terminal voltage is finished just after the charging or discharging is interrupted.

A fifteenth aspect of the present invention, which is a preferred embodiment of one of the twelveth through fourteenth aspects of the present invention, is characterized in that the internal resistance related value is the resistance calculated using the formula of (voltage difference/predetermined electric current).

A sixteenth aspect of the present invention, which is another method for judging the condition of the secondary battery in accordance with the present invention, is characterized in that the quantity of electricity related to the impedance of the secondary battery or the quantity of electricity related to the maximum power density is detected by applying an AC voltage to the secondary battery, and the performance of the secondary battery is judged based on the detected quantity of electricity.

A seventeenth aspect of the present invention, which is a preferred embodiment of the sixteenth aspect of the present invention, is characterized in that the maximum power density as the discharging performance of the secondary battery is obtained based on the quantity of electricity which is related to the impedance.

An eighteenth aspect of the present invention, which is a preferred embodiment of the sixteenth aspect of the present invention, is characterized in that the quantity of electricity is obtained after or while charging and discharging is performed for initial activation of the secondary battery, and the initial power activity of the secondary battery is judged based on the obtained quantity of electricity.

A nineteenth aspect of the present invention, which is a preferred embodiment of the eighteenth aspect of the present invention, is characterized in that where the quantity of electricity is within a predetermined range, the initial power activity of the secondary battery is judged to exceed a predetermined level to finish charging and discharging for initial activation of the secondary battery.

A twentieth aspect of the present invention, which is a preferred embodiment of the eighteenth aspect of the present invention, is characterized in that when the quantity of electricity is not within a predetermined range, the initial power activity of the secondary battery is judged less than a predetermined level to start charging and discharging for initial activation of the secondary battery, again.

A twenty-first aspect of the present invention, which is a preferred embodiment of the sixteenth aspect of the present invention, is characterized in that the power degradation of the secondary battery is judged based on the obtained quantity of electricity.

A twenty-second aspect of the present invention, which is a preferred embodiment of the eighteenth aspect of the present invention, is characterized in that where the quantity of electricity is outside a predetermined range, the life of the secondary battery is judged to end.

A twenty-third aspect of the present invention, which is a preferred embodiment of eighteenth aspect of the present invention, is characterized in that the quantity of electricity is composed of an AC impedance related quantity of electricity, which is related to the AC impedance component including a component varying with the frequency of the AC voltage, out of the impedance of the secondary battery.

A twenty-fourth aspect of the present invention, which is a preferred embodiment of the sixteenth aspect of the present invention, is characterized in that the quantity of electricity related to the component of the impedance of the secondary battery, which does not vary with the frequency component of the AC voltage, is obtained as a DC impedance related quantity of electricity, the quantity of electricity related to component of the impedance of the secondary battery, which varies with the frequency component of the AC voltage, is obtained as a AC impedance related quantity of electricity, and the secondary battery is judged good when both the DC impedance related quantity of electricity and AC impedance related quantity of electricity are a predetermined value or less while the secondary battery is judged inferior when both the DC impedance related quantity of electricity and AC impedance related quantity of electricity are more than a predetermined value.

A twenty-fifth aspect of the present invention, which is a preferred embodiment of the twenty-fourth aspect of the present invention, is characterized in that by applying an AC voltage of a large number of frequency values within a predetermined frequency band to the secondary battery, the real axis component and imaginary axis component of the impedance of the secondary battery are obtained against each frequency value, and the quantity of electricity which is related to the impedance is calculated from the obtained real axis component and imaginary axis component.

A twenty-sixth aspect of the present invention, which is a preferred embodiment of the twenty-fourth aspect of the present invention, is characterized in that the AC impedance component is calculated based on the diameter of a circular arc-shaped locus of the impedance in a two-dimensional plane of which axes are the real axis component and the imaginary axis component.

A twenty-seventh aspect of the present invention, which is a device for judging the condition of the secondary battery, is characterized in that the device includes an AC voltage applying element for applying AC voltages having a large number of different frequencies to the secondary battery simultaneously, a terminal voltage detecting element for detecting a terminal voltage of the secondary battery against each frequency, a current detecting element for detecting the electric current of the secondary battery against each frequency, an AC impedance component detecting element for detecting the AC impedance component of the secondary battery, which varies with the frequency of the applied AC voltage, based on the detected terminal voltage and electric current, and a discharging performance judging element for judging at least the discharging performance of the secondary battery based on the AC impedance component.

A twenty-eighth aspect of the present invention, which is another device for judging the condition of the secondary battery, is characterized in that the device includes an AC voltage applying element for applying AC voltages having a large number of different frequencies to the secondary battery simultaneously or successively, a terminal voltage detecting element for detecting a terminal voltage of the secondary battery against each frequency, a current detecting element for detecting the electric current of the secondary battery against each frequency, a DC impedance component detecting element for detecting the DC impedance of the secondary battery, which does not vary with the frequency of the applied AC voltage, based on the detected terminal voltage and electric current, and a discharging performance judging element for determining whether the detected DC impedance related quantity of electricity is a predetermined value or less and judging at least the discharging performance of the secondary battery based on the AC impedance component.

A twenty-ninth aspect of the present invention, which is a preferred embodiment of the twenty-eighth aspect, is characterized in that the device further includes an AC impedance component detecting element for detecting the AC impedance component of the secondary battery, which varies with the frequency of the applied AC voltage, based on the detected terminal voltage and electric current, and the discharging performance judging element determines whether the detected DC impedance related quantity of electricity and detected AC impedance related quantity of electricity are respectively predetermined values or less and judges at least the discharging performance of the secondary battery.

A thirtieth aspect of the present invention, which is a preferred embodiment of the twenty-seventh through twenty-ninth aspects, is characterized the device further includes a bias voltage applying element for applying a bias voltage adapted to hold the secondary battery in a slightly discharging condition at the time the terminal voltage and electric current are detected.

A thirty-first aspect of the present invention, which is another method for judging the condition of the secondary battery in accordance with the present invention, is characterized in that a first resistance component mainly composed of an ion conduction resistance of an electrolyte is obtained by a predetermined method as an internal resistance related value which is related to the internal resistance of the secondary battery, and the obtained first resistance component is compared with a previously obtained relation between the first resistance component and battery condition to judge the condition of the secondary battery.

A thirty-second aspect of the present invention, which is still another method for judging the condition of the secondary battery in accordance with the present invention, is characterized in that a second resistance component mainly composed of a reaction resistance of electrodes is obtained by a predetermined method as an internal resistance related value which is related to the internal resistance of the secondary battery, and the obtained second resistance component is compared with a previously obtained relation between the second resistance component and battery condition to judge the condition of the secondary battery.

A thirty-third aspect of the present invention, which is a further method for judging the condition of the secondary battery in accordance with the present invention, is characterized in that a first resistance component mainly composed of a ion conduction resistance of an electrolyte, and a second resistance component mainly composed of a reaction resistance of electrodes are respectively obtained by a predetermined method as the internal resistance related values which are related to the internal resistance of the secondary battery, and both the first and second resistance components are compared with a previously obtained relation between the first and second resistance components and the battery condition to judge the condition of the secondary battery.

A thirty-fourth aspect of the present invention, which is a still further method for judging the condition of the secondary battery in accordance with the present invention, is characterized in that a first resistance component mainly composed of a ion conduction resistance of an electrolyte, and a second resistance component mainly composed of a reaction resistance of electrodes are respectively obtained by a predetermined method as the internal resistance related values which are related to the internal resistance of the secondary battery, and a resistance component ratio showing the ratio of the first resistance component and second resistance component is obtained, and is compared with a previously obtained relation between the resistance component ratio and the battery condition to judge the condition of the secondary battery.

A thirty-fifth aspect of the present invention, which is a preferred embodiment of the thirty-fourth aspect, is characterized in that the resistance component ratio is calculated by the formula of arctan (second resistance component/first resistance component).

A thirty-sixth aspect of the present invention, which is a preferred embodiment of the thirty-third aspect, is characterized in that a degradation judgement standard of the sum of the first resistance component and second resistance component, which is a border value between a normal condition and degraded condition is previously obtained in a reference battery equivalent to the secondary battery, and the sum of the first and second resistance components which are obtained in the secondary battery is compared with the obtained degradation judgement standard to judge whether the secondary battery is in a normal condition or degraded condition.

A thirty-seventh aspect of the present invention, which is a preferred embodiment of the thirty-fourth or thirty-fifth aspect, is characterized in that when the secondary battery is judged to be in a degraded condition, the degraded condition is divided into a first degraded condition which is mainly caused by an increase of an ion conduction resistance, a second degraded condition which is mainly caused by an increase of both the ion conduction resistance and an increase of a reaction resistance, and a third degraded condition which is mainly caused by an excessive increase of the reaction resistance, a first border value as a border value between the first degraded condition and second degraded condition relative to the previously obtained resistance component ratio, and a second border value as a border value between the second degraded condition and third degraded condition relative to the previously obtained resistance component ratio are respectively obtained, the resistance component ratio obtained in the secondary battery is compared with the first border value and second border value to judge whether the secondary battery is in the first degraded condition, second degraded condition or third degraded condition.

A thirty-eighth aspect of the present invention, which is a still further method for judging the condition of the secondary battery in accordance with the present invention, is characterized in that a first resistance component mainly composed of an ion conduction resistance of an electrolyte, and a second resistance component mainly composed of a reaction resistance of electrodes are respectively obtained by a predetermined method as the internal resistance related value which is related to the internal resistance of the secondary battery, an internal resistance co-ordinate showing a co-ordinate of the internal resistance of the secondary battery is plotted in a plane co-ordinate of which one axis component is the first resistance component and the other axis component is the second resistance component, and the internal resistance co-ordinate is compared with a previously obtained relation between the internal resistance co-ordinate and battery condition, which has been previously plotted on the plane co-ordinate, to judge the condition of the secondary battery.

A thirty-ninth aspect of the present invention, which is a preferred embodiment of the thirty-eighth aspect, is characterized in that a normal region as a set region of the internal resistance co-ordinate where a reference battery equivalent to the secondary battery is in a normal condition, and a degradation region as a set region of the internal resistance co-ordinate where the reference battery is in a degraded condition, are previously investigated and plotted in the plane co-ordinate, the position of the internal resistance co-ordinate of the secondary battery relative to the normal region and degradation region is investigated to judge whether the secondary battery is in a normal condition or degraded condition.

A fortieth aspect of the present invention, which is a preferred embodiment of the thirty-eighth or thirty-ninth aspect, is characterized in that when the secondary battery is judged to be in a degraded condition, the degraded condition is divided into a first degraded condition which is mainly caused by an increase of an ion conduction resistance, a second degraded condition which is mainly caused by an increase of the ion conduction resistance and a reaction resistance, and a third degraded condition which is mainly caused by an excessive increase of the reaction resistance, a first degradation region as a set region of the internal resistance co-ordinate where a reference battery equivalent to the secondary battery is in the first degraded condition, a second degradation region as a set region of the internal resistance co-ordinate where the reference battery is in a second degraded condition and a third degradation region as a set region of the internal resistance co-ordinate where the reference battery is in a third degraded condition are previously investigated respectively, and plotted in the plane co-ordinate, the position of the internal resistance co-ordinate of the secondary battery relative to the first degradation region, second degradation region and third degradation region is investigated to judge whether the secondary battery is in the first degradation region, second degradation region or third degradation region.

A forty-first aspect of the present invention, which is a preferred embodiment of the thirty-third aspect, is characterized in that after charging or discharging of the secondary battery with a predetermined current is performed for a predetermined period of time, charging or discharging is interrupted, the voltage difference between the terminal voltage measured between the positive electrode terminal and negative electrode terminal at the time charging or discharging is interrupted, and the terminal voltage measured after charging or discharging is interrupted, is obtained, and the first resistance component is obtained based on the obtained voltage difference and predetermined current.

A forty-second aspect of the present invention, which is a preferred embodiment of the forty-first aspect of the present invention, is characterized in that the first resistance component is obtained based on the voltage difference which is obtained in a predetermined period of time when the variation rate of the terminal voltage is a predetermined value or more after charging or discharging is interrupted, along with the predetermined electric current.

A forty-third aspect of the present invention, which is a preferred embodiment of the thirty-third aspect, is characterized in that after charging or discharging with a predetermined current is performed by the secondary battery for a predetermined period of time, charging or discharging is interrupted, the voltage difference between the terminal voltage measured between the positive electrode terminal and negative electrode terminal at the time charging or discharging is interrupted, and the terminal voltage measured after charging or discharging is interrupted, is obtained, and the second resistance component is obtained based on the obtained voltage difference and predetermined electric current.

A forty-fourth aspect of the present invention, which is a preferred embodiment of the forty-third aspect of the present invention, is characterized in that the internal resistance related value is obtained based on the voltage difference which is obtained in a predetermined period of time when the variation rate of the terminal voltage is less than a predetermined rate after charging or discharging is interrupted, along with the predetermined electric current.

A forty-fifth aspect of the present invention, which is a preferred embodiment of the thirty-third aspect of the present invention, is characterized in that by applying AC voltages having a large number of frequency values within a predetermined frequency band to the secondary battery, the real axis component value and imaginary axis component value of the impedance are measured against each frequency value, a circular arc-shaped locus of the impedance is obtained in a plane co-ordinate wherein a real axis and imaginary axis perpendicularly intersect each other with the real axis component value being as the real axis component, and the imaginary axis component value being as the imaginary axis component, and the distance between the intersection of the circular arc-shaped locus and the imaginary axis, and the origin of the plane co-ordinate is obtained, thereby obtaining the first resistance component.

A forty-sixth aspect of the present invention, which is a preferred embodiment of the thirty-third aspect of the present invention, is characterized in that by applying AC voltages having a large number of frequency values within a predetermined frequency band to the secondary battery, the real axis component value and imaginary axis component value of the impedance are measured against each frequency value, a circular arc-shaped locus of the impedance is obtained in a plane co-ordinate wherein a real axis and imaginary axis perpendicularly intersect each other with the real axis component value being as the real axis component, and the imaginary axis component value being as the imaginary axis component, and the diameter of a circular component of the circular arc-shaped locus is obtained, thereby obtaining the second resistance component.

A forty-seventh aspect of the present invention, which is a preferred embodiment of the forty-sixth aspect of the present invention, is characterized in that condition of the secondary battery is judged by comparing the second resistance component of the secondary battery with a previously obtained relation between the second resistance component and the maximum power density.

A forty-eighth aspect of the present invention, which is a still further method for judging the condition of the secondary battery in accordance with the present invention, is characterized in that when the average thickness of an oxidized layer formed on a surface of an active material of a negative electrode of the secondary battery using an alkali electrolyte is less than a predetermined standard, the level of the degradation of the negative electrode is judged low, and when the average thickness of the oxidized layer is the predetermined standard or more, the level of the degradation of the negative electrode is judged high.

A forty-ninth aspect of the present invention, which is a preferred embodiment of the forty-eighth aspect of the present invention, is characterized in that the predetermined standard is the average thickness of the oxidized layer, which is measured at the time the discharge capacity of a reference battery equivalent to the secondary battery rapidly decreases or the internal resistance of the reference battery rapidly increases.

A fiftieth aspect of the present invention, which is a preferred embodiment of the forty-ninth aspect of the present invention, is characterized in that the average thickness of the oxidized layer as the standard is 1000 nm.

A fifty-first aspect of the present invention, which is a method for regenerating the secondary battery in accordance with the present invention, is characterized in that when the level of the degradation of the negative electrode is low, electrolyte is only supplied without adding a reducing agent, and when the level of the degradation of the negative electrode is high, a reducing agent is added to the electrolyte.

A fifty-second aspect of the present invention, which is a preferred embodiment of the fifty-first aspect of the present invention, is characterized in that the average thickness of the oxidized layer which is formed on the surface of the active material of the negative electrode is less than a predetermined standard, the level of the degradation of the negative electrode is judged low, and electrolyte is only supplied, and when the average thickness of the oxidized layer is the predetermined standard or more, the level of the degradation of the negative electrode is judged high, and the reducing agent is added to the electrolyte.

A fifty-third aspect of the present invention, which is a preferred embodiment of the fifty-second aspect of the present invention, is characterized in that the predetermined standard is the average thickness of the oxidized layer, which is measured at the time the discharge capacity of a reference battery equivalent to the secondary battery rapidly decreases or the internal resistance of the reference battery rapidly increases.

A fifty-fourth aspect of the present invention, which is a preferred embodiment of the fifty-third aspect of the present invention, is characterized in that the average thickness of the oxidized layer as the standard is 1000 nm.

A fifty-fifth aspect of the present invention, which is another method for regenerating the secondary battery in accordance with the present invention, is characterized in that when the level of the degradation of the negative electrode is low, electrolyte is only supplied without performing a reducing treatment, and when the level of the degradation of the negative electrode is high, the negative electrode is taken from a battery container and is subjected to a reducing treatment.

A fifty-sixth aspect of the present invention, which is a preferred embodiment of the fifty-fifth aspect of the present invention, is characterized in that a negative electrode active material is mechanically separated from the negative electrode in a nonoxidized liquid, and is subjected to the reducing treatment.

A fifty-seventh aspect of the present invention, which is a preferred embodiment of one of the fifty-first through fifty-sixth aspect, is characterized in that the secondary battery is a nickel-hydrogen battery including a negative electrode of which a negative electrode active material is a hydrogen-occluding alloy, and an electrolyte interposed between a positive electrode and the negative electrode.

A fifty-eighth aspect of the present invention, which is a preferred embodiment of one of the thirty-first through fiftieth aspect, is characterized in that the condition of the secondary battery is judged with the method of one of the thirty-first through fiftieth aspect, and when the level of the degradation of the negative electrode is judged low, an electrolyte is only supplied, and when the level of the degradation of the negative electrode is judged high, a reducing agent is added to the electrolyte.

A fifty-ninth aspect of the present invention, which is a preferred embodiment of the thirty-seventh or fortieth aspect, is characterized in that the condition of the secondary battery is judged with the method of the thirty-seventh or fortieth aspect, and when the secondary battery is judged to be in the first degraded condition, an electrolyte is only supplied, and when the secondary battery is judged to be in the second degraded condition, a reducing agent is added to the electrolyte.

A sixtieth aspect of the present invention, which is a preferred embodiment of the thirty-seventh or fortieth aspect, is characterized in that the condition of the secondary battery is judged with the method of the thirty-seventh or fortieth aspect, and when the secondary battery is judged to be in the first degraded condition, an electrolyte is only supplied, and when the secondary battery is judged to be in the second degraded condition, the negative electrode is taken from the battery container and is subjected to a reducing treatment.

A sixty-first aspect of the present invention, which is a preferred embodiment of the sixtieth aspect, is characterized in that a negative electrode active material is mechanically separated from the negative electrode in a non oxidized liquid and the negative electrode active material is subjected to the reducing treatment.

BRIEF DESCRIPTION OF DRAWINGS

FIG. 28 is a view illustrating a safety valve as one part of the means for supplementing an electrolyte in a battery in the regenerating method 1, and more particularly.

FIG. 29 is a view illustrating a modification of one part of the means for supplementing an electrolyte in a battery in the regenerating method 1, and more particularly.

BEST MODE FOR CARRYING OUT THE INVENTION

Figure 1:
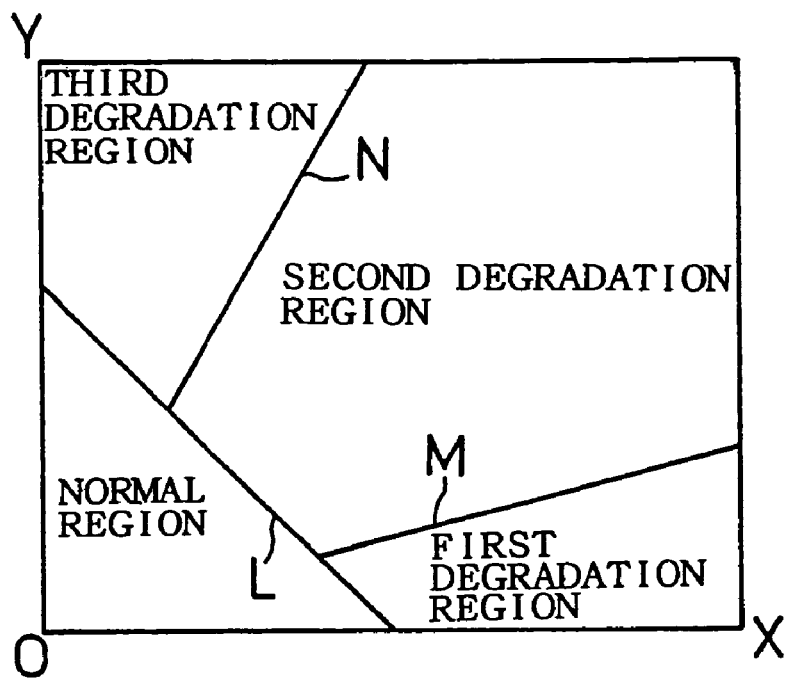
FIG. 1 is a map showing a previously measure relation between an internal resistance co-ordinate of a reference battery of the same kind as a secondary battery, and battery condition thereof.

[The Method for Judging the Condition of the Secondary Battery, which is Disclosed in the Aspects 1 through 10]

The first through tenth aspects of the present invention, which is the methods for judging the condition of the secondary battery, is characterized in that the method includes the steps of varying the charging current or discharging current of the secondary battery, calculating the quantity of electricity, which is related to the follow-up variation characteristic of the terminal voltage of the secondary battery, relative to the current variation, and judging the condition related to the charging and discharging performance of the secondary battery based on the quantity of electricity. The present inventors have conducted various experiments and analysis thereof, and found based thereon that the variation of the charging and discharging performance (especially, the capacity thereof) and, more particularly, the capacity degradation, capacity shortage and high-rate discharging properties can be estimated from the quantity of electricity, which is related to the follow-up variation characteristic of the terminal voltage of the secondary battery, relative to the charging current or discharging current. This method enables a real-time judgement, as is fundamentally different from the conventional method of estimating the capacity by charging and discharging the battery actually, and measuring the variation of the terminal voltage, or the like, so as to be used practically.

The above-described "quantity of electricity, which is related to the follow-up variation characteristic, relative to the current variation (electrical parameter)" is caused by the dynamic characteristic (variation characteristic) of the internal impedance of the battery, which fundamentally differs from the conventional method of detecting the dynamic characteristic without considering the variation of the internal impedance of the battery in a short period of time.

In the secondary battery, the variation of the terminal voltage lags behind that of the charging and discharging current. As is apparent from the electric circuit theory, especially the transit phenomenon circuit theory or AC circuit theory, such "lag of the variation of the terminal voltage behind that of the charging and discharging current" reversely means the lead of current over voltage. Such quantity of electricity is made equivalent to the circuit including the electrostatic capacity C in the above-described circuit theory, and can be expressed as an impedance element in a step current (current varying stepwise) or AC current circuit.

Hereinafter, the method will be further explained with reference to FIG. 34.

Reference character Va denotes a secondary battery having an open voltage of Vo which is a terminal voltage in the case of an internal impedance of a secondary battery to be measured being assumed O, and reference character Z denotes an actual internal impedance of the secondary battery to be measured.

Figure 34:
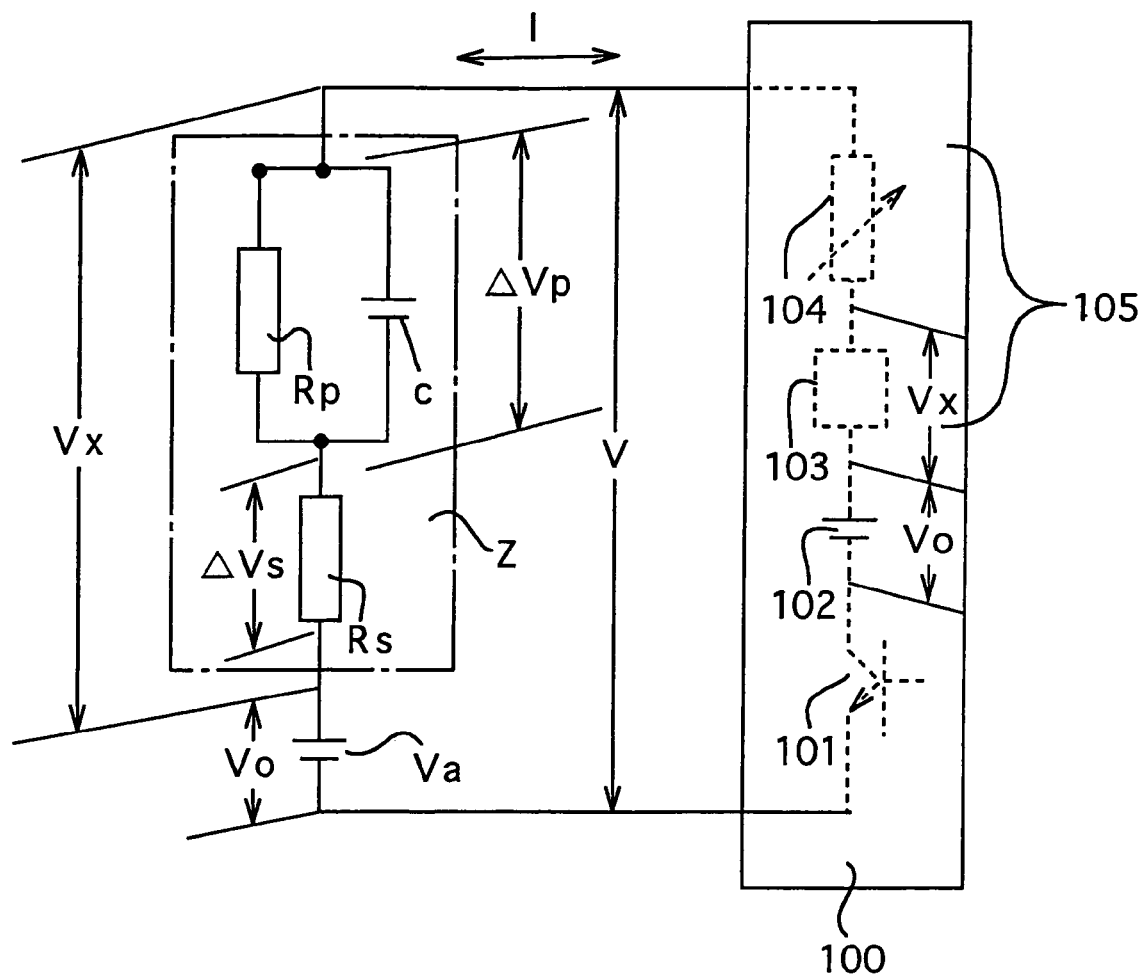
FIG. 34 is an equivalent circuit diagram illustrating the theory of the present invention.

As illustrated in FIG. 34, this internal impedance Z can be roughly expressed by an equivalent circuit including a parallel impedance section composed of a predetermined resistance (also referred to as parallel resistance) Rp and electrostatic capacity (also referred to as parallel electrostatic capacity) C which are connected in parallel, and a series impedance section composed of a series resistance Rs which is connected to the parallel impedance section in series. Of course, a small parallel electrostatic capacity may be added to the series resistance Rs, and a floating electrostatic capacity may occur against earth, but they are comparatively small so as to be negligible.

These parallel resistance Rp, series resistance Rs and electrostatic capacity C vary due to the degradation of the battery. More specifically, the degradation of the battery (capacity degradation) except the memory effect thereof can be regarded as the decrease of the quantity of power which can be taken from the battery, which is caused by the increase of the internal resistance power loss and lowering of the terminal voltage V due to non-reversibly increasing of these parallel resistance Rp and series resistance Rs. From this point, it can be presumed that the battery degradation can be estimated by measuring these parallel resistance Rp and series resistance Rs.

The present inventors' experiments and analyses have revealed that the electrostatic capacity C and parallel resistance Rp are generated in the electrically conductive film and polarization double layer which are formed on the battery electrodes. As the battery degradation proceeds, the thickness of the electrically conductive film increases, and consequently, the parallel resistance Rp increases whereas the electrostatic capacity C decreases.

Furthermore, the series resistance Rs is generated with the electric resistances of the electrodes and current collectors, and the ion conduction resistance of the electrolyte, or the like, and the parallel resistance which is connected to this series resistance Rs in parallel is small. The electric resistances of the electrodes and current collectors are hardly related to the battery degradation while the ion condition resistance of the electrolyte increases as the electrolyte becomes short or dirty.

More specifically, the battery degradation caused by the growth of the electrically conductive film (including the case where the film has a high specific resistance but has an electric conductivity because of high porosity and non-uniform distribution over the entire surface of the electrode) can be estimated by the parallel resistance Rp, and the battery degradation caused by the lowering of the ion conduction performance of the electrolyte can be estimated by the series resistance Rs, and these resistances can be separated based on the difference in the equivalent circuit, that one of them is connected to the electrostatic capacity C in parallel whereas the other one is not connected thereto.

The measurement of the series resistance Rs and parallel resistance Rp in the internal impedance Z of FIG. 34 can be analyzed based on the so-called transit phenomenon theory by applying a step current, obtaining the succeeding variation of the terminal voltage V, and detecting the variation of the difference between the obtained terminal voltage V and the open voltage Vo.

One example of the step current applying method (which is also referred to as current interrupter method) will be explained with reference to FIG. 34.

In FIG. 34, reference numeral 100 denotes a constant current source with a built-in switch, and a constant current source variable resistance 105 which is equivalent to a series power source 103 along with an internal impedance 104 of the battery charges the battery with a predetermined constant current by turning on the switch 101. Reference numeral 102 denotes a bias voltage adapted to cancel the open voltage Vo, and has a voltage equal to the open voltage Vo.

By turning off the switch 101 to interrupt this constant charging current I in an extremely short period of time (stepwise), theoretically, the voltage drop $\Delta Vs$ (=Rs·I) of the series resistance Rs in the terminal voltage V becomes 0 instantly (if the parasitic capacity and leakage resistance are neglected), and the terminal voltage V rapidly decreases by the voltage drop $\Delta Vs$.

In contrast, in the parallel impedance section composed of the parallel resistance Rp and the electrostatic capacity C, $\Delta$ voltage $\Delta Vp$ (=q/C) occurs on both ends thereof due to an electric charge q charged in the electrostatic capacity C. This electric charge cannot be discharged on the side of the constant current source 100 since the switch 101 is off, so that most discharging thereof takes place via the parallel resistance Rp with a time constant $1/(CRp)$ exponentially.

The above-described analyses of this example show that the increase of the ion conduction resistance can be estimated by the rapid voltage drop after turning off the switch, and the thickness of the film on the electrode can be estimated by the inclination of the comparatively gentle curve of the succeeding voltage drop.

The above example has been explained with reference to charging. In addition, a discharging current may be similarly interrupted. By not interrupting a charging and discharging current (current 0), but varying the same stepwise, the parallel resistance Rp and series resistance Rs can be estimated similarly.

Where the electric current is not interrupted, the route of discharging the electric charge from the electrostatic capacity C to the side of the constant current source must be considered. By analyzing them separately with Kirchhoff's law, similar results can be obtained.

Furthermore, with reference to the series resistance Rs and parallel resistance Rp of the internal impedance Z of FIG. 34, the parallel resistance Rp, electrostatic capacity C and series resistance Rs can be calculated from an AC current I of a predetermined frequency to be added to the internal impedance Z and an AC voltage thereacross.

Consequently, the condition of the secondary battery can be judged from the quantity of electricity, which is related to the variation of the terminal voltage at the time the terminal voltage rapidly varies just after the start of the stepwise variation, and the quantity of electricity, which is related to the variation of the terminal voltage at the time the terminal voltage gently varies after varying rapidly.

In addition, the condition of the secondary battery can be judged from a first quantity of electricity composed of the variation of the terminal voltage at the time the terminal voltage rapidly varies just after the start of the stepwise variation, and/or a second quantity of electricity composed of the variation of the terminal voltage in a predetermined period of time the terminal voltage gently varies after varying rapidly.

Furthermore, it becomes possible to judge lowering of the battery performance when the first or second quantity of electricity exceeds a predetermined threshold.

By varying the charging current or discharging current from the current 0 to a predetermined current stepwise, the electric charge of the electrostatic capacity C mainly flows into the parallel resistance Rp so as to enable an easy and accurate measurement.

In addition, the condition of the secondary battery can be judged based on the relation between the AC current component composed of the charging or discharging current which periodically varies with a predetermined frequency, and the AC voltage component having the above frequency, which is included in the terminal voltage.

Where the internal impedance of the secondary battery is expressed by a parallel impedance composed of a predetermined parallel resistance and parallel electrostatic capacity, which are respectively connected in parallel, and a series resistance which is connected to this parallel impedance in series, the condition of the secondary battery can be judged from the quantity of electricity, which is related to the impedance of the parallel impedance or the resistance of the parallel resistance, and the quantity of electricity, which is related to the resistance of the series resistance.

Furthermore, the level of the degradation of the ion conduction performance of the electrolyte can be estimated by the resistance of the series resistance.

And the increase of the thickness of the film on the surface of the electrode can be estimated by the impedance of the parallel impedance or the resistance of the parallel resistance.

Hereinafter, various embodiments based on the above view point will be explained.

[The Method for Judging the Condition of the Secondary Battery, which is Disclosed in the Aspects 11 through 15]

Figure 3:
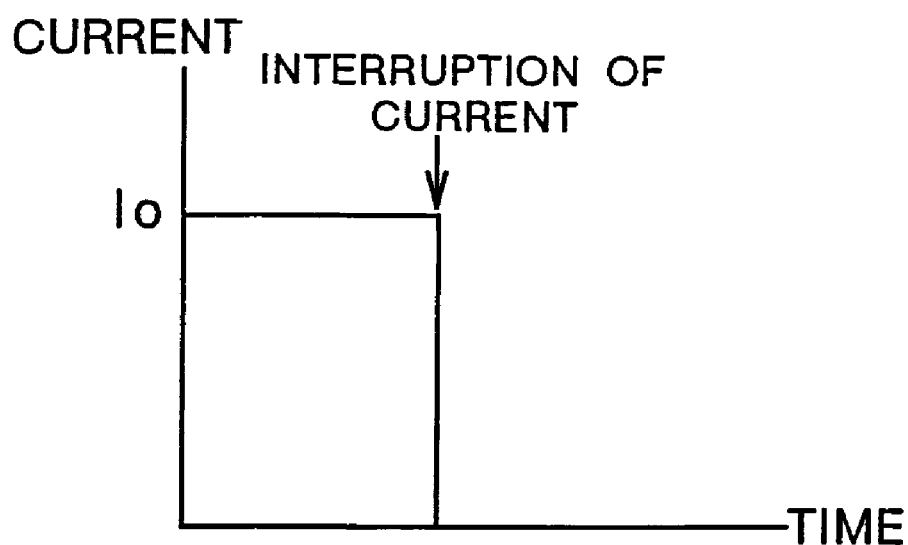
FIG. 3 is a graph showing the variation of an electric current of a charging current charged in the secondary battery with time in accordance with the present invention.
Figure 4:
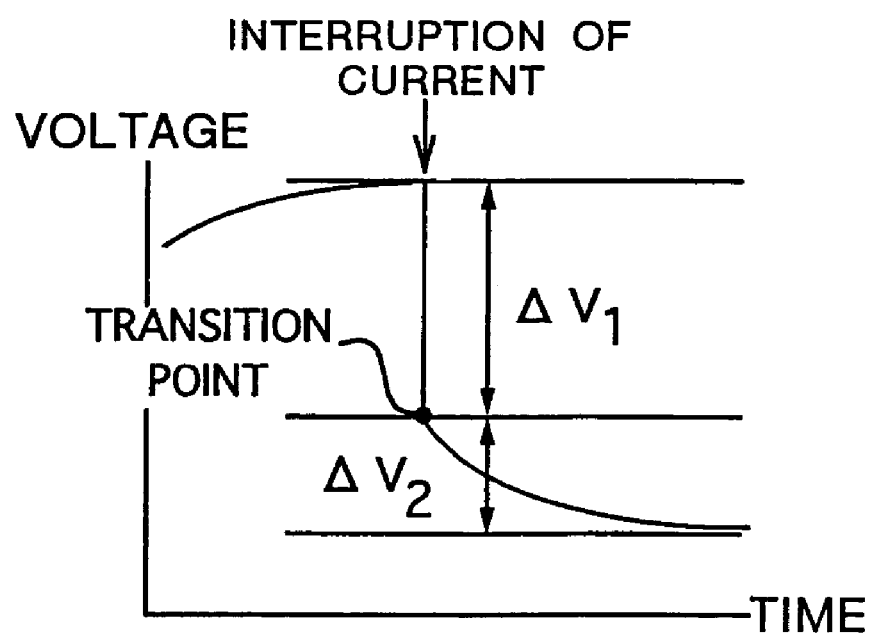
FIG. 4 is a graph showing the variation of a voltage of a charging current charged in the secondary battery with time.

The present inventors have examined the variation of the terminal voltage to be measured between a positive electrode terminal and negative electrode terminal of a secondary battery at the time the secondary battery is charged and discharged, and at the time after charging and discharging is temporarily interrupted and passing a pulse current in a stable condition with a predetermined charging depth (SOC), and is interrupted (or at the time the current drops and after current drops). As a result, they have found that when the charging current is interrupted, as illustrated in FIG. 3, the terminal voltage rapidly drops (namely, approximately lineally drops) just after charging is interrupted, as illustrated in FIG. 4, and then gently drops with time. The quantity of dropped terminal voltage can be divided into a component corresponding to the rapid drop just after the interruption of charging ($\Delta V_1$), and a component corresponding to the succeeding gentle drop ($\Delta V_2$).

Where the electric current at the time charging is interrupted is expressed as $I_o$, the first resistance $R_1$ is defined to satisfy the following equation 1:

$$R_1 = \Delta V_1 / I_o \qquad 1$$

And the second resistance $R_2$ corresponding to $\Delta V_2$ is defined to satisfy the following equation 2:

$$R_2 = \Delta V_2 / I_o \qquad 2$$

The present inventors have prepared two nickel-hydrogen batteries with a predetermined identical standard as secondary batteries such that one of them has a sufficient battery performance such as a high power density while the other one has a decreased battery performance such as a decreased power density due to a large number of repetition of charging and discharging. The variation of the terminal voltage of these batteries have been respectively examined by passing charging current to these batteries and interrupting it under identical conditions illustrated in FIG. 3. As a result, the present inventors have further found that $\Delta V_1$ of the battery having a decreased performance has become great, as compared with that of the battery having a sufficient performance. This result is considered to be related to the surface of the electrode active material, particularly the surface of the negative electrode active material, being oxidized to increase the ion conduction resistance of the electrolyte in the interface between the electrolyte and electrode active material, or the like.

Figure 5:
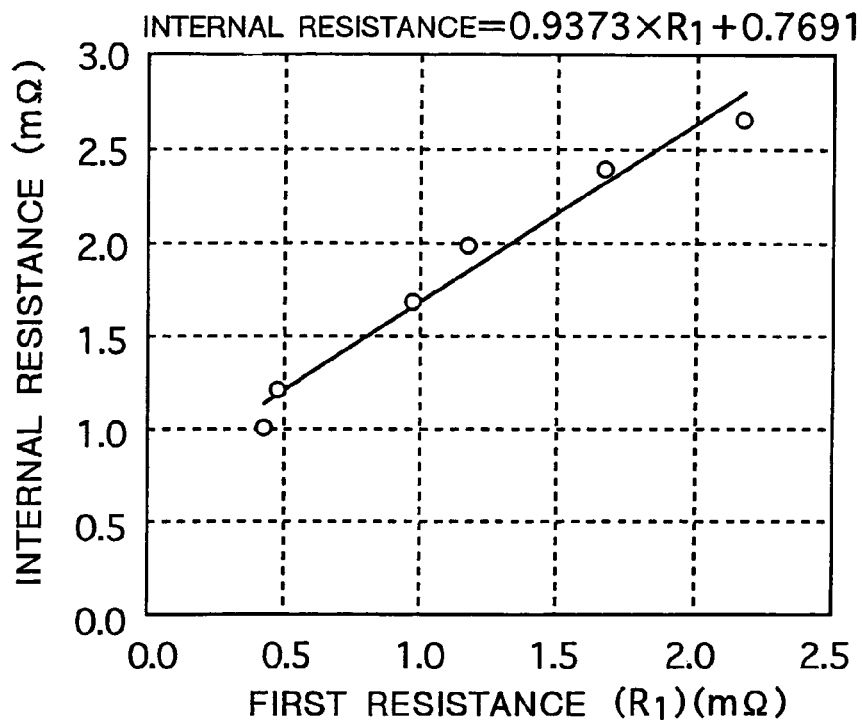
FIG. 5 is a graph showing the proportional relation between a first resistance and internal resistance which are respectively obtained when the reference battery of the same kind as the secondary battery 1 is degraded in Embodiment 1.

As $\Delta V_1$ increases, $R_1$ expressed by the equation 1 increases. Upon investigating the relation between the internal resistance and $R_1$ of the secondary battery of which the power density decreases, the present inventors have further found that they are proportional to each other, as illustrated in FIG. 5.

Figure 6:
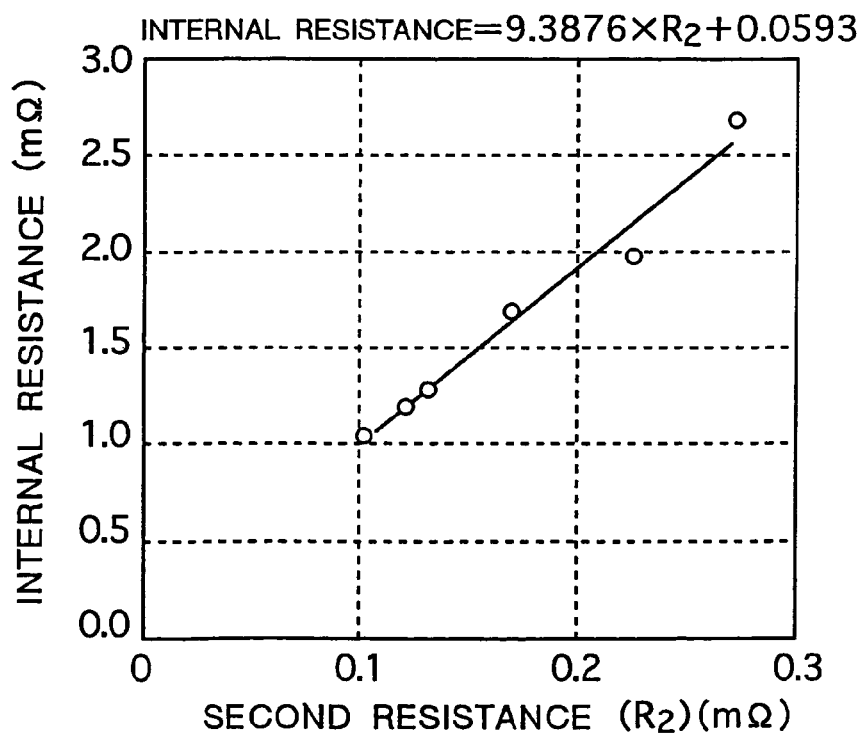
FIG. 6 is a graph showing the proportional relation between a second resistance and internal resistance which are respectively obtained when the reference battery of the same kind as the secondary battery 1 is in the initially activated condition in Embodiment 2.

On the other hand, the present inventors have prepared another two nickel-hydrogen batteries with a predetermined identical standard as secondary batteries such that one of them remains new while the other one is subjected to charging and discharging under proper conditions to be activated. The variation of the terminal voltage of these batteries have been respectively examined by passing a charging current to these batteries and interrupting it under identical conditions illustrated in FIG. 3. As a result, the present inventors have further found that $\Delta V_2$ of the activated battery has become small, as compared with that of the new battery. This result is considered to be related to the decrease of the reaction resistance of the electrodes, which is caused by the activation of the secondary battery. As $\Delta V_2$ decreases, $R_2$ expressed by the equation 2 decreases. Upon investigating the relation between the internal resistance and $R_2$ of the activated battery, the present inventors have also found that they are proportional to each other, as illustrated in FIG. 6.

Figure 7:
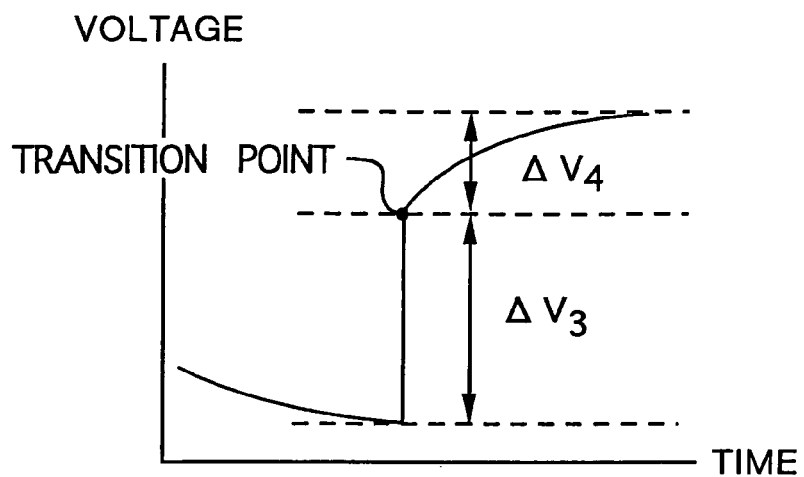
FIG. 7 is a graph showing the variation of a voltage of a discharging current discharged from the secondary battery with time.

When discharging of the secondary battery is interrupted, as illustrated in FIG. 7, the voltage rapidly elevates just after discharging is interrupted, and then gently elevates with time. Namely, just after discharging is interrupted, the voltage elevates approximately lineally. The quantity of elevated voltage can be divided into a component corresponding to the rapid elevation just after the interruption of discharging ($\Delta V_3$), and a component corresponding to the succeeding gentle elevation ($\Delta V_4$).

Where the electric current at the time discharging is interrupted is expressed by $I_1$, the first resistance $R_3$ is defined to satisfy the following equation 3:

$$R_3 = \Delta V_3 / I_1 \qquad 3$$

And the second resistance $R_4$ corresponding to $\Delta V_4$ is defined to satisfy the following equation 4:

$$R_4 = \Delta V_4 / I_1 \qquad 4$$

Upon examination of the variation of the voltage of the secondary batteries, one having a sufficient power density while the other one has a decreased power density due to a large number of repetition of charging and discharging, by interrupting a discharging current under identical conditions, $\Delta V_3$ of the battery having a decreased power density has become great, as compared with that of the battery having a sufficient power density. Furthermore, the internal resistance of the secondary battery having a decreased power density is proportional to the first resistance $R_3$.

On the other hand, upon examining the variation of the terminal voltage of the secondary batteries, one remaining new while the other one is activated, by interrupting a discharging current under identical conditions, $\Delta V_4$ of the activated battery has become small, as compared with that of the new battery. And the internal resistance of the activated battery is also proportional to $R_4$ thereof.

These $R_1$ through $R_4$ are respectively obtained based on the terminal voltage difference which are obtained by charging and discharging a secondary battery of which the condition is to be judged with a predetermined electric current for a predetermined period of time, interrupting charging and discharging, and measuring terminal voltages between a positive electrode terminal and negative electrode terminal upon interruption of charging or discharging and after interruption thereof, and the predetermined electric current, and are respectively related to the internal resistance of the secondary battery.

The present inventors have found that the condition of the secondary battery can be judged by comparing the thus obtained internal resistance related value with a previously obtained relation between the internal resistance related value and battery condition.

The present invention has been made based on the above-described present inventors' investigations and findings. Hereinafter, the present invention will be explained.

In the present explanation, a point where the voltage which has rapidly (approximately lineally) varied, starts to vary gently, such as a point where the voltage drop varies from $\Delta V_1$ to $\Delta V_2$, and a point where the voltage elevation varies from $\Delta V_3$ to $\Delta V_4$, will be referred to as a transition point. At this transition point, the variation rate of the voltage difference between the terminal voltage measured between a positive electrode and negative electrode at the time charging or discharging is interrupted, and that after charging or discharging is interrupted varies greatly.

In the present invention, the degradation of the secondary battery means the condition where a desired battery performance such as a high power density has not been achieved, that is the condition where a battery performance enough for the uses of the secondary battery has not been achieved. Hereinafter, such condition of the secondary battery will be referred to as "degraded condition". On the other hand, when a battery performance enough for the uses of the secondary battery is achieved, such condition of the secondary battery will be referred to as "normal condition".

The initial activity includes not only the activity just after the production of the battery but also the activity at the time the battery is activated by charging and discharging. Furthermore, the initial activity also includes the activity of the battery which has been actually used but degradation is sufficiently low.

With the eleventh aspect of the present invention, the internal resistance related value which is related to the internal resistance of the secondary battery to be judged is obtained. The internal resistance related value is a value related to the internal resistance which has a close relation with the battery condition so as to depend on the battery condition.

As described above, the battery performance such as power density decreases with the increase of the internal resistance, and consequently, the internal resistance can be used as an index of the battery condition. In accordance with the present invention, the internal resistance related value is compared with a previously obtained relation between the internal resistance related value and battery condition, which enables a detailed judgement of the battery condition, as compared with the method of merely obtaining the internal resistance. Consequently, the judgement whether the secondary battery is in a normal condition or degraded condition becomes possible, and a detailed judgement of each condition of the secondary battery becomes also possible.

The level of the normal condition depends on the number of using times, that is charging-discharging cycles.

With the present invention, the initial activity of the secondary battery, and the battery life until the degraded condition after judging the battery condition, that is the level of the normal condition, can be judged. Consequently, where a motor device, for example, is driven by a secondary battery as a power source, if the secondary battery is expected to become in a degraded condition during driving after judgement, the secondary battery can be prevented from becoming in a degraded condition while driving the motor device by performing a regeneration treatment, or the like beforehand.

This results in the motor device being continuously driven with a high performance.

When the secondary battery is in a degraded condition, the degraded level and the reason therefor can be judged in detail.

When charging or discharging of the secondary battery of which the condition is to be judged is performed with a predetermined electric current in a predetermined period of time and then interrupted to vary the terminal voltage thereof, the secondary battery is not affected thereby. These operations can be performed while the secondary battery is charged and discharged. Consequently, the measurement of the voltage difference between the terminal voltage which is measured between a positive electrode and negative electrode when charging or discharging is interrupted, and that after charging or discharging is interrupted (hereinafter, will be merely referred to as voltage difference) can be performed regardless of the condition of the secondary battery (that is, while the secondary battery is stopped or used). In addition, these predetermined electric current and voltage difference can be respectively measured with ease by means of an ammeter and voltmeter, each having a simple construction.

Of course, a series of operations from charging and discharging of the secondary battery to measuring of the voltage difference can be performed without dismantling the secondary battery.

The terminal voltage quickly varies after charging or discharging is interrupted, to reach an electric potential required to measure the above-described voltage difference in an extremely short period of time. Consequently, the measurement of the electric potential can be performed in a short period of time.

Accordingly, with the present invention, the measurement of the voltage variation after interruption of charging or discharging can be performed in a much shorter period of time and at lower costs, as compared with the measurement of the variations of both voltage and current.

The internal resistance related value which is related to the internal resistance of the secondary battery can be obtained quickly based on the voltage difference and the predetermined current by means of a predetermined calculating device. And the internal resistance related value can be obtained at any time regardless of the using condition of the secondary battery. Furthermore, if the internal resistance related value is a value which can be calculated with a simple equation, it can be obtained with ease using a calculating device with a simple construction.

Therefore, with the present invention, the internal resistance related value which is related to the internal resistance of the secondary battery can be obtained based on the voltage difference and predetermined current in a short period of time and at low costs.

With the present invention, the battery condition of the secondary battery can be judged in detail and quickly. And the judgement can be performed at any time with ease.

With the present invention, the terminal voltage to be measured between the positive electrode terminal and negative electrode terminal at the time the charging or discharging is interrupted may be an open voltage or the above-described standard voltage which corresponds to the open voltage.

With the present invention, the internal resistance related value is not limited specifically, but the resistance calculated with the formula of (voltage difference/predetermined current) is preferably used. This resistance is the ratio of the above-described voltage difference to the above-described predetermined current, which shows the relation thereof dimensionally, and can be obtained with ease by a division calculation.

With the present invention, the electric current at the time charging or discharging is interrupted is not limited specifically. The interrupting timing may be during charging or discharging, or may be at the time charging or discharging is completed. The interrupting method is not limited specifically. The electric current may be broken in a power source of the battery, or may be interrupted with a switch or the like which is provided between the power source and the secondary battery.

In FIG. 3, a constant current which does not vary with time is used as a current for charging. Otherwise, a current which varies with time may be used. For example, by passing a charging current which varies with time, and then interrupting it, a voltage drop curve similar to that shown in FIG. 4 is obtained.

Furthermore, when charging is interrupted, a pulse current can be used as a current for charging. In this case, the time the pulse current drops corresponds to the time the current is interrupted. When a pulse current which varies in a rectangular shape is used, the amplitude of the pulse current can be used as the current just prior to current drop. With the present invention, by adding a pulse current of which the current (amplitude) is small to a charging current during charging of the secondary battery therewith, the battery condition may be judged based on the terminal voltage drop curve of the secondary battery.

With the present invention, the previously obtained relation between the internal resistance related value and the battery condition may be obtained with a reference battery equivalent to the secondary battery. The reference battery may be the same kind as the secondary battery, for example.

The secondary battery to which the device and method of the present invention can be applied is not limited to a special kind. Any well-known secondary battery will do. For example, the present invention can be applied to nickel-hydrogen batteries and lithium secondary batteries.

With the method of the present invention, when charging of the secondary battery is interrupted, as illustrated in FIG. 4, voltage drops rapidly (approximately lineally) just after interrupting of charging. In this case, the dropping amount of voltage corresponds to the variation of the rapidly varying voltage.

On the other hand, when discharging of the secondary battery is interrupted, as illustrated in FIG. 7, voltage increases rapidly (approximately lineally) just after interrupting of discharging. In this case, the increasing amount of voltage corresponds to the variation of the rapidly varying voltage.

As described above, the variation of the terminal voltage in a period of time the terminal voltage rapidly varies just after interrupting of charging or discharging, that is the voltage difference between the terminal voltage at the time charging or discharging is interrupted and that at the transition point can be expressed by the voltage difference obtained in a predetermined period of time the variation rate of the terminal voltage is greater than a predetermined rate after interrupting of charging or discharging. As described above, this voltage difference increases with the degradation of the secondary battery. Namely, the internal resistance related value which is obtained based on this voltage difference and the current at the time charging or discharging is interrupted has a close relation with the degradation of the secondary battery.

Accordingly, with the twelveth aspect, by comparing the internal resistance related value which is obtained in the secondary battery in a degraded condition, with the previously obtained relation between the internal resistance related value and internal resistance, the degraded condition thereof can be judged in detail. Namely, the level of the degradation of the secondary battery in a degraded condition can be judged in detail.

The measurement of the variation of the terminal voltage after interrupting of charging or discharging can be performed in a much shorter period of time and at lower costs, as compared with the measurement of the variations of both voltage and current. So, with the present invention, the level of degradation of the secondary battery can be judged in a much shorter period of time and at much lower costs, as compared with the conventional judging method.

With the present judging method, as disclosed in the fourteenth aspect, the predetermined value may be the variation rate at the time the approximately lineally variation of the terminal voltage is finished just after interrupting of charging or discharging.

It is preferable to measure the variation of the terminal voltage after interrupting of charging or discharging with intervals as short as possible in order to measure the above-described transition point.

The formula for calculating the internal resistance related value is not limited specifically, but it is preferable to calculate it using the formula of (voltage difference/predetermined current), as disclosed in the fifth aspect. The resistance calculated with this formula will be referred to as a first resistance.

As the secondary battery is degraded, the voltage difference increases, as described above, and consequently, the first resistance increases. This enables the first resistance to be measured with ease and accuracy. And, as illustrated in FIG. 5, in the degraded battery, the internal resistance thereof and the first resistance are proportional to each other.

Accordingly, with the present invention, by comparing the first resistance obtained from the variation of the voltage which varies rapidly just after interrupting of charging or discharging of the secondary battery, and the electric current at the time charging or discharging is interrupted, using the above resistance-calculating formula, with the previously obtained proportional relation between the internal resistance and first resistance, the internal resistance of the secondary battery is estimated, and the level of the degradation of the secondary battery can be judged based on the previously obtained relation between the internal resistance and degraded condition.

With this judging method, by adopting the pulse current composed of rectangular pulses having a small amplitude as the current for charging, the first resistance can be obtained from the dropped voltage of the terminal voltage of the secondary battery, which drops rapidly, and the amplitude of the pulse current.

And the previously obtained proportional relation between the internal resistance and first resistance, and the previously obtained relation between the internal resistance and degraded condition can be investigated when a reference battery equivalent to the secondary battery is degraded.

A battery of the same type as the above-described secondary battery, for example, can be used as the reference battery.

The method for measuring the internal resistance of the degraded reference battery of the same type as the secondary battery is not limited specifically. A well-known measuring method will do. For example, the internal resistance of the degraded reference battery can be obtained from the inclination of the line I–V. In this case, it is preferable to measure the internal resistance, using batteries of the identical standard. Where the internal resistance of the secondary battery of which the degradation is to be judged can be estimated accurately with batteries of another standard, the internal resistance of the batteries of another standard may be used as an index.

The proportional relation between the internal resistance and first resistance may be obtained by previously measuring the internal resistances relative to the first resistances as required, plotting the measured internal resistances on a co-ordinate, and making a line graph, as shown in FIG. 5, or may be obtained as a numerical formula with an approximate calculation such as the minimum second power method, or the like. The former method has the advantage that the proportional relation can be obtained with ease whereas the latter method has the advantage that the proportional relation can be obtained in detail.

On the other hand, with the present judging method, by interrupting charging of the secondary battery, as shown in FIG. 4, a voltage dropping curve where the voltage rapidly drops just after interrupting of charging, and then gently drops with time is obtained. In this case, the amount of gently dropping voltage corresponds to the variation of the gently varying voltage.

In constrast, by interrupting discharging of the secondary battery, as shown in FIG. 7, a voltage increasing curve where the voltage rapidly increases just after interrupting of discharging, and then gently increases with time is obtained. In this case, the amount of gently increasing voltage corresponds to the variation of the gently varying voltage.

As described above, the variation of the terminal voltage in a period of time the terminal voltage gently varies just after a rapid variation of the voltage due to the interruption of charging or discharging, that is the voltage difference between the terminal voltage at the transition point and that at the time the variation of the terminal voltage becomes negligibly small can be expressed by the voltage difference obtained in a predetermined period of time the variation rate of the terminal voltage is less than a predetermined rate after interrupting of charging or discharging. As described above, this voltage difference decreases with the activation of a new secondary battery. Namely, the internal resistance related value which is obtained based on this voltage difference and the current at the time charging or discharging is interrupted has a close relation with the initial activity of the secondary battery.

Accordingly, with the thirteenth aspect, by comparing the internal resistance related value which is obtained in the secondary battery having an initial activity, with the previously obtained proportional relation between the internal resistance related value and internal resistance, the initial activity thereof can be judged in detail. Namely, the initial activity of the secondary battery having an initial activity can be judged in detail.

The measurement of the variation of the terminal voltage after interrupting of charging or discharging can be performed in a much shorter period of time and at lower costs, as compared with the measurement of the variations of both voltage and current. So, with the present invention, the initial activity of the secondary battery can be judged in a much shorter period of time and at much lower costs, as compared with the conventional judging method.

With the present judging method, as disclosed in the fourteenth aspect, the predetermined value may be the variation rate at the end of the approximately lineally variation of the terminal voltage just after interrupting of charging or discharging.

The formula for obtaining the internal resistance related value is not limited specifically, but it is preferable to calculate it using the formula of (voltage difference/predetermined current), as disclosed in the fifteenth aspect. The resistance calculated with this formula will be referred to as a second resistance.

When the secondary battery has an initial activity, for example, the first resistance is small. This enables the second resistance to be measured with ease and accuracy. And, as illustrated in FIG. 6, in the degraded battery, the internal resistance thereof and the second resistance are proportional to each other.

Accordingly, with the present invention, by comparing the second resistance obtained from the variation of the voltage which varies gently just after rapid increase of voltage due to the interruption of charging or discharging and the electric current at the time charging or discharging is interrupted, using the above resistance-calculating formula, with the previously obtained proportional relation between the internal resistance and second resistance, the internal resistance of the secondary battery is estimated, and the initial activity of the secondary battery can be judged based on the previously obtained relation between the internal resistance and initial activity.

With this judging method, as described above, by adopting a rectangle-shaped pulse current having a small amplitude as the current for charging, the second resistance can be obtained from the dropping amount of the terminal voltage of the secondary battery, which drops gently, and the amplitude of the pulse current thereof.

And the previously obtained proportional relation between the internal resistance and second resistance, and the previously obtained relation between the internal resistance and initial activity can be investigated when a reference battery equivalent to the secondary battery is degraded. A battery of the same type as the above-described secondary battery, for example, can be used as the reference battery.

The method for previously measuring the internal resistance and second resistance of the degraded reference battery of the same type as the secondary battery is not limited specifically. A well-known measuring method will do. For example, they can be obtained from the inclination of the line I–V. In this case, it is preferable to measure them using batteries of the identical standard. Where the internal resistance of the secondary battery of which the initial activity is to be judged can be estimated accurately with batteries of another standard, the internal resistance of the batteries of another standard may be used as an index.

The proportional relation between the internal resistance and first resistance may be obtained by previously measuring the internal resistances relative to the second resistances as required, plotting the measured internal resistances on a co-ordinate, and making a line graph, as shown in FIG. 6, or may be obtained as a numerical formula with an approximate calculation such as the minimum second power method or the like. The former method has the advantage that the proportional relation can be obtained with ease whereas the latter method has the advantage that it can be obtained in detail.

With the present invention, it is preferable to obtain the first resistance, similarly to the twelveth aspect, and the second resistance, similarly to the thirteenth aspect, and compare both the first and second resistances with the previously obtained relations between the first and second resistances and battery conditions, thereby judging the condition of the secondary battery. With this method, the judgement can be performed from two kinds of resistances, and consequently, the battery condition of the secondary battery can be judged in more detail.

And it is more preferable to compare the ratio of the first resistance to second resistance with the relation between the ratio of the first resistance to second resistance and the battery condition, thereby judging the condition of the secondary battery. The ratio of the first resistance to second resistance indicates the mutual relation thereof so that the battery condition of the secondary battery can be judged in more detail.

The following device can be used as the device for judging the degradation of the secondary battery or the initial activity thereof.

The device includes a pulse current source for supplying a pulse current to a secondary battery to charge said secondary battery, terminal voltage measuring means for measuring the variation of the terminal voltage of the secondary battery, voltage control means which is connected to the terminal voltage measuring means in series for controlling the voltage to be applied to the terminal voltage measuring means when the voltage equal to the output voltage of the secondary battery is applied, and at least one calculating means out of first calculating means for calculating an internal resistance of the secondary battery by comparing a first resistance which is obtained from the dropping amount of a rapidly dropping voltage of the pulse current, and a current at the time just before the pulse current drops, with a previously obtained proportional relation between the internal resistance and first resistance, and second calculating means for calculating an estimated value of an internal resistance of the secondary battery by comparing a second resistance which is obtained from the dropping amount of a gently dropping voltage of the pulse current just after a rapid drop of the voltage of the pulse current, and a current just before the pulse current drops, with a previously obtained proportional relation between the internal resistance and second resistance. This device judges the level of degradation or the level of initial activity of the secondary battery based on the estimated value of the internal resistance, which is obtained by calculation with the calculating means.

With this judging device, the level of the degradation or initial activity of the secondary battery can be judged by the judging method of the present invention in a shorter period of time and at lower costs, as compared with the conventional judging method. In addition, this judging device can achieve the following advantage.

In order to charge a secondary battery with a pulse current, an electric current having a voltage greater than the output voltage of the secondary battery must be supplied from a pulse current source. More specifically, the pulse current source must supply a current which has a voltage obtained by combining an output voltage of the secondary battery and the variation (dropping amount) of the terminal voltage, which is adapted to judge the level of degradation or initial activity of the secondary battery.

With the present invention, the voltage of the pulse current is applied to the circuit including the terminal voltage measuring means and voltage control means, but an output voltage of the secondary battery is applied to the voltage control means so that the terminal voltage measuring means measures the dropping amount of the terminal voltage of the secondary battery. Consequently, the dropping amount of the terminal voltage of the secondary battery can be measured with the terminal voltage measuring means with eases and accuracy.

When the output voltage of the secondary battery is 12 V and the dropping amount of the terminal voltage of the secondary battery is 0.01 V, for example, the pulse current source supplies a pulse current having a voltage of 12.01 V which is obtained by combining these voltages. The voltage of the pulse current may be measured with the terminal voltage measuring means without using the voltage control means. In such case, the voltage must be measured with the measurement range of 10 V order. However, it is difficult to measure the dropping amount of 0.01 V accurately with the measurement range of 10 V.

With the judging device of the present invention, 12 V out of the voltage of 12.01 V is applied to the voltage control means, and the terminal voltage measuring means can measure the voltage of 0.01 V as the dropping amount of the terminal voltage. Consequently, the terminal voltage measuring means can measures the dropping amount of the terminal voltage with the measurement range of 0.01 V order. This results in the dropping amount of the terminal voltage at the time the pulse current drops being measured with accuracy.

If the dropping amount of the terminal voltage at the time the pulse current drops can be measured with accuracy, the calculating means can estimate the internal resistance of the secondary battery with accuracy. Consequently, at least one of the level of degradation or initial activity of the secondary battery can be judged with accuracy based on the internal resistance accurately estimated.

The construction (circuit) of the pulse current source is not limited specifically. The pulse current source with a well-known construction can be also used.

Furthermore, the kind of elements of the voltage control means is not limited specifically as far as the same voltage as the output voltage of the secondary battery can be applied thereto. For example, a bias DC power source having a DC bias voltage and a resistance element can be used.

The bias DC power source has an advantage that a great amount of electric current is prevented from flowing in the terminal voltage measuring means. And the resistance element, especially the resistance element having a variable resistance, has an advantage that a fine adjustment of the voltage to be applied to the voltage control means can be performed with ease.

With respect to the terminal voltage measuring means, the construction (circuit) thereof is not limited specifically, as far as the means has a measurement range capable of measuring the dropping amount of the terminal voltage of the secondary battery with accuracy. A well-known voltage measuring means can be used.

Hereinafter, the present invention will be explained based on several embodiments.

[Condition Judging Method 1-1]

Figure 8:
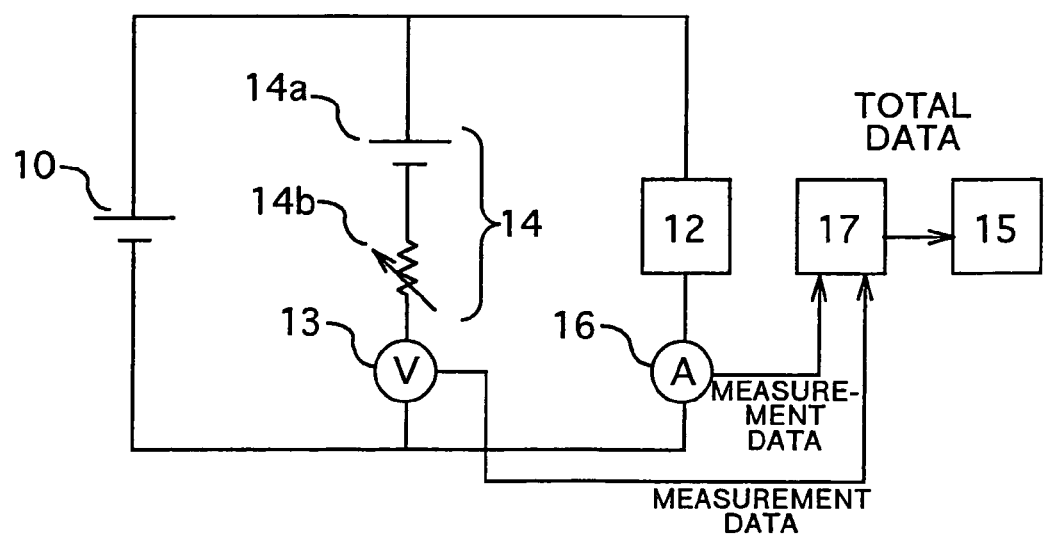
FIG. 8 is a block circuit diagram illustrating a circuit of a judging device and connection of a secondary battery to the judging device in the judging methods 1-1 and 1-2.

In this method, a used nickel.hydrogen battery (layer type of 95 Ah) is prepared as a secondary battery, and the level of the degradation of the secondary battery is judged using the condition judging device illustrated in FIG. 8.

The condition judging device illustrated in FIG. 8 includes a pulse current source 12 for supplying a pulse current to a secondary battery 10 to charge the same, terminal voltage measuring means 13 for measuring the dropping amount of the terminal voltage of the secondary battery, voltage control means 14 which is connected to the terminal voltage measuring means 13 in series and to which the voltage equal to the output voltage of the secondary battery 10 is applied, and calculating means 15 for obtaining an estimated value of the internal resistance of the secondary battery 10.

Figure 9:
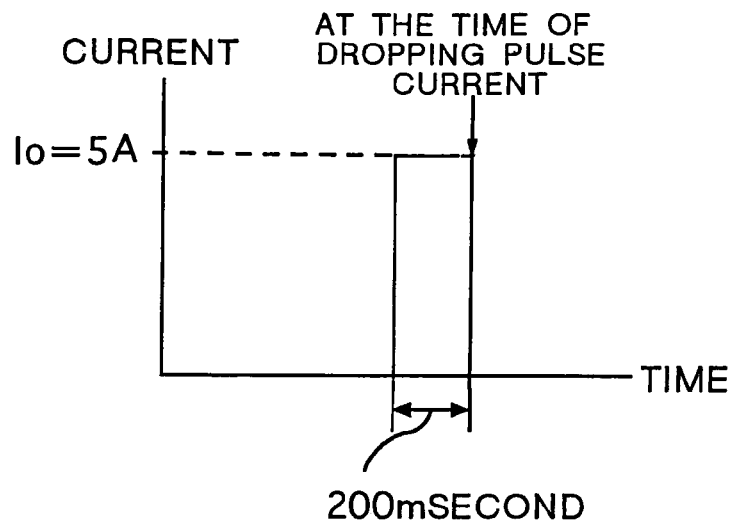
FIG. 9 is a graph showing the variation of an electric current of a pulse-containing current to be supplied from a pulse current source to the secondary battery with time in the judging method 1-1.

The pulse current to be supplied to the secondary battery 10 from the pulse current source 12 has a voltage obtained by combining an output voltage of the secondary battery 10 and the dropping amount of the terminal voltage of the secondary battery 10, and, as shown in FIG. 9, the current thereof varies into a rectangular shape. The voltage control means 14 is provided so as to be connected to the terminal voltage measuring means 13 in series, and is composed of a bias DC power source 14a adapted to apply a DC bias voltage of which the level is equal to the output voltage of the secondary battery, and a variable resistance element 14b for finely adjusting the voltage to be applied to the voltage control means 14 into the voltage equal to the output voltage of the secondary battery 10. The strength of the pulse current supplied from the pulse current source 12 is measured just before dropping thereof with an ammeter 16 as the amplitude thereof.

The measurement data including the amplitude of the pulse current, which is measured with the ammeter 16, and the dropping amount of the terminal voltage of the secondary battery, which is measured with the terminal voltage measuring means 13, is totalled in a memory section 17, and then fed to the calculating means 15.

The calculating means 15 obtains a first resistance from the measurement data of the amplitude of the pulse current and the dropping amount of the terminal voltage of the secondary battery 10 measured with the terminal voltage measuring means 13, which are totalled in the memory section 17, and estimates the internal resistance of the secondary battery 10 by comparing the first resistance with the proportional relation of the internal resistance and first resistance, which has been previously examined in a reference battery, and inputted.

Before judging the level of degradation of the secondary battery 10, the proportional relation between the internal resistance and first resistance, which have been respectively examined when a reference battery of the same type as that of the secondary battery 10 is degraded, is previously obtained. In this method, the proportional relation shown in FIG. 5 can be obtained. By inputting this proportional relation in the calculating means 15, the present judging device is operated in the following manner.

By operating the bias DC current source 14a, and finely adjusting the resistance of the variable resistance element 14b, the voltage to be applied to the voltage control means 14 is equalized to the output voltage of the secondary battery 10, and then a pulse current is supplied to the secondary battery 10 from the pulse current source 12. The measurement data of the amplitude of the pulse current is fed to the memory section 17 at all time and totalled therein.

Figure 10:
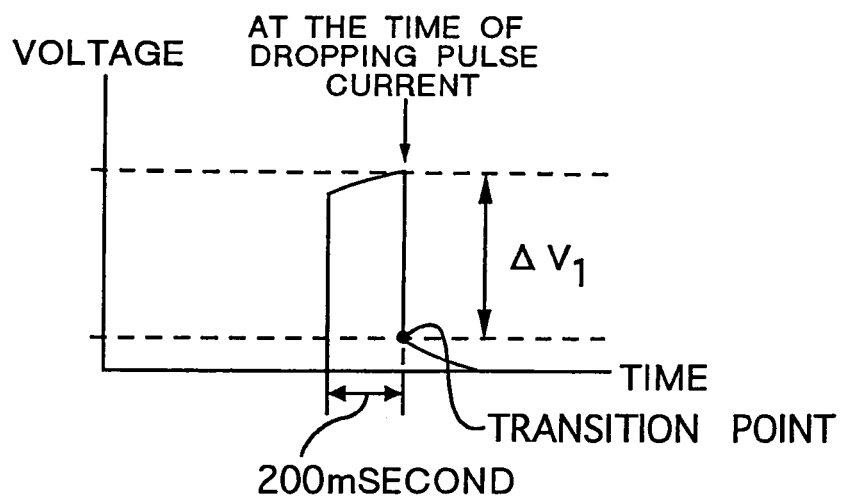
FIG. 10 is a graph showing the variation of a voltage of a pulse current measured by terminal voltage measuring means with time in the judging method 1-1.

Next, the terminal voltage measuring means 13 starts to measure the dropping amount of the terminal voltage of the secondary battery 10. With the measurement of the dropping amount of the terminal voltage by this terminal voltage measuring means 13, a voltage dropping curve shown in FIG. 10 can be obtained. In order to measure the dropping amount of the terminal voltage of the secondary battery 10, it is preferable to measure the voltage with time intervals of 300 μsec. or less. With this method, the transition point of the dropping voltage of the terminal voltage can be measured with accuracy. Furthermore, short time intervals of 50 μsec. or less can be adopted. The measurement data concerning the dropping amount of the terminal voltage of the secondary battery, which is measured with the terminal voltage measuring means 13, is also fed to the memory section 17 at all time and totalled therein.

The measurement data concerning the amplitude of the pulse current and the dropping amount of the terminal voltage of the secondary battery 10, which are respectively totalled in the memory section 17, are fed to the calculating means 15.

Next, in the calculating means 15, the dropping amount of the voltage which rapidly drops at the time the terminal voltage drops ($\Delta_1$) and the amplitude of the pulse current ($I_0$) are calculated from these measurement data, and the first resistance is calculated from $\Delta_1$ and $I_0$. Then, the first resistance is compared with the proportional relation of the internal resistance and first resistance, which is shown in FIG. 5, and an estimated value of the internal resistance of the secondary battery 10 is obtained. The level of the degradation of the secondary battery 10 can be judged based on thus obtained estimated value of the internal resistance.

[Condition Judging Method 1-2]

In this method, a new nickel-hydrogen battery (layer type of 95 Ah) is prepared as a secondary battery, and the initial activity of the secondary battery is judged, using the condition judging device illustrated in FIG. 8.

In the present judging method, in place of the calculating means 15 of the judging method 1-1, the calculating means (not shown) capable of obtaining an estimated value of the internal resistance of the secondary battery by calculating the dropping amount of the terminal voltage which gently drops just after a rapid drop of the terminal voltage and the amplitude of the pulse current at that time from the measurement data concerning the amplitude of the pulse current totalled in the memory 17 and the dropping amount of the terminal voltage of the secondary battery 10, which has been measured by the terminal voltage measuring means 13, obtaining a second resistance from the calculated dropping amount and pulse current, and comparing the second resistance with the proportional relation of the internal resistance and second resistance, which has been previously examined in a reference battery, and inputted.

Before judging the initial activity of the secondary battery 10, the proportional relation between the internal resistance and second resistance which have been respectively examined when a reference battery (new) of the same type (standard) as that of the secondary battery 10 is initially activated, is previously obtained. In this method, the proportional relation as shown in FIG. 6 can be obtained. By inputting this proportional relation in the calculating means, the present judging device is operated in the following manner.

By operating the bias DC current source 14a, and finely adjusting the resistance of the variable resistance element 14b, the voltage to be applied to the voltage control means 14 is equalized to the output voltage of the secondary battery 10, and then a pulse current is supplied to the secondary battery 10 from the pulse current source 12. The pulse current to be supplied to the secondary battery 10 from the pulse current source 12 has a composite voltage of the output voltage of the secondary battery and the voltage for judgement, which is dropped for judging the initial activity of the secondary battery, and the current varies, similarly to the pulse current shown in FIG. 9. The measurement data of the amplitude of the pulse current measured with the ammeter 16 is fed to the memory section 17 at all time and totalled therein.

Figure 11:
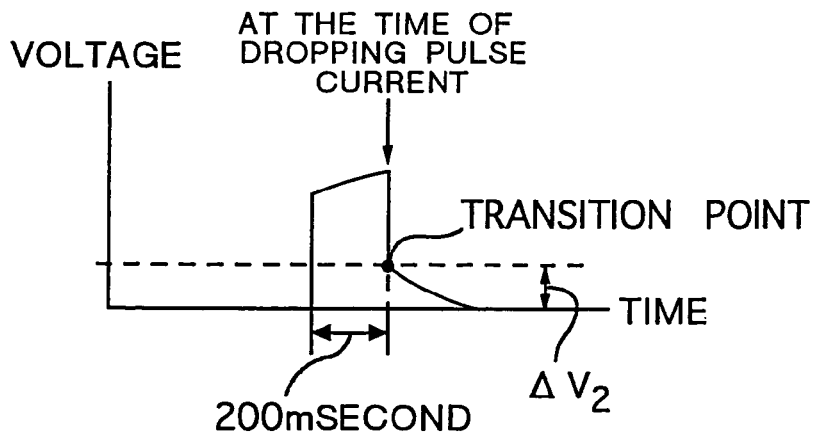
FIG. 11 is a graph showing the variation of a voltage of a pulse current measured by terminal voltage measuring means with time in the judging method 1-2.

Next, the terminal voltage measuring means 13 starts to measure the dropping amount of the terminal voltage of the secondary battery 10. With the measurement of the dropping amount of the terminal voltage by this terminal voltage measuring means 13, a voltage dropping curve shown in FIG. 11 can be obtained. In order to measure the dropping amount of the terminal voltage of the secondary battery 10, it is preferable to measure the voltage with time intervals of 300 μsec. or less. With this method, the transition point of the dropping voltage of the terminal voltage can be measured with accuracy. The measurement data concerning the dropping amount of the terminal voltage of the secondary battery, which is measured with the terminal voltage measuring means 13, is also fed to the memory section 17 at all time and totalled therein.

The measurement data concerning the amplitude of the pulse current and the dropping amount of the terminal voltage of the secondary battery 10, which are respectively totalled in the memory section 17, are fed to the calculating means 15.

Next, in the calculating means 15, the dropping amount of the voltage which gently drops at the time the terminal voltage of the secondary battery 10 drops ($\Delta_2$) and the amplitude of the pulse current ($I_0$) are calculated from these measurement data, and the second resistance is calculated from $\Delta_2$ and $I_0$. Then, the second resistance is compared with the proportional relation of the internal resistance and second resistance, which is shown in FIG. 6, and an estimated value of the internal resistance of the secondary battery 10 is obtained. The initial activity of the secondary battery 10 can be judged based on thus obtained estimated value of the internal resistance.

As disclosed in the first aspect, the method of charging or discharging the secondary battery of which the battery condition is to be judged with a predetermined current in a predetermined period of time, interrupting charging or discharging of the secondary battery, obtaining a voltage difference between the terminal voltage measured between a positive electrode terminal and negative electrode terminal at the time charging or discharging is interrupted, and the terminal voltage measured after interrupting of charging or discharging, and obtaining an internal resistance related value which is related to the internal resistance of the secondary battery based on the obtained voltage difference and the predetermined current, will be referred to as a current interrupter method.

[The Secondary Battery Condition Judging Method and Device Disclosed in the Sixteenth through Thirtieth Aspects]

With the judging method disclosed in the sixteenth aspect, the performance of the battery is judged based on the quantity of electricity which is related to the impedance or maximum power density (W/kg) obtained by applying an AC voltage to the secondary battery, and consequently, troublesome measuring operations requiring a great-sized equipment, such as charging of the battery in a long period of time and then discharging it, can be omitted, and degradation of the battery due to charging and discharging can be prevented.

And this method has an advantage of enabling a quick judgement of the battery condition at a required time. The present method is also applicable to the measurement of the battery condition of a primary battery.

With the judging method disclosed in the seventeenth aspect, in addition to the judging method of the sixteenth aspect, the maximum power density (W/kg) as the discharging performance of the battery is obtained based on the quantity of electricity, which is related to the impedance of the battery, and the performance of the battery is judged based on the maximum power density (W/kg).

The judgement of the battery performance is performed based on the initial power activity (maximum power density/standard power density) and power degradation (1-(maximum power density/standard power density)) being respectively within a predetermined permissible range or not.

With this method, the shortage of the power density due to the battery degradation of the like can be quickly measured with the impedance measurement using the AC current which does not affect the battery.

These initial power activity and power degradation can be used in combination with the above-described initial capacity activity and capacity degradation, or used solely.

These initial power activity and power degradation are determined by the factors for preventing the proceeding of the battery reaction upon discharging, which are equivalently expressed in an electric circuit as the increase of the impedance of the battery, especially the increase of the resistance component thereof.

Namely, where the initial power activity is small, or the power degradation is great, the resistance (internal resistance) of the battery increases to increase the battery loss. This results in the maximum power density (W/kg) of the battery lowering. Where the initial power activity is great, or the output degradation is small, the battery loss decreases and consequently, the maximum power density increases. Accordingly, the maximum power density is a preferable parameter for judging at least the discharging performance of the battery, such as the initial activity and degradation thereof.

Of course, it is possible to judge the performance of the battery in the initial period or after using thereof by discharging the battery from a fully charged condition until a final discharge voltage, and accumulating the quantities of discharging to obtain the initial capacity activity and capacity degradation of the battery. However, in this method, every battery requires considerable power equipments and testing time.

In contrast, in accordance with the present invention, the initial activity and degradation of the battery are judged based on the maximum power density. The maximum power density is obtained based on the AC impedance component of the battery. So, the circuit construction and operation become extremely simple, and degradation of the battery caused by the measurement of the maximum power density can be restrained.

The present inventors have conducted examinations and found that the maximum power density of the battery and the AC impedance thereof (the impedance component of the impedance of the battery, which varies with frequency) have a strong linear mutual relation. The present inventors have further found from the above findings that the discharge performance of the battery, such as the initial output activity and output degradation thereof, can be readily judged with the measurement of the AC impedance component of the battery.

More specifically, It has been proved that the reaction activity in the discharging reaction of the battery is approximately equivalent to the AC impedance component of the battery. An accurate reason therefor has not been clarified, but it can be supposed that the charging and discharging reaction activity of the electrodes of the battery lowers due to the generation of an inert film or the like on a surface of an active material powder within the electrodes to cause decreasing of the initial activity or increasing of the degradation. If this supposition is correct, this film can be made equivalent to a dielectric having a leakage resistance, and this dielectric can be made equivalent to a parallel RC circuit in an AC circuit, which includes a reaction resistance composed of a resistance component R varying with the reaction activity, and a capacitor having an electrostatic capacity C determined with the equivalent thickness of the film and dielectric constant thereof.

Accordingly, in this case, the impedance of the battery can be expressed as the impedance of the series circuit including the DC resistance component Zdc=r which is not related to the reaction activity, and the impedance (AC impedance component) Zac of the parallel RC circuit.

The sum of the resistance component (also referred to as AC resistance component) R out of the AC impedance component Zac, and the DC impedance component (also referred to as DC resistance component as the component out of the impedance of the battery, which does not depend on the frequency variation) r can be obtained as the DC internal resistance of the battery from the inclination of the characteristic line which is obtained by plotting the variation of the terminal voltage per unit quantity of discharging due to discharging of the battery on a two-dimensional plane.

This method, however, has the problems that the variation of the terminal voltage per unit quantity of discharging due to discharging of the battery is extremely small so that an accurate DC resistance (r+R) cannot be readily measured, and that the DC resistance component r which is not related to the initial activity and degradation of the battery cannot be separated from the resistance component R which is related to the initial activity and degradation of the battery. Furthermore, for measurement, the battery must be discharged to some extent under constant conditions so as to require a considerably long measurement time and a considerably great discharging equipment, which are not longer or greater than those of discharging from the fully charged condition to the completely discharged condition.

All of these problems has been overcome with the above-described present invention.

Furthermore, with the method of judging the discharging performance of the battery based on the maximum power density, the maximum power of the battery can be known. Therefore, this method is profitable in using the battery.

With the above-described eighteenth aspect, the initial activity of the battery is judged based on the obtained quantity of electricity so that the initial activity can be judged readily.

With the above-described nineteenth aspect, when the quantity of electricity is within a standard range, charging and discharging for the initial activation is finished so that the charging and discharging operation for initial activation can be shortened without producing inferior batteries of which the initial activity is not good.

With the above-described twentieth aspect, when the quantity of electricity is not within a predetermined range, charging and discharging for the initial activation restart so that the shipping of batteries inferior in initial activation is prevented.

With the above-described twenty-first aspect, the degradation of the battery is judged based on the obtained quantity of electricity so that the level of lowering of the battery performance with time can be known with ease.

With the above-described twenty-second aspect, when the quantity of electricity is outside a predetermined range, the battery life is judged to end so that the timing of exchanging an old battery for a new one can be judged with ease.

With the above-described twenty-third aspect, the quantity of electricity includes an AC impedance component which is composed of the component varying with the frequency of an AC voltage, out of the impedance of the battery. As described before, the AC impedance component of the battery and the maximum power density thereof have a good linear relation with each other so that the performance of the battery, particularly the discharging performance and charging loss can be judged preferably.

With the above-described twenty-fourth aspect, the quantity of electricity includes a DC impedance component (=r) composed of the component which does not vary with the frequency of an AC voltage, out of the impedance of the battery.

As described above, the DC impedance component of the battery corresponds to the resistance of the part which do not depend on the degradation of the battery and the electrochemical charging and discharging reaction resistance, such as the electric resistance of the electrode or the like. So, if this DC impedance component is abnormally great due to inferior welding, or the like, it can be judged that the improvement is impossible even with cycles of initial charging and discharging.

In addition, the level of the initial activity and that of the degradation of the battery can be estimated from the AC impedance component thereof. With this method, the judgement whether the maximum output density is good or not can be performed.

With the above-described twenty-fifth aspect, an AC voltage of a large number of frequencies within a predetermined frequency band is applied to the battery to obtain a real axis component and imaginary axis component of the impedance of the battery against each frequency, and an AC impedance component or DC impedance component as the quantity of electricity is calculated from the real axis component and imaginary axis component. With this method, the above-described AC impedance component and DC impedance component of the battery can be preferably obtained.

The power density may be judged based on the real axis component of the AC impedance component of the battery, or the imaginary axis component thereof.

With the above-described twenty-sixth aspect, the AC impedance component is calculated based on the diameter of an arc locus of the impedance on a two-dimensional plane including the real axis component and imaginary axis component as axes thereof. With this method, the above-described AC impedance component of the battery can be preferably obtained.

In place of the method of obtaining the AC impedance component from the diameter of the arc locus, the method of calculating the AC impedance component from the impedance obtained against each frequency using the equation disclosed in the above-described judging method will do.

With the above-described twenty-seventh aspect, the device for judging the battery performance includes an AC voltage applying element for applying an AC voltage having a large number of different frequencies to a secondary battery sequentially or simultaneously, a terminal voltage detecting element for detecting the terminal voltage of the secondary battery against each frequency, a current detecting element for detecting the quantity of electricity of the secondary battery against each frequency, an AC impedance component detecting element for detecting the AC impedance component composed of the component which varies with the applied AC voltage, out of the impedance of the battery from the detected terminal voltage and electric current, and a performance judging element for judging at least the discharging performance of the battery based on the AC impedance component.

This arrangement has excellent operational advantage that the judgement of the battery performance can be judged when necessary, and a great discharging of the battery is not required. When the present judging device is applied to the judgement of the primary battery, the condition thereof can be also judged.

With the above-described twenty-eighth aspect, the device for examining the battery includes an AC voltage applying element for applying an AC voltage having a large number of different frequencies to a secondary battery sequentially or simultaneously, a terminal voltage detecting element for detecting the terminal voltage of the secondary battery against each frequency, a current detecting element for detecting the quantity of electricity of the secondary battery against each frequency, a DC impedance component detecting element for detecting the DC impedance component r composed of the component which varies with the applied AC voltage, out of the impedance of the battery from the detected terminal voltage and electric current, and a performance judging element for judging at least the discharging performance of the battery based on the DC impedance component.

This arrangement has excellent operational advantages that the performance of the battery, such as the welding resistance of the electrode, can be readily judged, and a great amount of discharging of the battery is not required.

When the present judging device is applied to the judgement of the primary battery, the condition thereof can be also judged.

With the above-described twenty-ninth aspect, the device as disclosed in the twenty-eighth aspect further includes the arrangement disclosed in the twenty-seventh aspect, and consequently, the performance can be judged based on both the impedance components with a single measurement.

With the above-described thirtieth aspect, a bias power source is added to the measurement circuit in the direction in which the discharge current of the battery reduces so that the measurement in a small amount of discharging can be performed, thereby reducing the measurement error.

Hereinafter, preferred embodiments of the method and device for judging the condition of the battery in accordance with the present invention will be explained with reference to the drawings.

[Condition Judging Method 2-1]

(Device Arrangement)

Figure 12:
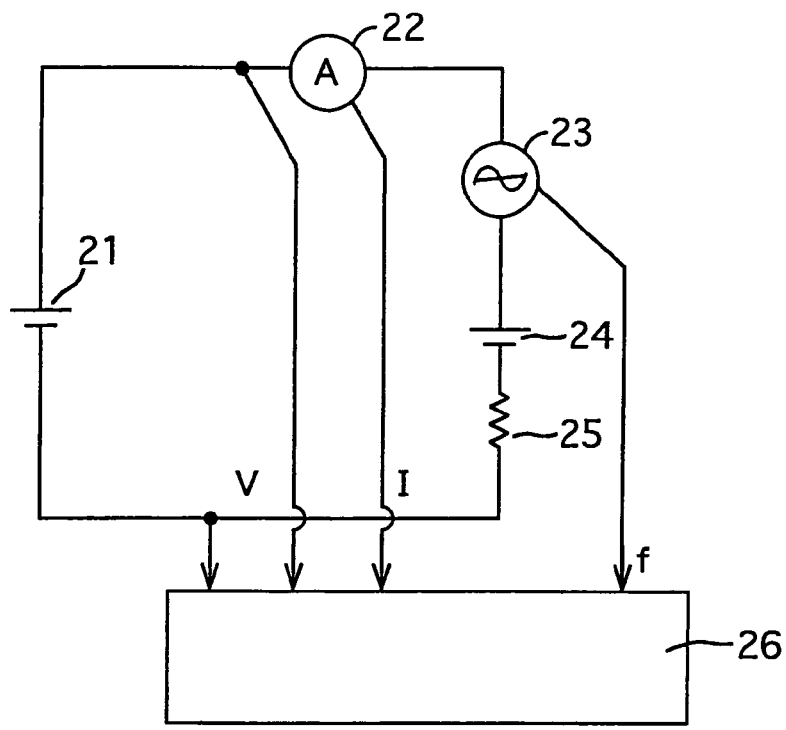
FIG. 12 is a block diagram of a circuit for performance-judgement in accordance with the present invention.

FIG. 12 is a block circuit diagram of the device for judging the initial activity of a nickel-hydrogen alloy battery in accordance with the present invention.

Reference numeral 21 denotes a battery, 22 denotes an ammeter, 23 denotes an AC power source of which frequency is variable, 24 denotes a bias DC power source, 25 denotes a resistance for limiting current, and 26 denotes a controller.

In this method, one single battery is used as the battery 21. Alternatively, a battery module composed of a plurality of single batteries which are connected in series may be used. It is preferable to charge the battery 21 until 20 to 80% of full charge capacity before judgement thereof. In this method, a bias DC power source is used for reducing the DC current. Alternatively, this bias DC power source may be omitted. It is preferable to measure in a discharging mode of the battery 1, wherein the open voltage of the battery is greater than the sum of the bias voltage and the maximum voltage of the AC power source. Namely, in this method, in order to reduce noise and scattering in current, which are affected by the electrode reaction of the battery 21 due to an excess charging current and discharging current of the battery, the battery in a slightly discharged condition is used. When the open voltage of the battery 1 is 1.2V, the amplitude of the applied AC voltage is 0.2 V, for example, the bias voltage is set to about 1V. This results in error and noise in the measured value which is caused by an excess charging and discharging current being able to be avoided.

Figure 13:
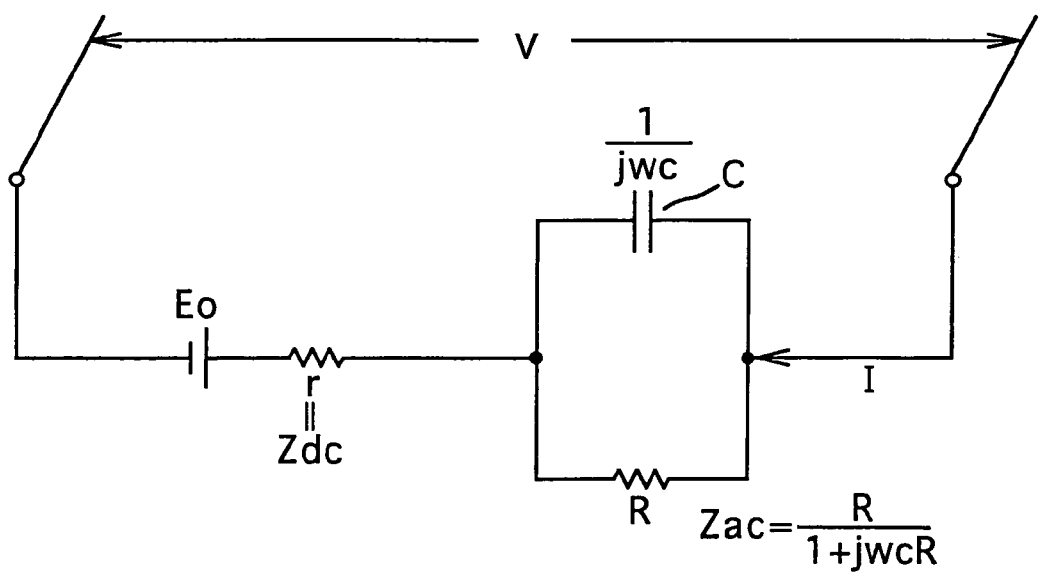
FIG. 13 is a diagram showing an equivalent circuit of a battery illustrated in FIG. 12.
Figure 14:
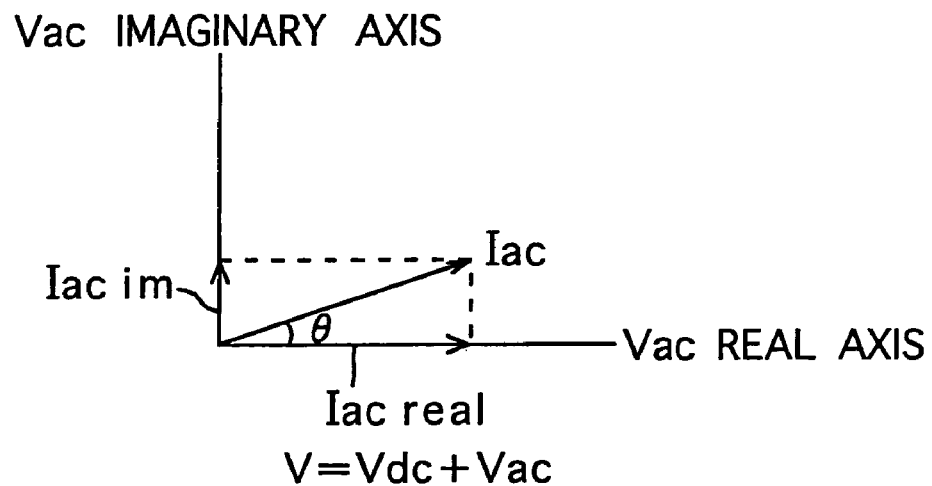
FIG. 14 is a vector diagram showing the relation between an AC voltage to be applied to a battery, and an AC current flowing therethrough.

FIG. 13 is a diagram showing a circuit equivalent to the battery 21 in a charged condition to which an AC voltage is applied.

The impedance Z of the battery is expressed by an equivalent circuit including a DC impedance component Zdc=resistance r and an AC impedance component Zac which are connected in series. The AC impedance component Zac is equivalent to a parallel circuit composed of a resistance R and capacitor C. The DC impedance component Zdc=resistance r is a resistance component of the battery, which does not vary with the frequency of the AC power source, and is composed of a conductor resistance such as a liquid resistance and electrode.

The AC impedance component $Zac=(r/(1+j\omega CR))$ is an impedance component which varies with the frequency of the AC power source. Since an oxide film and hydroxide film formed on a surface of an active material powder of the battery, for example, is regarded as a kind of a dielectric (insulator) film having a small leakage resistance R, that is a capacitor C, which is generated between the electrode and electrolyte, the equivalent circuit shown in FIG. 13 is provided. The initial activation treatment wherein the battery prior to used is subjected to the repetition of charging and discharging cycles, can be regarded as the process of breaking down one kind of dielectric (insulator) film having a small leakage resistance R, too, and the initial activity can be estimated from this AC impedance component Zac.

(Method for Calculating AC Impedance Component Zac No. 1)

By removing a DC voltage component ΔVdc from a detected voltage V across the battery 21, an AC voltage component Vac=Vm sin ωt, which is to be applied across the battery 21, and an AC current Iac=Im sin (ωt+θ)=Iacreal+jIacim are detected. Iacreal is a real axis component of the AC current Iac while jIacim is an imaginary axis component of the AC current Iac. The impedance component Z of the battery can be obtained from the above equations as follows:

$$Z=Vac/Iac=Zreal+jZim$$

where Zreal shows a real axis component of the impedance Z of the battery 21 and jZim shows the imaginary axis component of the impedance Z.

Next, the real axis component of the impedance Z of the battery 21 and the imaginary axis component of the impedance Z are obtained from the equivalent circuit of FIG. 13.

Upon AC circuit analysis, the impedance Z is expressed by:

$$Z=r+(1/((1/R)+j\omega c)),$$

and if omitting intermediate calculations, $$Zreal=r+(R/(1+\omega^2C^2R^2))$$

$$jZim=j\omega CR^2/(1+\omega^2C^2R^2)$$

where Z is r+Zac so that the AC impedance component of the battery 21 Zac is expressed by the following equation:

$$Zac=(R/(1+\omega^2C^2R^2))+j(\omega CR^2/(1+\omega^2R^2R^2))$$

These equations show that the AC impedance component Zac can be calculated by obtaining impedances Z of the battery 21 against at least three different frequencies, because there are three unknown numbers, r, R and C.

Alternatively, the maximum power density may be estimated using not the AC impedance component Zac but the AC resistance component R.

(Method for Calculating AC Impedance Component Zac No. 2)

Hereinafter, another method for calculating the AC impedance component Zac will be explained with reference to the flow chart shown in FIG. 17.

An AC voltage is applied to the battery 21 while varying the frequency thereof stepwise, and a voltage V and current I across the battery 21 is obtained against each frequency (S10), an AC voltage component Vac is obtained from the voltage V while an AC current component Iac is obtained from the current I, and Zreal and jZim are obtained from the impedance Z=Vac/Iac=Zreal+jZim (S12). Zreal shows a real axis component of the impedance Z of the battery 21 and jZim shows the imaginary axis component of the impedance Z.

Figure 15:
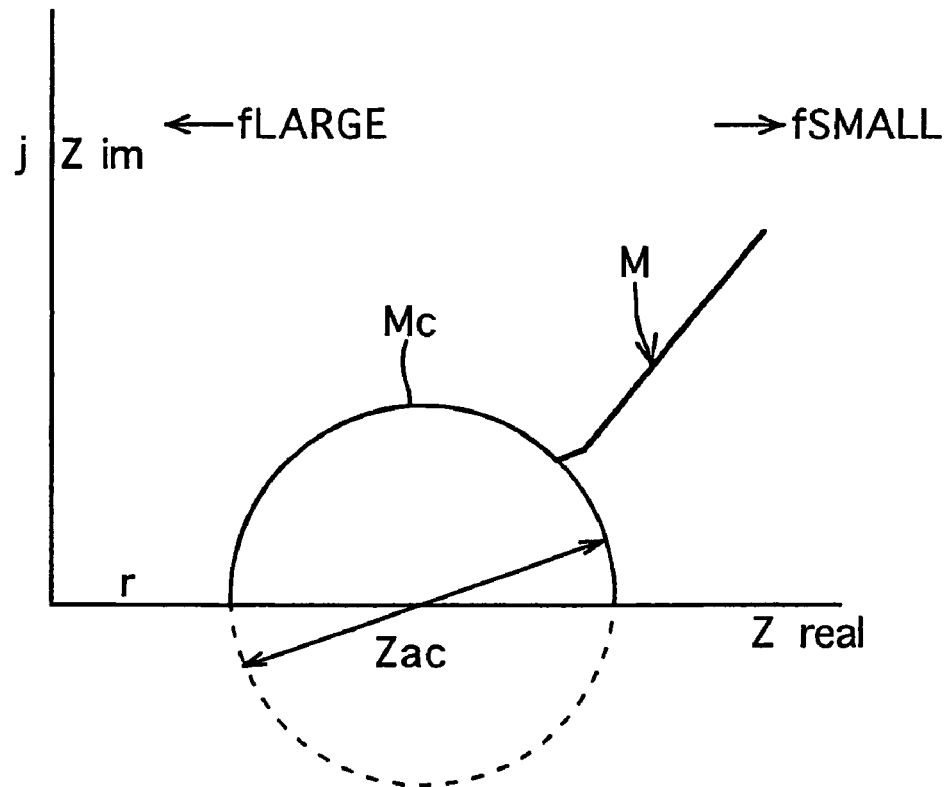
FIG. 15 is a characteristic line graph showing the variation of the relation between a real axis component and imaginary axis component of an impedance of a battery with frequency.

Next, a pair of real axis component and imaginary axis component are plotted on a two-dimensional plane of which the abscissa is the real axis component and the ordinate is the imaginary axis component, and a complex impedance line M is drawn, as shown in FIG. 15 (S14).

Then, the diameter of an approximately arc-shaped part Mc of this complex impedance line M is obtained by an approximation method as the AC impedance component Zac of this battery 21 (S16).

Next, the obtained. AC impedance component Zac is examined whether it is less than a predetermined threshold Zacth or not (S18), and if less than the predetermined threshold Zacth, the judgement that the initial activity is sufficient is made, and a signal indicating this judgement is outputted (S20), or if greater than the predetermined threshold Zacth, the judgement that the initial activity is insufficient is made, and a signal indicating this judgement is outputted (S22).

(Operational Advantage of the Judging Method)

In accordance with the method and device for judging the initial activity of the battery, the accurate initial activity can be judged with a compact device in a short period of time so as to have a great practical advantage. And the continuation or finishing of the charging and discharging cycles for the initial activation treatment can be also judged based on the judgment results, and consequently, power can be saved, and the productivity can be improved.

Modified Embodiment 1

The above-described judging method was applied to the judgement of the initial activity of the battery. This method can be also applied to the judgement of the battery life by merely changing the threshed Zacth of the AC impedance component Zac, and furthermore, the present level of degradation of the battery can be detected at all time by previously memorizing the relation between the battery degradation and AC impedance component Zav on a map, and substituting the calculated AC impedance component Zac into this map.

Modified Embodiment 2

The above-described judging method was applied to the judgement of the charging and discharging performance of the battery 21 based on the AC impedance component Zac of the battery. It is clear that the charging and discharging performance of the battery 21 may be judged using the real axis component Zacreal of the AC impedance component Zac or the imaginary axis component Zacim thereof, preferably the real axis component Zacreal.

Modified Embodiment 3

Figure 16:
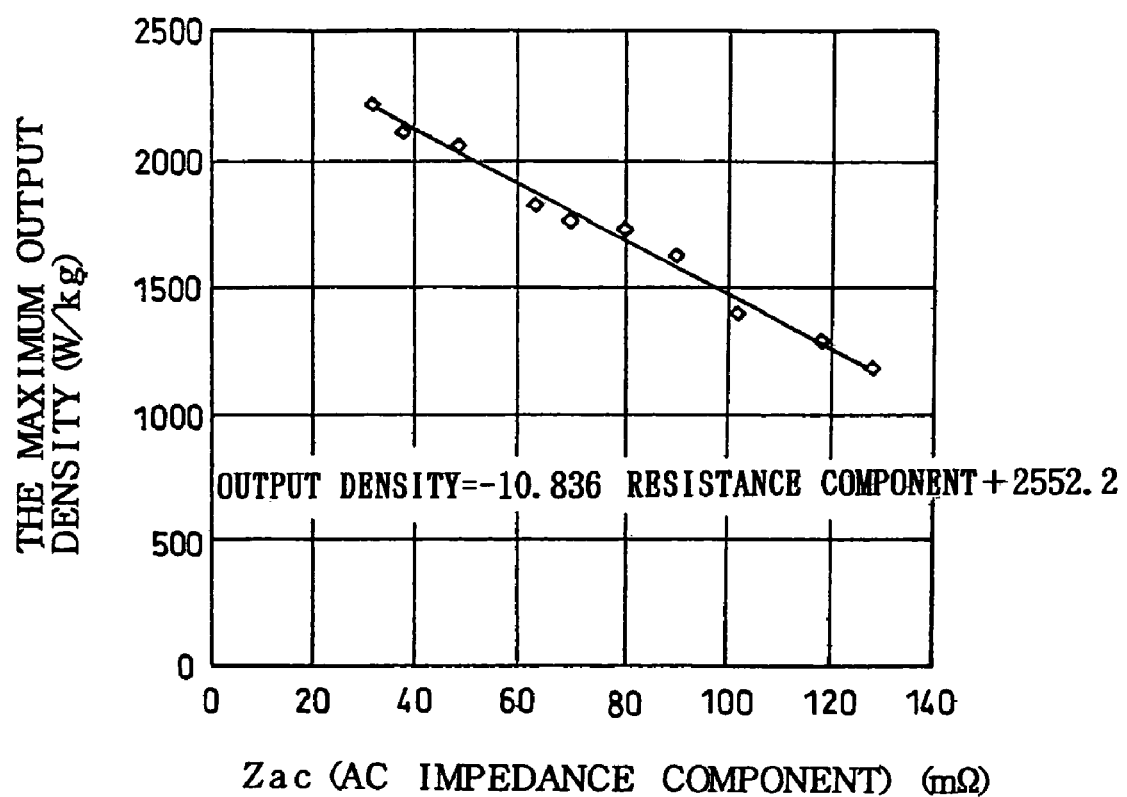
FIG. 16 is a characteristic line graph showing the relation between an AC impedance component Zac of a battery and the maximum output density thereof.

With the above-described judging method, the judgement was made based on the AC impedance component Zac of the battery 21. It is clear from the relationship shown in FIG. 16 that the charging and discharging performance of the battery may be judged based on the maximum work density which is obtained from the AC impedance component Zac.

Furthermore, it is possible to judge the charging and discharging performance of the battery based on some parameter including the AC impedance component Zac, such as all impedance Z of the battery, and the judgement of the charging and discharging performance of the battery 21 may be made from the quantity of electricity related to the maximum power density (W/kg) of the battery 21, which is obtained by another method.

[Condition Judging Method 2-2]

Figure 18:
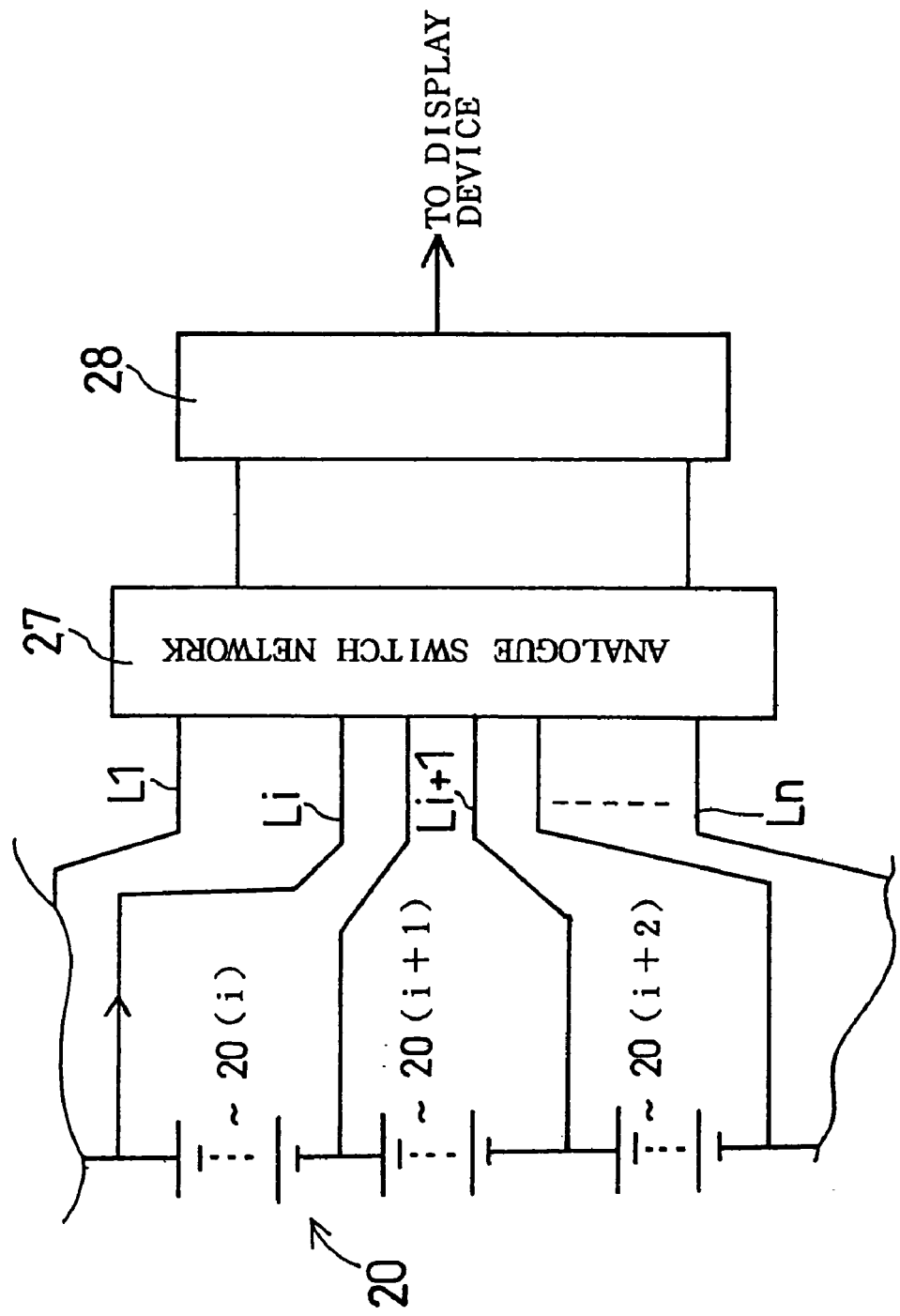
FIG. 18 is a block circuit diagram of a battery degradation judging device for mounting on an electromobile, which uses the circuit of FIG. 12.

Hereinafter, the device for judging the degradation of a combination battery for use in an electric vehicle, which uses the above-described condition judging method, will be explained with reference to FIG. 18.

This device is assembled in an electric vehicle, and, by request, the calculation results thereof are displayed on a display panel provided near a driver's seat and monitored by a car control device.

Reference numeral 20 denotes a combination battery. This combination battery is composed of a large number of battery modules (only 20(i), 20(i+1), 20(i+2) are illustrated) which are connected in series. Each battery module is composed of ten single batteries, for example, which are connected in series, and both ends of the combination battery 20 and connecting points of the battery modules are connected to a controller (not shown) for use in the combination battery via monitor cables L1 through Ln for monitoring the voltage of the battery module. Reference numeral 27 denotes an analogue switch network which connects adjacent two out of the monitor cables L1 through Ln to the charging and discharging performance judging circuit (21 through 26 in FIG. 12).

With this arrangement, by changing over the analogue switch network, the degradation of each battery module can be sequentially judged.

It is preferable to judge the degradation with this device for a predetermined period of time after finishing of charging and discharging of the battery, and to stop discharging of the battery to a load, or charging of the battery during judging. If necessary, it is also possible to judge the degradation at the time the charging and discharging current is less than a predetermined current while using the battery.

[Condition Judging Method 2-3]

Figure 19:
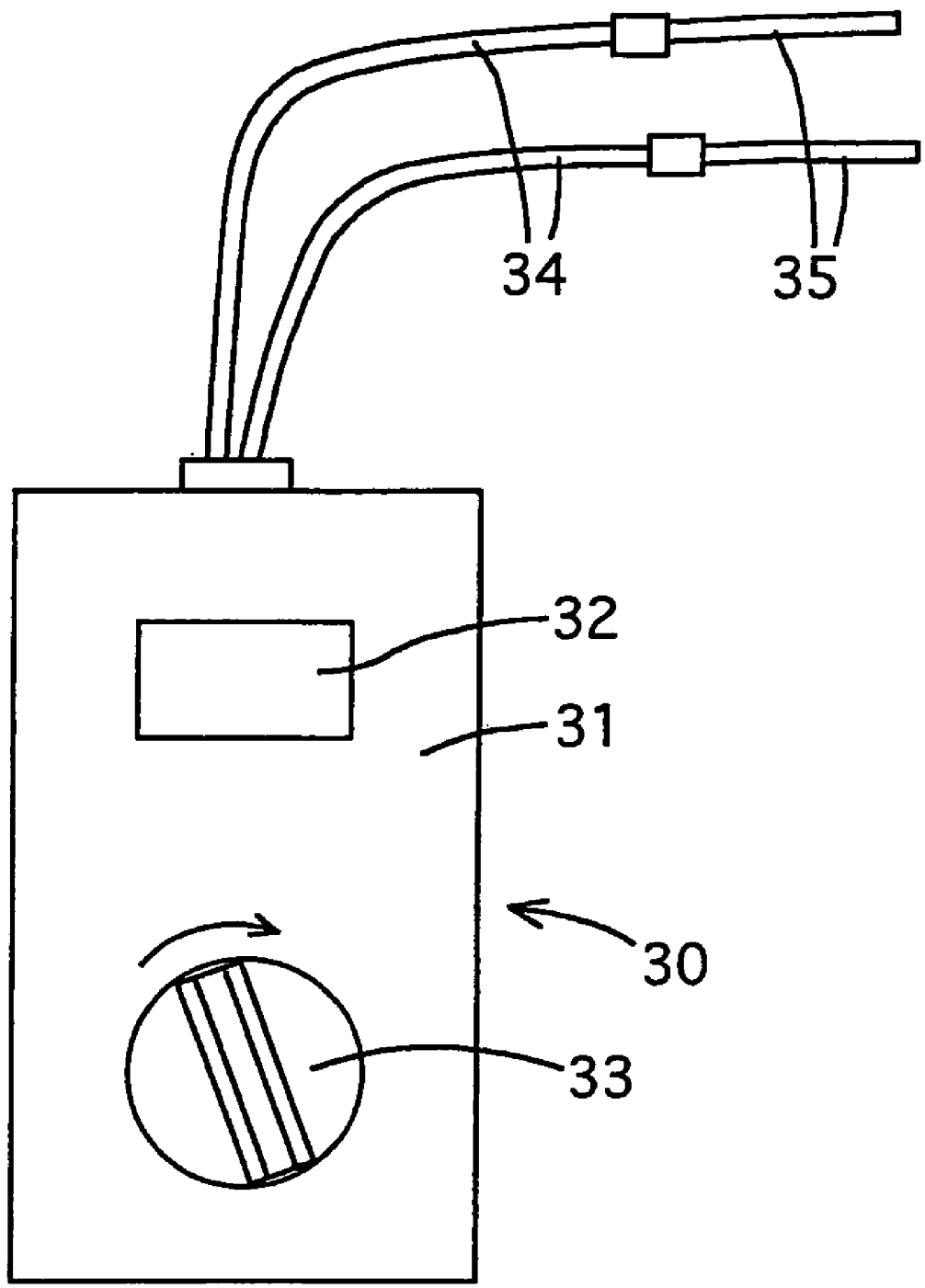
FIG. 19 is a schematic plan view of a portable battery degradation judging device which uses the circuit of FIG. 12.

Hereinafter, a portable device 30 for judging the degradation of a combination battery for use in an electric vehicle, which uses the above-described condition judging method, will be explained with reference to FIG. 19.

This device 30 is used for judgement of the degradation of the combination battery in a service station or the like. A circuit illustrated in FIG. 12 is provided within a casing 31, and a liquid crystal panel 32 for displaying the level of the degradation, and a switch 33 for changing over the bias voltage are provided on a surface of the casing 31. It is also possible to detect the input voltage, and automatically change over the bias voltage in accordance with the detected input voltage such that the current becomes less than a predetermined current.

Reference numeral 34 denotes a pair of input cables. A detection terminal rod 35 is provided at an end of each input cable 34.

[Condition Judging Method 2-4]

The quality of an electric circuit within a battery, such as the condition of welded parts thereof, can be judged based on the DC impedance component r of the battery using the method explained in the method 2-1.

Figure 17:
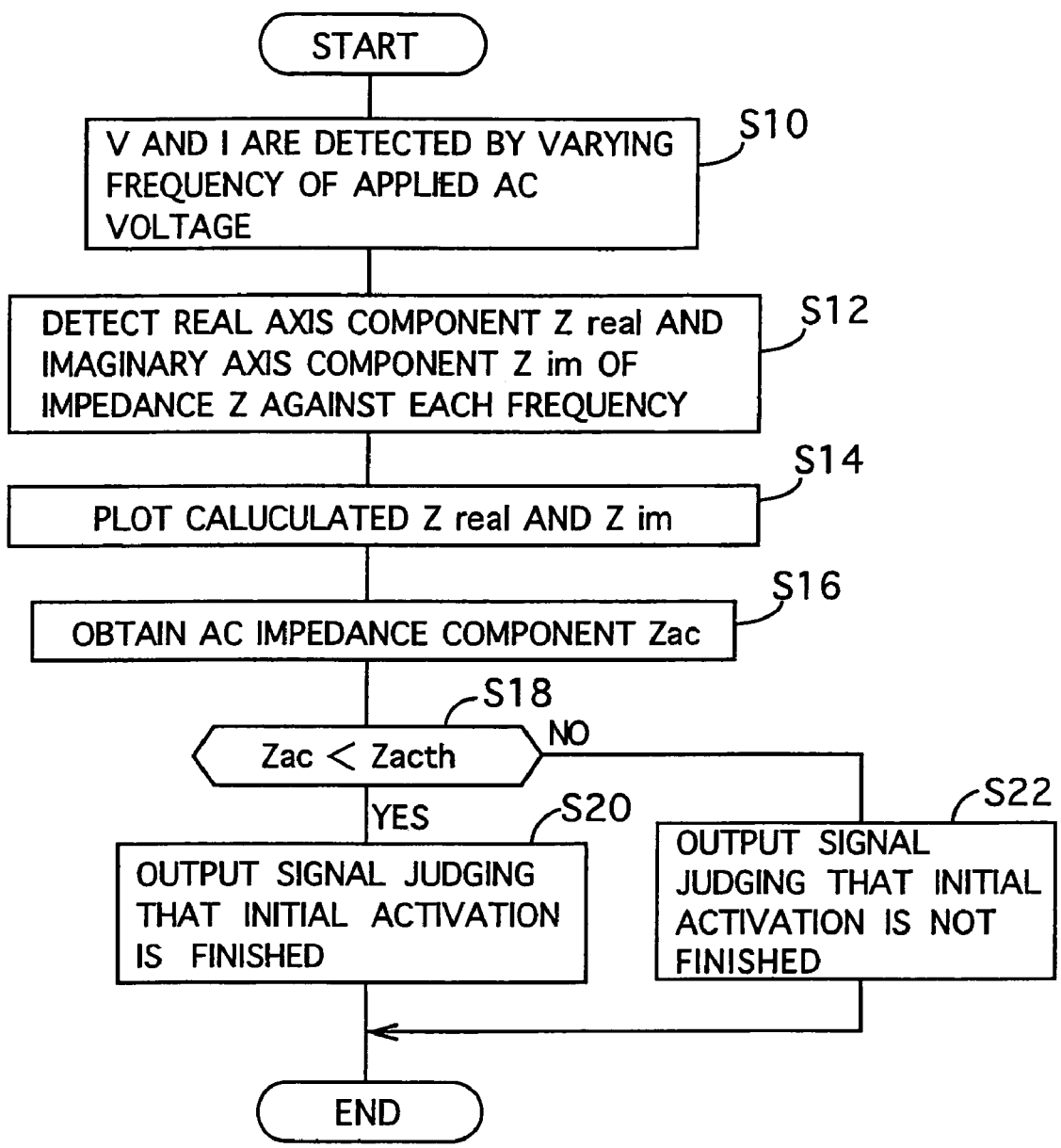
FIG. 17 is a flow chart showing the initial activity judging action in the judging method 2-1.

More specifically, in S16 of the flow chart shown in FIG. 17, the DC impedance component r is further obtained, and just before S18 of the flow chart of FIG. 17, it is checked whether the DC impedance component r is greater than the predetermined threshold rth or not. If the DC impedance component r is greater than the predetermined threshold rth, a signal indicating the bad condition is outputted to finish this routine, and if the DC impedance component r is less than the predetermined threshold rth, S18 starts.

With this method, the battery check can be performed electrically with ease and accuracy.

[Condition Judging Method 2-5]

The flow chart shown in FIG. 17 in the method 2-1 can be performed in each charging and discharging cycle for initial activation. If the judgement in S18 is not yes even with a predetermined threshold number of charging and discharging cycles for initial activation, a signal indicating that the AC impedance component is excessively bad may be outputted to finish this routine.

With this method, the battery check can be performed electrically with ease and high accuracy.

[Condition Judging Method 2-6]

In the preceding condition judging methods, the initial activity and degradation of the secondary battery are judged and the check thereof are performed. These methods can be also applied to the primary battery. In this case, the operational advantage that the degradation of the primary battery due to the discharge loss and discharging thereof can be restrained.

Other Embodiment 1

In the present specification, in order to effect the arrangement of "measuring the terminal voltage across a battery by passing an AC current to the battery", as disclosed above, "the AC voltage applying element" is used. One example of "the AC voltage applying element" is "the AC power source of which the frequency is variable".

In order to effect the arrangement of "measuring the terminal voltage across a battery by passing an AC current to the battery", it is also possible to generate the AC current with a power of the battery using a load of which the internal impedance periodically varies with a predetermined frequency. Therefore, the above-described "AC voltage applying element of which the frequency is variable" includes "the load of which the internal impedance periodically varies with a predetermined frequency". A three-terminal switch of which the resistance varies according to the sinusoidal function to change the control voltage, such as a transistor can be used as "a load of which the internal impedance periodically varies with a predetermined frequency".

Other Embodiment 2

In the condition judging method, "an AC power source of which the frequency is variable" was used. By applying a composite AC voltage having an AC voltage of a large number of different frequencies, an AC voltage and AC current of each frequency can be readily separated with a band-pass filter. With this arrangement, the measuring period can be shortened.

As disclosed in the sixth aspect, the method of applying an AC voltage to a secondary battery, and detecting the quantity of electricity, which is related to the impedance of the secondary battery or related to the maximum power density will be referred to as an AC impedance method.

[The Condition Judging Method of the Secondary Battery, which is Disclosed in the Thirty-First through Fortieth Aspects]

The internal resistance of the secondary battery is generated due to various factors. Especially great factors are the ion conduction resistance of the electrolyte, and the reaction resistance of the electrodes. The present inventors have found that the degradation of the secondary battery includes three kinds of degradation modes (first, second and third degraded condition) which differs from each other in the manner of increasing of the resistance, as follows.

{First Degraded Condition}

This degraded condition is mainly caused by the increase of the first resistance component. The first resistance component is mainly composed of the ion conduction resistance of electrolyte so as to be as an ion conduction parameter. This increase of the first resistance component is mainly caused by drying of electrolyte. Accordingly, by supplementing the electrolyte to a battery, the battery performance can be recovered.

{Second Degraded Condition}

In this degraded condition, both the first resistance component and second resistance component increase to degrade the battery. The second resistance component is mainly composed of an reaction resistance of electrodes, and consequently, serves as an electrochemically reactive parameter of the electrodes. In this battery, an electrolyte is dried up in the initial degraded condition. In addition, the surface of the negative electrode (negative electrode active material) is oxidized to increase the reaction resistance of the electrodes. In this case, it is insufficient to supplement the electrolyte to the battery. It is necessary to activate the negative electrode again by removing an oxide on the surface thereof, thereby reducing the reaction resistance thereof.

To this end, a proper amount of sodium hypophosphite is added to the electrolyte. With this method, both the supplement of the electrolyte and reduction and removal of the oxide film from the surface of the negative electrode alloy can be both effected. With this treatment, the internal resistance of the battery can be reduced. However, when a large amount of reducing agent is added to the electrolyte, the active material of the positive electrode partly changes from $Ni(OH)_2$ to $NiO$, and consequently, the battery capacity decreases. For this reason, the amount of the reducing agent to be added to the electrolyte is limited. The upper limit thereof is about 0.4 mol/l.

{Third Degraded Condition}

In this degraded condition, the oxidized film is very thick. To remove this oxidized film, a large amount of a reducing agent is required. However, for the above reason, the addition of a large amount of a reducing agent is impossible. Accordingly, the battery in this condition is difficult to recover while holding the battery configuration so that it is required to take the negative electrode from the battery casing and recycle it in the material level.

The present inventors have performed charging and discharging of a secondary battery of which the battery condition is to be judged with a predetermined current in a predetermined period of time, and interrupted charging and discharging thereof. A voltage difference between the terminal voltage measured between a positive electrode terminal and negative electrode terminal at the time charging or discharging is interrupted, and the terminal voltage measured after interruption of charging or discharging, is obtained, and a first resistance and second resistance are respectively obtained based on the obtained voltage difference and the predetermined current as the internal resistance related values, which are related to the internal resistance of the secondary battery. As a result, they have found that the first resistance corresponds to a first resistance component mainly composed of the ion conduction resistance of the electrolyte, and the second resistance corresponds to a second resistance component mainly composed of the reaction resistance of the electrodes.

On the other hand, the present inventors have earnestly studied and investigated, and consequently found that by applying an AC voltage of a large number of frequencies within a predetermined frequency band to a secondary battery, measuring a real axis component and imaginary axis component of the impedance in each frequency, plotting the real axis component and imaginary axis component on a plane co-ordinate where a real axis and imaginary axis intersect perpendicularly, to obtain an arc locus of the impedance, the AC impedance component Zac which is obtained by the approximation method of the diameter of an approximate arc part Mc of the complex impedance line M corresponds to the first resistance component, and the DC impedance component Zdc (=resistance r) corresponds to the second resistance component. Namely, they have found that the distance between an intersection of the arc locus and imaginary axis and the origin of the plane co-ordinate corresponds to the first resistance component, and the diameter of the arc component of the arc locus corresponds to the second resistance component.

The present inventors have found that the first and second resistance components can be obtained with a predetermined method such as a current interrupter method and AC impedance method as the internal resistance related values which are respectively related to the internal resistance of the secondary battery of which the battery condition is to be judged. In addition, they have further found that the first resistance component and second resistance component respectively have a predetermined relation with the battery condition. Furthermore, they have also found that the resistance component ratio which is calculated by the formula of arctan (second resistance component/first resistance component), of which the value calculated by this formula being an angle of a right triangle between one adjacent side composed of the first resistance component $r_1$, and the hypotenuse composed of the second resistance component $r_2$ has a predetermined relation with the battery condition.

Thus, the present inventors have found that by obtaining the first resistance component, second resistance component and the resistance component rate which are the internal resistance related values respectively related to the internal resistance of the secondary battery of which the battery condition is to be judged with a predetermined method, the battery condition of the secondary battery can be judged based on the comparison of at least one of these values with the previously obtained relation with the battery condition.

The present invention has been contemplated based on the above-described findings of the present inventors.

The first resistance component is mainly composed of the ion conduction resistance of electrolyte so as to have a close relationship with the condition of the electrolyte. And the second resistance component is mainly composed of the reaction resistance of the electrodes so as to have a close relation with the condition of the electrodes.

Accordingly, with the condition judging method of the secondary battery, which is disclosed in one of the twenty-first through twenty-fifty aspects, the condition of the electrodes, electrolyte or the like can be judged in detail based on the magnitude of each of the first resistance component and second resistance component, and the ratio thereof. This results in the detailed judgement whether the secondary battery is in a normal condition or degraded condition becoming possible. Especially, when the secondary battery is in a degraded condition, the level and reason of the degradation can be judged in detail.

With the present invention, the battery condition of the secondary battery can be judged as follows, for example.

At first, the first resistance component ($r_1$) and second resistance component ($r_2$) of a secondary battery of which the battery condition is to be judged are respectively obtained as the internal resistance related values which are related to the internal resistance with a predetermined method, and arctan ($r_2/r_1$) (=θ) is obtained.

On the other hand, similarly, the first resistance component ($r_1'$), second resistance component ($r_2'$) of a reference battery equivalent to (of the same type as) the secondary battery along with arctan ($r_2'/r_1'$) (=θ') are respectively obtained previously. And the relation between these values and the battery condition is previously investigated.

By comparing at least one of $r_1$, $r_2$ and θ of the secondary battery of which the battery condition is to be detected with the previously investigated relation using the reference battery, the battery condition of the secondary battery is judged.

With the above-described thirty-sixth aspect, the degradation judging standard value as the border value of the sum of the first resistance component and second resistance component of the reference battery which is equivalent to the secondary battery 21 between a normal condition and a degraded condition is previously obtained. If the sum of the first resistance component and second resistance component of the secondary battery is less than the degradation judging standard value, the secondary battery is judged to be in a normal condition. And if the sum is greater than the degradation judging standard value, the secondary battery is judged to be in a degraded condition. Therefore, by merely calculating the sum of the first resistance component and second resistance component, it can be judged whether the secondary battery is in a normal condition or degraded condition. The degradation judging standard value also depends on the usage and using condition of the battery as well as the kind of the battery.

By judging whether the secondary battery is in a normal condition or degraded condition beforehand, the judgment of the level thereof is facilitated.

At first, the relation between $r_1'$, $r_2'$ and θ' of the reference battery and the normal condition thereof (normal relation) and the relation between $r_1'$, $r_2'$ and θ', and the degraded condition are respectively investigated beforehand.

If the secondary battery is judged to be in a normal condition upon calculating the sum of the first resistance component and second resistance component, at least one of measured values of $r_1$, $r_2$ and θ of the secondary battery is compared with the above-described normal relation. This method facilitates the judgement of the normal condition in detail. On the other hand, if the secondary battery is judged to be in a degraded condition based on the sum of the first resistance component and second resistance component, at least one of measured values of $r_1$, $r_2$ and θ of the secondary battery is compared with the degraded relation. This method facilitates the judgement of the degraded condition in detail.

With this condition judging method, the detailed judgement of the battery condition can be efficiently made, and consequently, the detailed judgement of the battery condition can be made in a short period of time and at low costs.

In the case of the sum of the first resistance component and second resistance component of the battery being equal to the internal resistance thereof, the battery condition is previously judged from the internal resistance, and the first resistance component or second resistance component are measured after estimating an important measured value of the first or second resistance component based on the judged battery condition. This method facilitates a more accurate judgment of the battery condition. This results in the battery condition of the secondary battery being able to be judged more accurately and more quickly.

There are various degradation modes which differs from each other in the reason for degradation of the battery. For example, as described above, there are the first, second and third degraded conditions.

With the condition judging method of the secondary battery, which is disclosed in the above-described thirty-seventh aspect, the battery condition can be judged with the degraded condition further divided into these degradation modes.

Accordingly, this condition judging method facilitates the detailed judgement of the degraded condition of the secondary battery. Especially, by using this condition judging method after judging whether the secondary battery is in a normal condition or degraded condition with the above-described condition judging method, the detailed judgement of the degraded condition can be efficiently made. The first border value and second border value vary with the design or the like of the battery.

Thus, the present condition judging method enables a detailed judgement of the degraded condition of the secondary battery in a short period of time and at low costs.

As described above, with the condition judging method of the secondary battery, which is disclosed in the thirty-first through thirty-seventh aspects, the secondary battery can be subjected to a proper regenerating treatment in accordance with the degraded condition thereof. By subjecting the secondary battery to a proper regenerating treatment before it becomes impossible to be used due to degradation thereof, the battery can be used over a long period of time. Accordingly, the costs required for changing an old battery which becomes impossible to be used to a new one can be saved.

Where the battery has not recovered to a normal condition with the regenerating treatment, because of a large number of repetition of regenerating treatments which have been performed every time the battery is degraded, the battery is dismantled to recycle usable materials.

[Condition Judging Method of the Secondary Battery, which is Disclosed in the Thirty-Eighth through Fortieth Aspects]

The present inventors have obtained a first resistance component mainly composed of an ion conduction resistance of an electrolyte, and a second resistance component composed of a reaction resistance of electrodes as the internal resistance related values which are related to the internal resistance of a reference battery equivalent to the secondary battery (another secondary battery of the same type as the secondary battery, for example), plotted the internal resistance values on a plane co-ordinate of which X axis and Y axis intersect perpendicularly with the first resistance component as one axis component (X component) and the second resistance component as another axis component (Y component), and investigated the battery condition of the secondary battery in detail.

As a result, the present inventors have found that, as shown in FIG. 1, the co-ordinate plane can be divided into a normal region as a set region of the internal resistance co-ordinates of the reference battery in a normal condition, and degraded regions as set regions of the internal resistance co-ordinates of the reference battery in a degraded condition. And they have found that when the degraded condition is divided into a first degraded condition which is mainly caused by the increase of the ion transfer resistance, a second degraded condition which is mainly caused by the increase of the ion conduction resistance and reaction resistance, and a third degraded condition which is caused by the excess increase of the reaction resistance, the degraded regions on the plane co-ordinate can be divided into a first degraded region which is a set region in the first degraded condition, second degraded region which is a set region in the second degraded condition, and third degraded region which is a set region in the third degraded condition.

Figure 2:
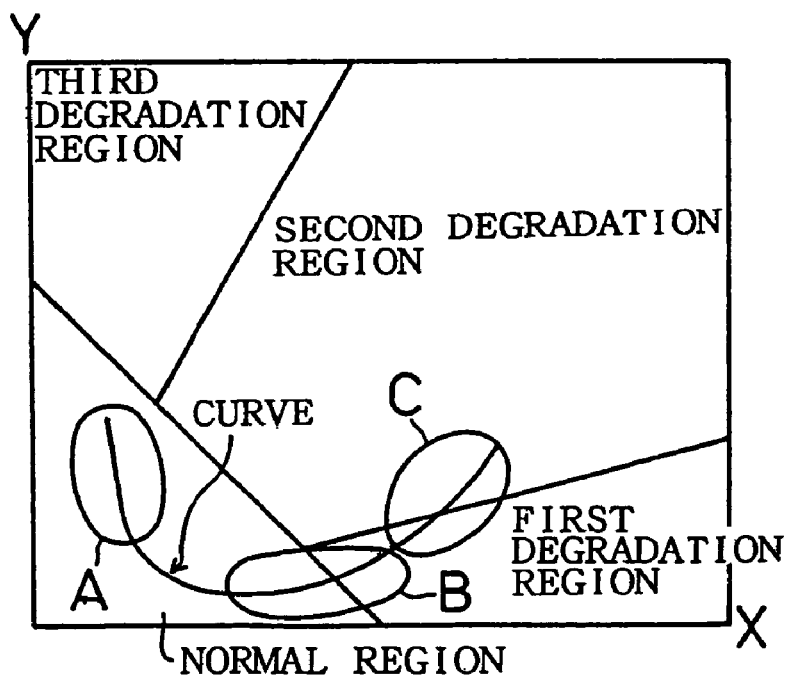
FIG. 2 is a curve graph showing the variation of the internal resistance co-ordinate in a plane co-ordinate of FIG. 1 with the increase of the number of using times of the secondary battery.

They have also found that as the number of using times of the secondary battery increases, the internal resistance co-ordinate thereof varies in the plane co-ordinate along the curve shown in FIG. 2.

The part A of the curve corresponds to the part where the battery condition varies due to the activation of the battery, which is caused by the initial charging and discharging, and consequently the internal resistance co-ordinate varies. With this initial activation, the oxidized film which has existed on the surface of the negative electrode active material is removed, and consequently the second resistance component decreases.

It can be considered that when the internal resistance co-ordinate is in the part A of the curve, the electrolyte is sufficient so that the first resistance component hardly varies. Accordingly, the relation between the internal resistance and second resistance component is not affected by the variation of the magnitude of the first resistance component so that the relation between the reaction resistance and internal resistance upon activation is obtained.

In the part B of the curve, as shown by the graph shown in FIG. 5, the first resistance and internal resistance have a proportional relation with each other. And in the part C of the curve, the internal resistance shown in FIG. 21 rapidly increases.

Thus, the present inventors have found that by obtaining the internal resistance co-ordinate of a reference battery which is equivalent to the secondary battery, and the relation between the obtained internal resistance co-ordinate and battery condition, and comparing the internal resistance co-ordinate of the secondary battery with the obtained relation, the condition of the secondary battery can be judged.

The present invention has been contemplated based on the above-described findings.

With the above-described thirty-eighth aspect, the operational advantages similar to those of the thirty-third through thirty-fifth aspects can be obtained. In addition, the battery condition can be judged visually so that the detailed judgement of the battery condition can be facilitated.

The plane co-ordinate is not limited to that where the X axis and Y axis intersect perpendicularly, as disclosed above. Since the plane co-ordinate wherein X and Y axes intersect perpendicularly is easiest to see, thereby facilitating the judgement of the battery condition.

With the above-described thirty-ninth aspect, the operational advantages similar to those of the thirty-sixth aspect can be obtained. In addition, it can be visually judged whether the secondary battery is in a normal condition or degraded condition so that the efficient detailed judgement of the battery condition can be facilitated.

With the above-described fortieth aspect, the operational advantages similar to those of the thirty-seventh aspect can be obtained. In addition, it can be visually judged whether the secondary battery is in a first degraded condition, second degraded condition or third degraded condition out of the degraded condition so that the efficient detailed judgement of the battery condition, especially the degraded condition thereof, can be facilitated.

With the present condition judging method, it is preferable to set the border line between the first degraded region and second degraded region by the straight line of the proportional function which has the inclination of the first border value disclosed in the third aspect, and set the border line between the second degraded region and third degraded region by the line of the proportional function which has the inclination of the second border value disclosed in the third aspect.

In the preceding condition judging methods, the method for obtaining at least one of the first resistance component and second resistance component is not limited specifically. It is preferable to use the method disclosed in one of the forty-first through forty-seventh aspects.

[Condition Judging Method of the Secondary Battery, which is Disclosed in the Forty-First through Forty-Seventh Aspects]

With the arrangements disclosed in the forty-first through forty-seventh aspects, the condition of each of the electrodes and electrolyte can be judged in detail and quickly, and consequently the judgement whether the secondary battery is in a normal condition or degraded condition can be made quickly and in detail. Especially, when the secondary battery is in a degraded condition, the level of degradation or the reason for degradation can be judged in detail and quickly. And the judgement can be made with ease at any time as required.

Especially, with the above-described forty-fifth through forty-seventh aspects (AC impedance method), a more accurate judgement of the battery condition, as compared with the above-described forty-first through forty-fourth aspects (current interrupter method), becomes possible. The current interrupter method does not require any external power source in the judgement algorithm thereof so that the battery condition can be judged during driving of a vehicle by mounting the judgement algorithm thereon.

On the other hand, the AC impedance method requires an external power source, and consequently it is difficult to judge the battery condition during driving of a vehicle by mounting the judgement algorithm, for example. thereon.

However, by using this method, while the secondary battery is charged by an external charger or the like, the battery condition can be judged accurately.

The power density of the secondary battery is an especially important battery performance. This power density greatly depends on the battery condition. As the battery is degraded, the power density decreases. Namely, the battery condition and power density have an extremely close relation with each other. As described above, the parameter of the maximum power density is an especially preferable parameter for use in the judgement of at least the discharging performance such as the initial activity and degradation. Accordingly, with the above-described forty-eighth aspect, the battery condition can be judged based on the power density in detail.

[Regenerating Method Disclosed in the Fifty-First Aspect]

The present inventors have found that the lowering of the battery performance in a nickel-hydrogen battery provided with a negative electrode wherein a hydrogen-occluding alloy is used as a negative electrode active material is mainly caused by drying up of the electrolyte, and degradation of the negative electrode due to oxidization thereof. The present inventors have further studied the process of lowering of the battery performance, and have found the following points.

As charging and discharging of the battery are repeated, the negative electrode is pulverized due to the discharging reaction, and at the same time, the positive electrode is swelled to decrease the amount of the electrolyte, thereby lowering the battery capacity and increasing the internal resistance. When the number of charging and discharging cycles is small, the variation of the battery capacity and internal resistance is small, but as the number of charging and discharging cycles increases, the battery capacity remarkably lowers and the internal resistance remarkably increases. The reason therefor is considered as follows.

As the battery capacity lowers and the internal resistance increases, excess charging takes place. With this excess charging, gases are generated within the battery to decrease the amount of the electrolyte. When the inner pressure of the battery further increases and an evaporation gas of the electrolyte is released from a safety valve or the like, the amount of the electrolyte further decreases, and consequently, the negative electrode is further oxidized to lower the battery capacity rapidly and increase the internal resistance rapidly.

Figure 30:
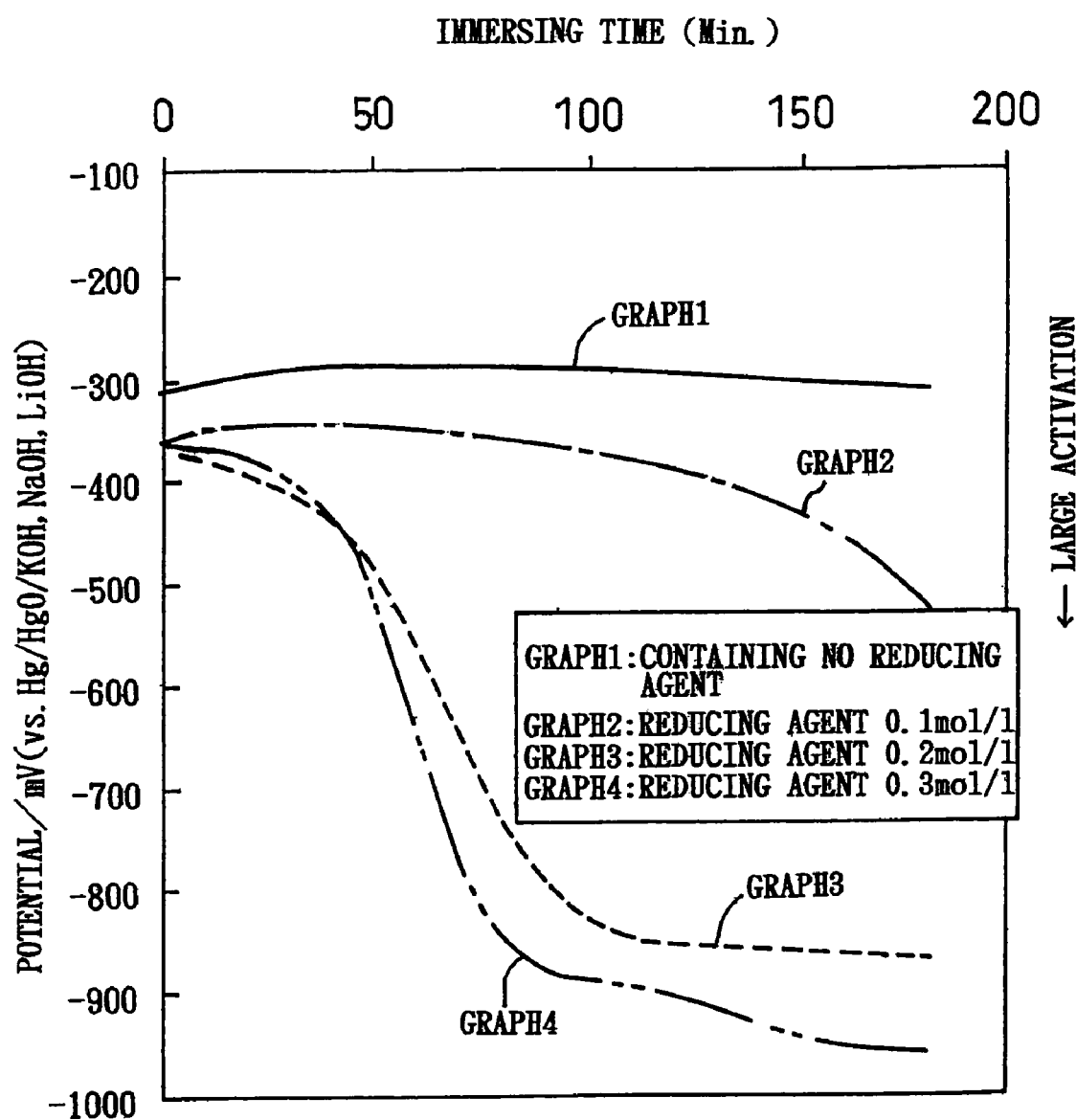
FIG. 30 is a graph showing the difference in recovering of the battery performance between the case where a negative electrode has been subjected to a reducing treatment and the case where a negative electrode has not been subjected to a reduction treatment when the negative electrode is oxidized to be degraded.

The performance of the oxidized and degraded negative electrode can be recovered by a reducing treatment using a reducing agent. One example of the reducing treatment is shown in FIG. 30.

In this example, a hydrogen-occluding alloy ($MmNi_{5-x-y-z}Al_xMn_yCo_z$ (Mm:mishmetal)) was used as the negative electrode active material of a nickel-hydrogen battery, and an aqueous solution mainly composed of potassium hydroxide was used as the electrolyte thereof. By repeating a large number of charging and discharging cycles under predetermined charging and discharging conditions, the negative electrode was oxidized. The negative electrode thus oxidized and degraded was subjected to the reducing treatment by immersing the negative electrode in the electrolyte containing a predetermined density of reducing agent in a predetermined period of time. Sodium hypophosphite was used as the reducing agent.

In this example, four negative electrodes degraded due to oxidization thereof were prepared. Three negative electrodes out of them were subjected to a reducing treatment using electrolytes, each containing 0.1 mol/l, 0.2 mol/l or 0.3 mol/l of a reducing agent. During the reducing treatment, the potential of each negative electrode was measured using a dropping mercury electrode (Hg/HgO/KOH, NaOH, LiOH).

The remaining negative electrode was immersed in an electrolyte containing no reducing agent, and the potential thereof was measured similarly.

FIG. 30 shows that the absolute value of the potential of the negative electrode which was immersed in the electrolyte containing the reducing agent is greater than that of the negative electrode which was immersed in the electrolyte containing no reducing agent, and consequently the negative electrode immersed in the electrolyte containing the reducing agent is activated so that the performance thereof is recovered. This is considered to be caused by the oxide on the surface of the negative electrode being reduced with the reducing agent.

Accordingly, when the negative electrode is oxidized and degraded, the performance of the negative electrode can be recovered with the addition of the reducing agent to the electrolyte. But, in the case of the degradation level of the negative electrode being low, the positive electrode is also reduced with the reducing agent which has been added to the electrolyte, and consequently the performance of the positive electrode lowers. One example of this process is shown in FIG. 31.

In this example, the reducing treatment was performed by immersing a positive electrode of which the active material is nickel hydroxide in the electrolyte containing a predetermined concentration of reducing agent in a predetermined period of time. In this example, an aqueous solution mainly composed of potassium hydroxide was used as the electrolyte, and sodium hypophosphite was used as the reducing agent.

In this example, three positive electrodes were prepared, and two positive electrodes out of them were subjected to a reducing treatment using electrolytes, each containing 0.2 mol/l or 0.3 mol/l of a reducing agent. During the reducing treatment, the potential of each positive electrode was measured using a dropping mercury electrode (Hg/HgO/KOH, NaOH, liOH). The remaining positive electrode was immersed in an electrolyte containing no reducing agent, and the potential thereof was measured similarly. FIG. 31 shows the variation of the potential of each positive electrode with the immersing time thereof.

Figure 31:
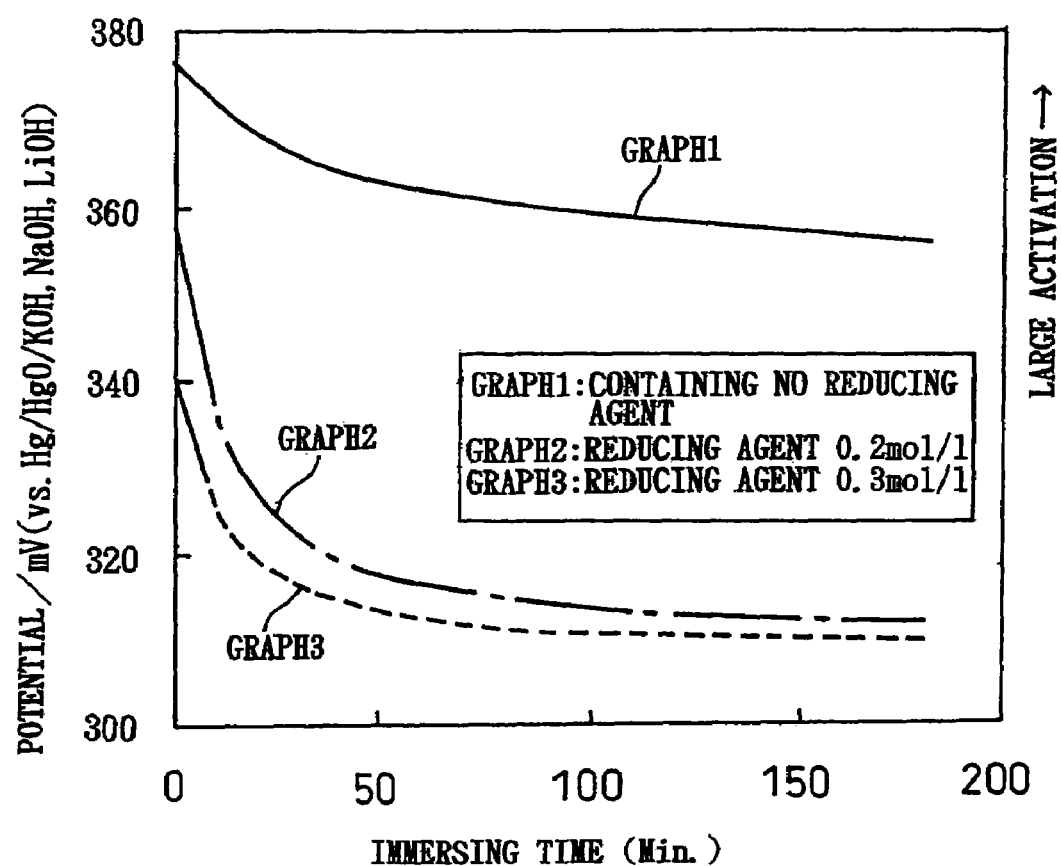
FIG. 31 is a graph showing the difference in lowering of the battery performance between the case where a positive electrode has been subjected to a reducing treatment and the case where a positive electrode has not been subjected to a reducing treatment.

As is apparent from FIG. 31, the potential of the positive electrode which was immersed in the electrolyte containing the reducing agent is less than that of the positive electrode which was immersed in the electrolyte containing no reducing agent, and consequently the positive electrode immersed in the electrolyte containing the reducing agent is made inactive so that the performance thereof lowers. This is considered to be caused by the decrease in the number of Ni valance in the positive electrode active material (self discharging).

While the number of charging and discharging cycles is small, the oxidization of the negative electrode does not proceed so much so that lowering of the battery performance is mainly caused by drying up of the electrolyte rather than the degradation due to the oxidization of the negative electrode. If lowering of the battery performance due to lowering of the performance of the positive electrode becomes greater than improving of the battery performance due to recovering of the performance of the negative electrode upon adding the reducing agent to the electrolyte in the battery, resulting battery performance lowers.

The method for regenerating the secondary battery, which is disclosed in the above-described fifty-first aspect has been contemplated based on the above-described findings.

The kind of the secondary battery to which the present invention can be applied is not limited specifically.

The present invention can be applied to a nickel-hydrogen battery, for example. Especially, the nickel-hydrogen battery provided with a negative electrode of which an active material is a hydrogen-occluding alloy, and an electrolyte which is interposed between a positive electrode and the negative electrode (which is disclosed in forty-seventh aspect) is most suitable.

When the present regenerating method is applied to the nickel-hydrogen battery provided with a negative electrode of which an active material is a hydrogen-occluding alloy, and an electrolyte which is interposed between a positive electrode and the negative electrode, in the case of the degradation level of the negative electrode being low, the electrolyte is only supplemented, and in the case of the degradation level thereof being high, a reducing agent is added to the electrolyte, thereby regenerating the battery.

When the degradation level of the negative electrode of the negative electrode is low, the electrolyte is only supplemented so that the battery performance can be recovered without decreasing the performance of the positive electrode.

On the other hand, when the degradation level of the negative electrode is high, the reducing agent is added to the electrolyte so that recovering of the battery performance due to the recover of the performance of the negative electrode increases much more, as compared with lowering of the battery performance due to the decrease of the performance of the positive electrode, thereby recovering the battery performance. Consequently, the battery performance can be readily recovered by an extremely simple method of adding a reducing agent to the electrolyte without changing a degraded negative electrode to a new one.

As described above, with the present invention, the lowering battery performance of the nickel-hydrogen battery can be recovered with ease. The present invention can be applied to another nickel-hydrogen battery having the following arrangement.

The active material of the positive electrode is not limited specifically. Any well known active material for the positive electrode may be used. For example, nickel hydroxide can be used as the active material for the positive electrode. And cobalt oxide adapted to improve the using rate of the active material may be used additionally.

A hydrogen-occluding alloy is used as the active material of the negative electrode. The kind of the hydrogen-occluding alloy is not limited specifically. Any well-known hydrogen-occluding alloy will do. For example, $MmNi_{5-x-y-z}Al_xMn_yCo_z$ may be used.

Each of the positive electrode and negative electrode may be the electrode prepared by applying a powdery electrode active material containing a tackiness agent or the like to a surface of a collector thereof, that is the electrode prepared by forming an electrode active material layer containing an electrode active material on the surface of the collector thereof.

The configuration and arrangement of the positive electrode and negative electrode are not limited specifically. Various configurations and arrangements will do. For example, a flat positive electrode plate and flat negative electrode plate are arranged so as to be opposed to each other, flat positive electrode plates and flat negative electrode plates are layered on each other, a cylindrical positive electrode and cylindrical negative electrode having different diameters are alternately arranged coaxially, and a band-shaped positive electrode plate and a band-shaped negative electrode plate are piled on each other and wound on a central axis (will be referred to as "wound type"). A separator may be interposed between the positive electrode and negative electrode.

The kind of the electrolyte is not limited specifically, and any well-known electrolyte may be used. For example, an alkali aqueous solution such as an aqueous solution of potassium hydroxide, an aqueous solution of sodium hydroxide and a mixture aqueous solution of potassium hydroxide and sodium hydroxide will do.

When a predetermined battery performance of the nickel-hydrogen battery having the above arrangement is not achieved during using, and consequently the battery performance lowers, the degradation level due to the oxidization of the negative electrode is examined. The method for examining the degradation level is not limited specifically.

Figure 27:
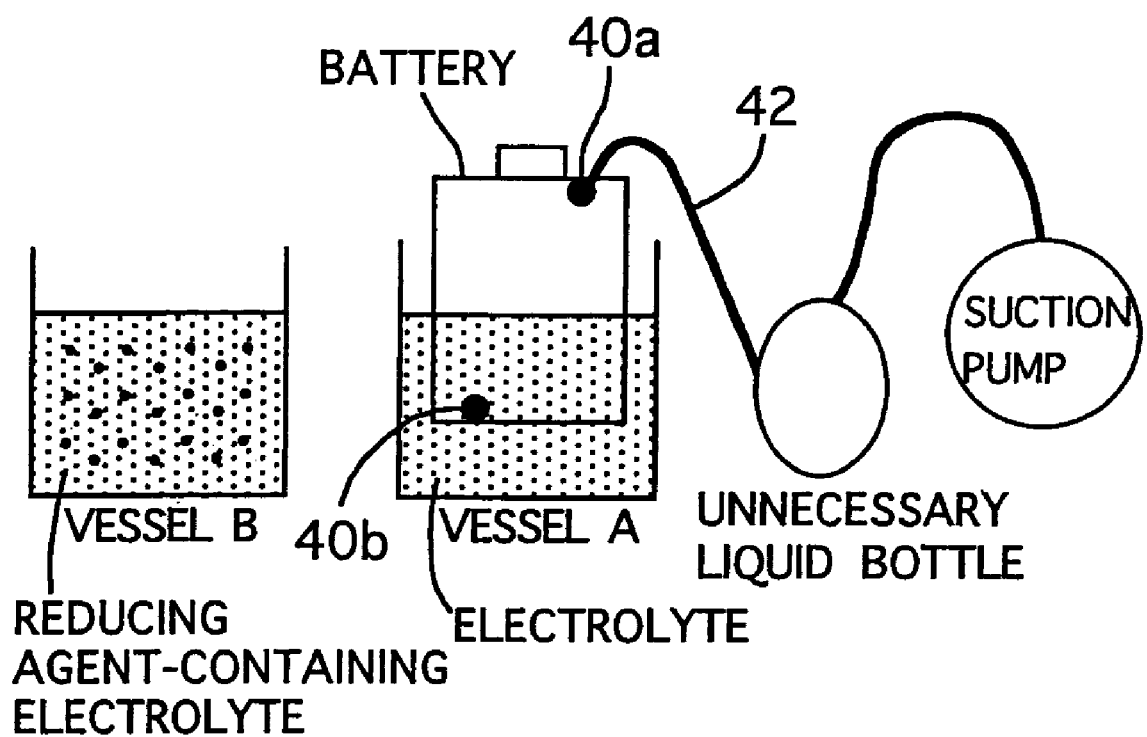
FIG. 27 is a schematic diagram illustrating the method for supplementing an electrolyte in a battery, and the means therefor in the regenerating method 1.

When the degradation level of the negative electrode is judged low, the electrolyte is only supplemented. The method and means for supplementing the electrolyte are not limited specifically. In the case of an enclosed battery, the electrolyte can be supplemented by the method and means illustrated in FIG. 27. This example will be explained in detail with reference to the later-described condition judging method. Openings 40a and 40b are respectively provided in an upper part and lower part of a battery casing, and gas within the battery casing is sucked out via one opening 40a while electrolyte is sucked into the battery casing via another opening 40b, thereby supplementing the electrolyte. The positions of the openings provided in the battery casing are not limited to those in FIG. 27. In FIG. 27, a cylindrical battery (such as a wound type battery) is schematically illustrated. The battery is not limited to this type. Similar method can be applied to the layered type battery.

On the other hand, when the degradation level of the negative electrode is judged high, a reducing agent is added to the electrolyte. Sodium hypophosphite, sodium borohydride, hydrazine or the like can be used as the reducing agent. Examples of the method for adding the reducing agent are as follows.

One example is the method of directly adding the reducing agent to the electrolyte. This method is effective when there is a sufficient quantity of electrolyte within the battery so as not to require any supplement of electrolyte. With this method, after adding the reducing agent to the electrolyte, the reducing agent is dissolved in the electrolyte by a proper method. In the case of the reducing agent being the material which dissolves quickly in the electrolyte, the required operation is extremely easy. So, this method is a most effective method.

Another example is the method of preparing an electrolyte containing a reducing agent, and supplementing the prepared electrolyte to the electrolyte within the battery. This method is effective when the electrolyte is dried up with the degradation of the negative electrode, and the supplement of electrolyte is needed. In addition, this method is also effective when the reducing agent is the material which is difficult to dissolve in the electrolyte only with the addition of the reducing agent thereto. In this case, after dissolving the reducing agent in the electrolyte outside the battery by some proper method, the electrolyte containing the reducing agent is added to the electrolyte within the battery. The method for supplementing the electrolyte containing the reducing agent to the electrolyte within the battery is not limited specifically. The supplement of the electrolyte can be performed with the method and means illustrated in FIG. 27.

The amount of the reducing agent is not limited specifically. But, if the amount is too small, the oxidized and degraded negative electrode cannot be reduced sufficiently. Furthermore, as shown in FIGS. 30 and 31, as the amount of the reducing agent increases, the reduction of the negative electrode is efficiently performed, but at the same time, the reduction of the positive electrode is promoted. Consequently, if the amount of the reducing agent is too great, the degraded negative electrode can be sufficiently reduced, but excess reducing agent reduces the positive electrode. And if the amount of the excess reducing agent is great, a hydrogen gas is generated and the internal pressure of the battery may increase.

Accordingly, in order to reduce the degraded negative electrode sufficiently without reducing the positive electrode, the amount of the reducing agent is properly selected. At this time, it is preferable to add the reducing agent which is enough for reducing the negative electrode sufficiently in accordance with the degradation level thereof. By limiting the amount of the reducing agent in this manner, an excess reducing agent can be prevented from existing in the electrolyte.

On the other hand, by using the reducing agent which can readily reduce the hydrogen-occluding alloy of the negative electrode, as compared with the nickel of the positive electrode, the negative electrode can be reduced speedily, as compared with the positive electrode. At this time, the amount of the reducing agent is not limited specifically.

It is preferable to add the reducing agent enough for reducing the negative electrode sufficiently in accordance with the degradation level of the negative electrode. In the case of the reducing agent being excessively added, the electrolyte may be changed to a new one just when the negative electrode is sufficiently reduced before reducing the negative electrode. By limiting the properties of the reducing agent in this manner, the degraded negative electrode can be reduced much sufficiently without reducing the positive electrode.

As described above, after the reducing agent is added to the electrolyte, and the negative electrode is reduced thereby, a reaction product due to the reduction remains in the negative electrode or electrolyte. If this reaction product is the material which has bad effects on the battery performance, the electrolyte is changed to new one, and removed. When the electrolyte is changed, the reaction product which has been attached to the surface of the negative electrode and cannot be removed therefrom with ease can be removed by washing away it with a proper cleaning liquid. The kind of the cleaning liquid is not limited specifically. It is preferable to use the electrolyte or a solvent thereof as the cleaning liquid.

[Regenerating Method 1]

In the present method, the wound type nickel-hydrogen battery including a positive electrode of which an active material was nickel hydroxide, a negative electrode of which an active material was a hydrogen-occluding alloy (MmNi$_{5-x-y-z}$Al$_x$Mn$_y$Co$_z$) and an electrolyte composed of potassium hydroxide was regenerated, as follows, by the regenerating method in accordance with the present invention. This battery was prepared by the following method.

At first, powdery nickel hydroxide was prepared as the positive electrode active material, and this positive electrode active material was applied on a belt-shaped foamed metal substrata using a proper adhesive, and pressed thereon, thereby forming a positive electrode plate. On the other hand, a powdery hydrogen-occluding alloy (MmNi$_{5-x-y-z}$Al$_x$Mn$_y$Co$_z$) was prepared as the negative electrode active material, and this negative electrode active material was applied on a belt-shaped foamed metal substrata using a proper adhesive, and pressed thereon, similarly to the case of the positive electrode, thereby forming a negative electrode plate. These positive electrode plate and negative electrode plate are wound with a separator interposed therebetween to form an electrode body. This electrode body and electrolyte are accommodated in a battery casing which can be readily dismantled and assembled, thus obtaining a battery.

The wound type battery thus prepared was subjected to a predetermined number of charging and discharging cycles under predetermined charging and discharging conditions.

Then, the electrode body was taken from this wound type battery and cut into a proper size to prepare a layered battery for confirmation. This layered battery was subjected to one of the following operations in accordance with the level of the degradation of the negative electrode, and predetermined battery performance was examined. As a result, the battery performance was confirmed to be recovered with the following operations.

{In the Case of the Level of the Degradation of the Negative Electrode Being Low}

Figure 28A:
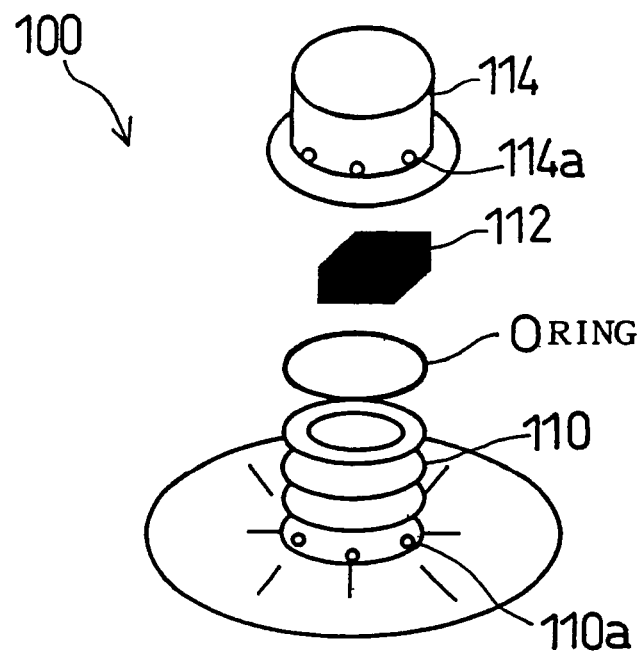
FIG. 28(a) is an exploded view thereof.
Figure 28B:
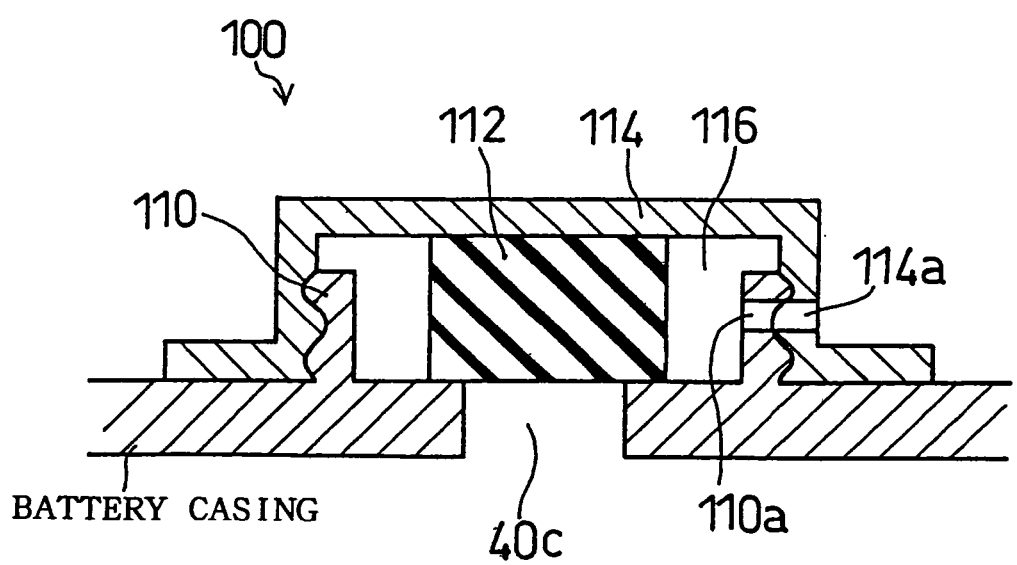
FIG. 28(b) is a longitudinal sectional view thereof.

When the level of the degradation of the negative electrode is low, the electrolyte was supplemented by the method and means illustrated in FIG. 27. As illustrated in FIG. 27, an inlet pipe 42 connected to a suction pump is connected to an opening 40a adapted to discharge a gas or electrolyte from a battery. As illustrated in FIG. 28, an opening of a safety valve 100 which can be arbitrarily detached from the battery casing can be used as the opening 40a.

This safety valve 100 includes a cylindrical base part 110 which extends integrally from the battery casing so as to be interconnected with an opening 40c, a rubber body (EPDM rubber) 112 which is accommodated within the base part 110, and a cap 114 for closing an opening of the base part 110. Screw threads are formed on each of an outer peripheral surface of the base part 110 and an inner surface of the cap for fitting them firmly in each other. The base part 110 and cap 114 are respectively provided with gas outlet ports 110a and 114a. Furthermore, O rings may be provided in predetermined positions between the base part 110 and cap 114 as sealing members.

With this arrangement of the safety valve, in the case of the inner pressure of the battery increasing, the rubber body 112 is compressed with the increased inner pressure to contract, and consequently, spaces are formed between the rubber body 112 and battery casing. At this time, a pressurized gas is discharged from the battery via the opening 40c, spaces between the rubber body 112 and battery casing, hollow parts 116 and gas outlet ports 110a, 114a, whereby the inner pressure is restrained from increasing. In this example, after the safety valve is detached from the battery casing, the inlet pipe 42 which is connected to the suction pump is inserted in the opening 40c for attachment to the battery casing.

In place of this safety valve 100, a safety valve 200 illustrated in FIG. 29 may be used. In this safety valve 200, one part of the inlet pipe 42 (a built-in inlet pipe 42a) is provided beforehand, and a predetermined number of outlet ports 110b, each having a predetermined size, are provided in predetermined positions of the base part 110. By turning the cap 114, the connection of the gas outlet port 114a with the gas outlet ports 110a and 110b can be arbitrarily changed.

Figure 29A:
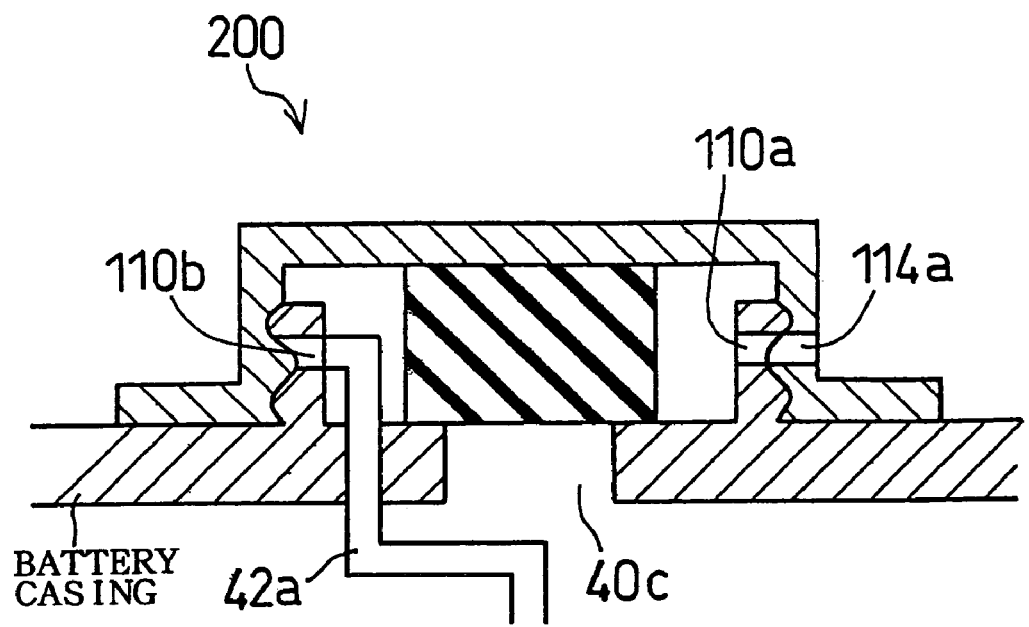
FIG. 29(a) is a view illustrating the state where the battery is used in a normal condition.
Figure 29B:
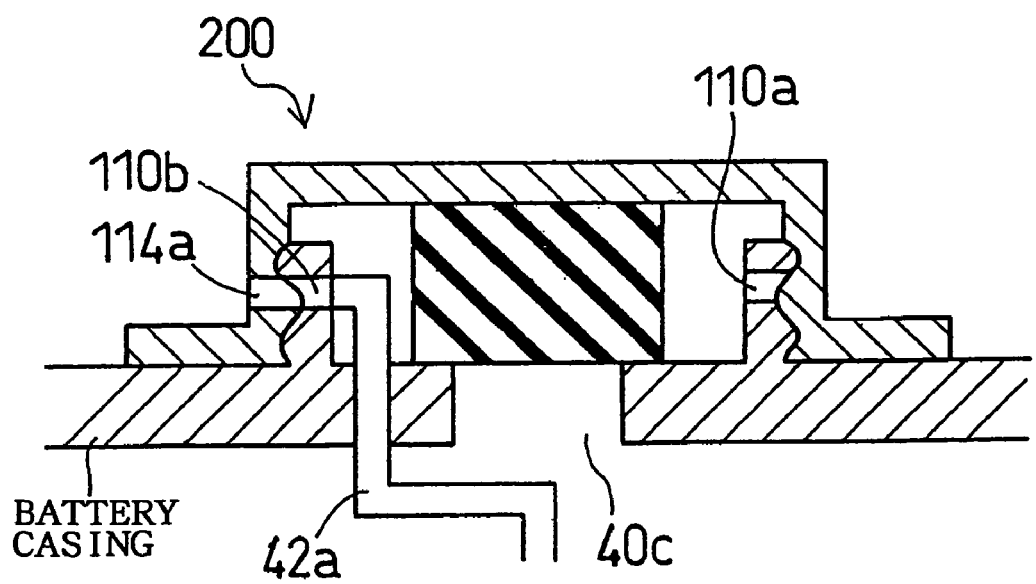
FIG. 29(b) is a view illustrating the state where an electrolyte or that containing a reducing agent is supplemented.

When the battery is used, as illustrated in FIG. 29(a), the gas outlet port 114a is previously interconnected with the gas outlet port 110a while the outlet port 110b of the base part 110 is closed with the cap 114. On the other hand, when an electrolyte is supplemented, as illustrated in FIG. 29(b), the cap 114 is turned to interconnect the gas outlet port 114a with the gas outlet prt 110b. Next, the inlet pipe 42a is connected to the gas outlet port 114a of the cap 114. With this arrangement, the gas inlet pipe can be connected to the battery casing without detaching the safety valve therefrom.

On the other hand, as illustrated in FIG. 27, the opening 40b adapted to introduce the electrolyte is immersed in a separately prepared electrolyte (vessel A). When a gas within the battery is sucked by the suction pump via the opening 40a, the electrolyte is sucked up via the opening 40b so that the battery is charged with the electrolyte.

When the suction pump is continuously operated with the battery charged with the electrolyte, the electrolyte is sucked out via the opening 40a. The electrolyte thus sucked is stored in a vessel (unnecessary liquid bottle) provided between the opening 40a and suction pump.

{In the Case of the Level of the Degradation of the Negative Electrode Being High}

When the level of the degradation of the negative electrode is high, an electrolyte containing a reducing agent was supplemented into the battery by the method and means illustrated in FIG. 27. An opening 40a of the battery can be provided using the safety valve 100 illustrated in FIG. 28 or the safety valve 200 illustrated in FIG. 29.

An electrolyte in which sodium hypophosphite was dissolved with a predetermined concentration (reducing agent-containing electrolyte) was separately prepared (vessel B), and an inlet 10b of the battery was immersed in the reducing agent-containing electrolyte within the vessel B. Alternatively, the electrolyte within the vessel A may be replaced with the reducing agent-containing electrolyte, instead of preparing of the vessel B, or the reducing agent may be dissolved in the electrolyte within the vessel A.

Next, the reducing agent-containing electrolyte within the vessel B was supplemented into the battery by operating the suction pump, as disclosed above. After the negative electrode was reduced with the reducing agent-containing electrolyte sufficiently, the opening 40b of the battery was immersed in the electrolyte within the vessel A, and, as described above, the suction pump was operated to feed the electrolyte into the battery so that productions caused by the reduction were washed out. Then, the interior of the battery was charged with an electrolyte.

[Condition Judging Method Disclosed in One of the Forty-Eighth through Fiftieth Aspects, and Regenerating Method Disclosed in One of the Fifty-Second through Fifty-Fourth Aspects]

The present inventors have also studied the effects of the degradation of the negative electrode on the battery performance. As a result, they have found that when an oxide having an average thickness of 1000 nm is formed on an active material layer of the negative electrode, the battery capacity rapidly decreases and the internal resistance rapidly increases. One example of this finding is shown in FIG. 21.

Figure 21:
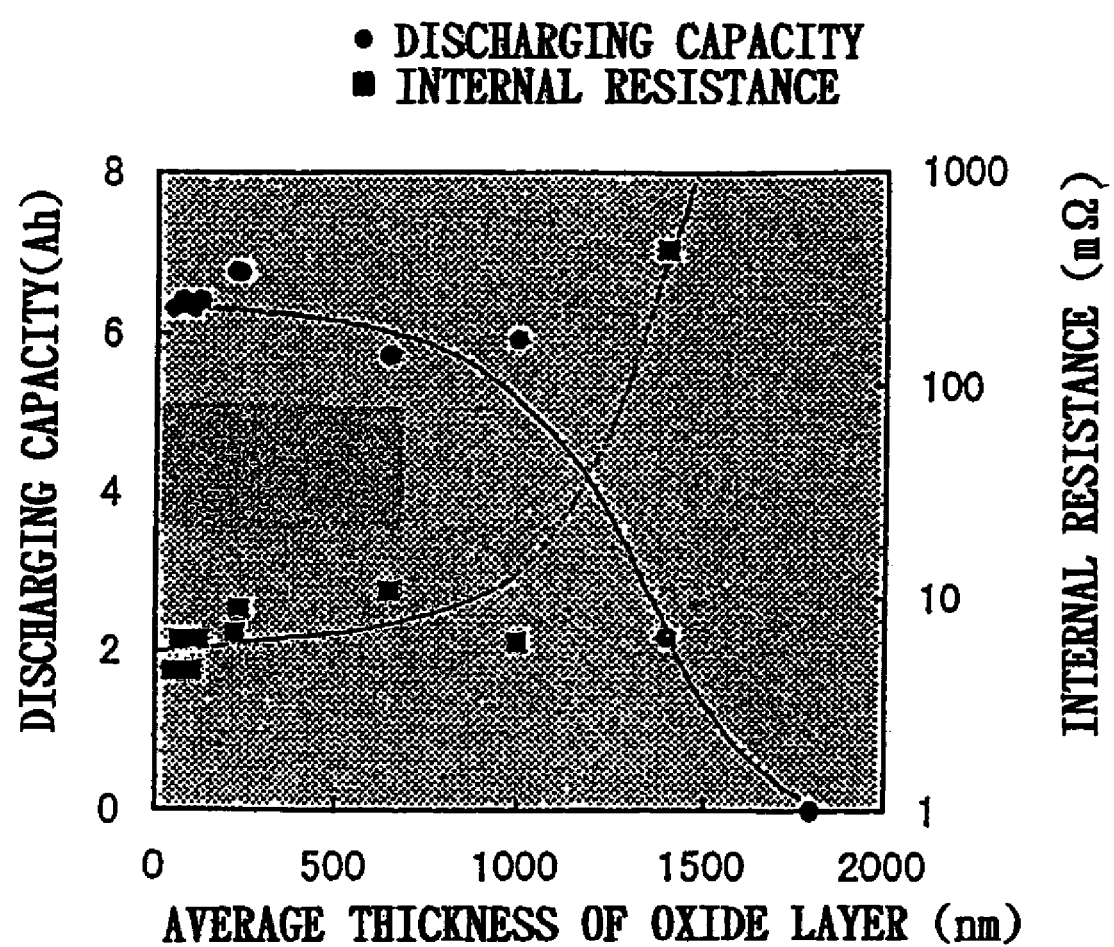
FIG. 21 is a graph showing the effect of the degradation of the negative electrode on the discharging capacity and internal resistance.

FIG. 21 shows the result of the measurement of the thickness of the oxide layer formed on the active material of the negative electrode of the nickel-hydrogen battery identical to that used in the regenerating method 1, which was subjected to the repetition of charging and discharging cycles under predetermined charging and discharging conditions, along with variations of the battery capacity and internal resistance with respect to the thickness of the oxide layer. The thickness of the oxide layer of the active material of the negative electrode was measured with the Auger electron spectroscopic method.

The battery capacity was measured by the following method. The battery was charged in an atmosphere of 25° C. with a current of ⅕C to the charging depth (SOC) of 110%, and discharged with a current of ⅕C to the voltage of 1V. These charging and discharging operations were repeated twice, and the battery capacity was measured. The time interval between the first and second operations was set to 30 minutes.

The internal resistance was measured by the following method. The charging and discharging operation of charging in an atmosphere of 25° C. with a current of ⅕C to the charging depth (SOC) of 60%, and discharging with a predetermined current was repeated four times by varying the discharging current, ⅓C, 1C, 3C and 6C. And, the current-voltage characteristic was measured in 10 seconds after each charging and discharging operation, and the inclination thereof was calculated to obtain the internal resistance. The time interval between one charging and discharging operation and another one was set to 10 minutes upon measuring the current-voltage properties, and the time interval in another case was 30 minutes.

FIG. 21 shows that when the average thickness of the oxide layer formed on the surface of the negative electrode active material is less than 1000 nm, the battery capacity and internal resistance do not greatly vary. On the other hand, when the average thickness thereof is 1000 nm or more, the battery capacity rapidly decreases and the internal resistance rapidly increases.

These results show that when the average thickness of the oxide layer which is formed on the surface of the negative electrode active material is less than 1000 nm, drying up of the electrolyte greatly affects on the battery performance to decrease it, as compared with the degradation of the negative electrode. On the other hand, when the average thickness of the oxide layer is 1000 nm or more, the degradation of the negative electrode greatly affects on the battery performance to decrease it, as compared with drying up of the electrolyte. Accordingly, when the average thickness of the oxide layer which is formed on the surface of the negative electrode active material is less than 1000 nm, the level of the degradation of the negative electrode is low, and when the average thickness of the oxide layer is 1000 nm or more, the level of the degradation of the negative electrode is high.

The above-described condition judging method of the secondary battery, and the regenerating method thereof have been contemplated based on these findings of the present inventors.

With the present invention, when the average thickness of the oxide layer which is formed on the surface of the active material of the negative electrode of the secondary battery of which the battery condition is to be judged is less than a predetermined standard value, the level of the degradation of the negative electrode is judged low, and when the average thickness of the oxide layer is greater than the predetermined standard value, the level of the degradation is judged high. The standard value depends on the kind of the secondary battery, or the like.

Accordingly, it is preferable to set the average thickness of the oxide layer, which was measured when the discharge capacity of the reference battery equivalent to the secondary battery rapidly decreased or the internal resistance thereof rapidly increased, as the standard value. In the nickel-hydrogen battery, for example, the standard value thereof is 1000 nm.

In the case of the present regenerating method being applied to the nickel-hydrogen battery, for example, the level of the degradation of the negative electrode is judged low when the average thickness of the oxide layer which is formed on the surface of the active material of the negative electrode is less than 1000 nm, and the level of the degradation thereof is judged high when the average thickness of the oxide layer is 1000 nm or more.

Furthermore, the indexes of the battery performance, such as the battery capacity and internal resistance, depend on the specification of the battery. Therefore, the index of the battery performance, which greatly varies with the elevation of the level of degradation of the negative electrode, depends on the specification of the battery. In accordance with the present invention, by measuring the average thickness of the oxide layer, regardless of the specification of the battery, the level of the degradation of the negative electrode can be accurately judged.

With the present regenerating method, the reducing agent is surely prevented from adding to the electrolyte when the level of the degradation is low, or only the electrolyte is surely prevented from being supplemented when the level of the degradation is high. Thus, the battery performance can be recovered effectively.

The method for measuring the average thickness of the oxide layer which is formed on the surface of the active material of the negative electrode is not limited specifically. It is preferable to measure it with the Auger electron spectroscopic method. With this method, the average thickness of the oxide layer can be measured with accuracy without damaging the negative electrode.

Where the average thickness of the oxide layer which is formed on the surface of the active material of the negative electrode is difficult to directly measure during using the battery, the indexes of the battery performance (values such as the battery capacity and internal resistance) have been previously measured when the average thickness of the oxide layer is 1000 nm with respect to the specification and using conditions of the battery. The level of the degradation of the negative electrode can be judged using the measured values as the standard values. When the specification and using conditions of the battery vary, the standard values thereof must be measured again.

[Regenerating Method Disclosed in the Fifty-Fifth Aspect]

In the case where the battery capacity does not greatly decrease, and the internal resistance does not greatly increase due to a predetermined number of the repetition of charging and discharging cycles under predetermined charging and discharging conditions, namely, in the case where the level of the degradation of the negative electrode is low, the performance of the battery of which the negative electrode has been detached for reducing, and assembled again thereafter, hardly varies from that of the battery of which the negative electrode has not been subjected to the reducing treatment. One example is shown in FIG. 25.

In this example, a nickel-hydrogen battery similar to that of the regenerating method 1 was prepared, and a predetermined number of charging and discharging cycles were performed under predetermined charging and discharging conditions. When the battery capacity slightly decreases and the internal resistance slightly increases, the negative electrode plate was taken from the battery, and subjected to the reducing treatment. In this example, the negative electrode was immersed in an electrolyte containing 0.2 mol/l of sodium hypophosphite at 60° C. for 2 hours, whereby the reducing treatment is performed. The negative electrode subjected to the reducing treatment was assembled in the battery, thereby preparing the battery again. The resulting battery was subjected to a predetermined number of charging and discharging cycles under predetermined charging and discharging conditions, and the variation of the charging and discharging efficiency was examined. The graph 1 shows the results thereof.

On the other hand, another nickel-hydrogen battery similar to that of the regenerating method 1 was prepared, and a predetermined number of charging and discharging cycles were performed under predetermined charging and discharging conditions, but the reducing treatment was not performed. After charging and discharging the resultant battery similarly to the battery subjected to the reducing treatment, the variation of the charging and discharging efficiency was examined. The graph 2 shows the results thereof.

Figure 25:
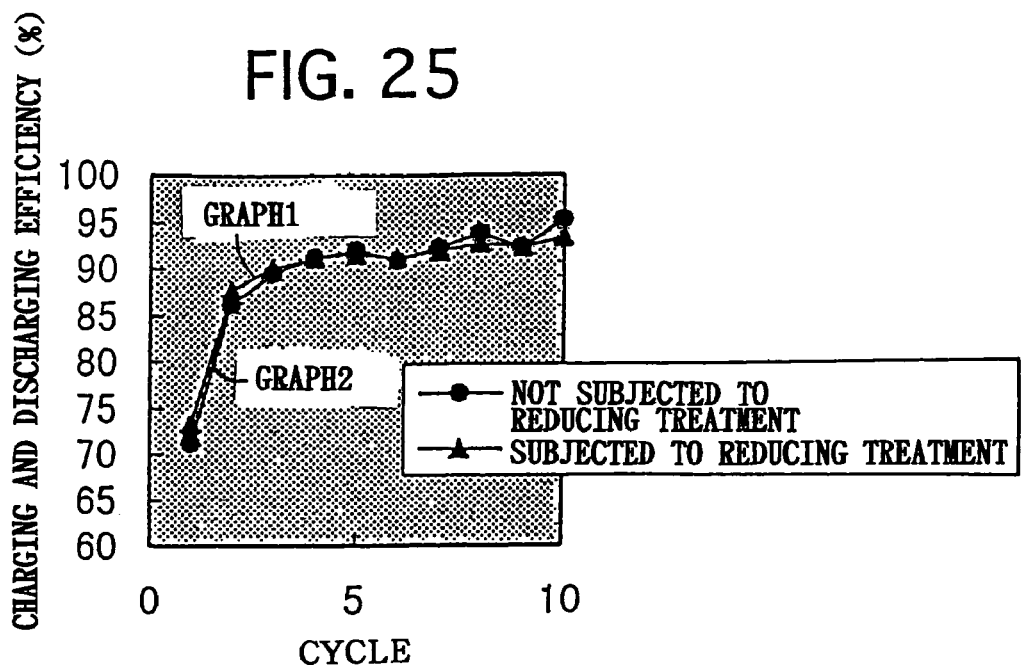
FIG. 25 is a graph showing the difference in recovering of the battery performance between the case where a negative electrode has been subjected to a reducing treatment and the case where a negative electrode has not been subjected to a reducing treatment when the level of the degradation of the negative electrode is low.

FIG. 25 shows that two graphs approximately agree to each other. This result shows that the reducing treatment of the negative electrode of which the battery capacity decreases slightly and the internal resistance increases slightly, does not affect the battery performance. Accordingly, in this case, by merely supplementing the electrolyte, the battery performance can be recovered.

On the other hand, when the level of the degradation of the negative electrode is high, the negative electrode is detached from the battery and is subjected to the reducing treatment so that the negative electrode can be reduced sufficiently without reducing the positive electrode. Consequently, the performance of the negative electrode can be recovered, whereby the battery performance is recovered.

The method for examining the level of the degradation of the negative electrode is not limited specifically.

It is preferable to measure the average thickness of the oxide layer which is formed on the surface of the active material of the negative electrode is measured, and judge the level of the degradation of the negative electrode to be low in the case of the average thickness being less than 1000 nm while judging it to be high in the case of the average thickness being 1000 nm or more.

The reducing treatment is not limited specifically. The negative electrode may be exposed to a gas containing a reducing agent, or a liquid containing a reducing agent. In the latter case, for example, the liquid containing the reducing agent may be sprayed or applied onto the negative electrode, or the negative electrode may be immersed in the liquid containing the reducing agent. The kind of the reducing agent is not limited specifically. The same reducing agent as that used in the nickel-hydrogen battery which is disclosed in the forty-first aspect can be used. When the negative electrode is exposed to the liquid containing the reducing agent, it is preferable to use the liquid prepared by dissolving the reducing agent in the electrolyte or a solvent thereof. With this arrangement, the negative electrode can be subjected to the reducing treatment in the condition identical to that where the negative electrode is accommodated in the battery casing.

[Regenerating Method 2]

In the present method, the nickel-hydrogen battery was regenerated as follows.

Three nickel-hydrogen batteries were prepared, similarly to the regenerating method 1, and each battery was subjected to the repetition of charging and discharging cycles under predetermined conditions, similarly to the regenerating method 1. Next, the electrode body taken from this wound type battery was cut into a proper size to prepare layered batteries for confirmation (batteries 2a, 2b and 2c). *Resultant batteries have an oxide layer of an average thickness of 1000 nm or more on the surface of the active material of the negative electrode which has been examined beforehand, and exhibit identical properties to one another.*

Next, an electrode body was taken from each of the batteries 2a and 2b. The electrode body taken from the battery 2a was dismantled to obtain a negative electrode plate. The negative electrode plate of the battery 2a and the electrode body of the battery 2b were respectively immersed in an electrolyte containing 0.2 mol/l of sodium hypophosphite at 60° C. for 2 hours for reducing treatment.

By using the negative electrode plate of the battery 2a, which has been subjected to the reducing treatment, the positive electrode plate and separator which have been dismantled, an electrode body similar to that prior to dismantling was formed. The resultant electrode body was accommodated in the battery casing of the battery 2a to prepare the battery 2a again (battery 2a'). And the electrode body of the battery 2b, which has been subjected to the reducing treatment was accommodated in the battery casing of the battery 2b to prepare the battery 2b again (battery 2b'). With respect to the battery 2c, the electrolyte was only supplemented.

The batteries 2a', 2b' and 2c were subjected to a predetermined number of charging and discharging cycles under predetermined charging and discharging conditions, and the charging and discharging efficiency of each battery was measured. The measurement results are shown in FIG. 20.

Figure 20:
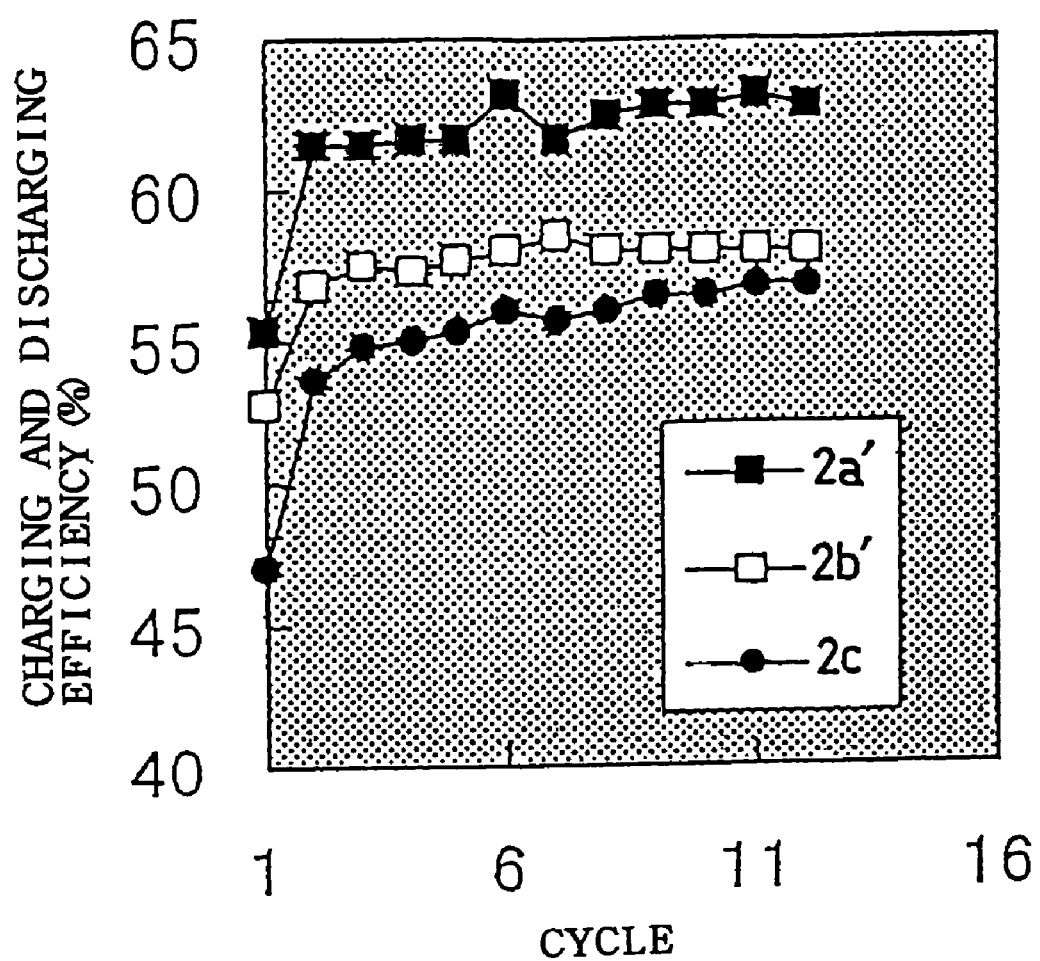
FIG. 20 is a graph showing recovering of the battery performance due to a reducing treatment of the regenerating method 2, in the battery of which only a negative electrode has been subjected to the reducing treatment, the battery of which both a positive electrode and negative electrode (electrode body) have been subjected to the reducing treatment, and the battery of which only an electrolyte has been supplemented.

FIG. 20 shows that the battery 2a' is most excellent in the charging and discharging efficiency, as compared with the batteries 2b' and 2c. This result shows that when the level of the degradation of the negative electrode is high, the battery performance can be recovered most effectively by taking the negative electrode from the battery and subjecting it to the reducing treatment.

Furthermore, the nickel-hydrogen battery similar to that of the regenerating method 1 was examined on the effect of the concentration of the reducing agent, treating temperature and treating time in the reducing treatment on the recovery of the battery performance. The level of the degradation of the negative electrode was judged based on the variation of the battery capacity and internal resistance.

{Effect of the Amount (Concentration) of the Reducing Agent on the Recovery of the Battery Performance}

Seven nickel-hydrogen batteries were prepared, and each battery was subjected to the repetition of charging and discharging cycles (384 cycles) under predetermined charging and discharging conditions. The negative electrode of each battery was oxidized to be degraded. This results in the battery capacity remarkably decreasing to 3.19 Ah and the internal resistance remarkably increasing to 21.4 mΩ. Thus, the level of the degradation of the negative electrode was elevated.

Next, an electrode body was taken from each battery, and dismantled to obtain a negative electrode plate. The negative electrode plate of each battery was immersed in an electrolyte containing a predetermined concentration of sodium hypophosphite at 60° C. for 2 hours for reducing treatment. The concentration of the reducing agent in the electrolyte for each negative electrode plate was varied as follows: 0 mol/l, 0.2 mol/l, 0.3 mol/l, 0.4 mol/l, 0.5 mol/l, 1.0 mol/l and 2.0 mol/l.

By using each negative electrode plate which has been subjected to the reducing treatment, the positive electrode plate and separator which have been dismantled, an electrode body similar to that prior to dismantling was formed.

The resultant electrode body was accommodated in the battery casing to prepare a battery again.

Figure 22:
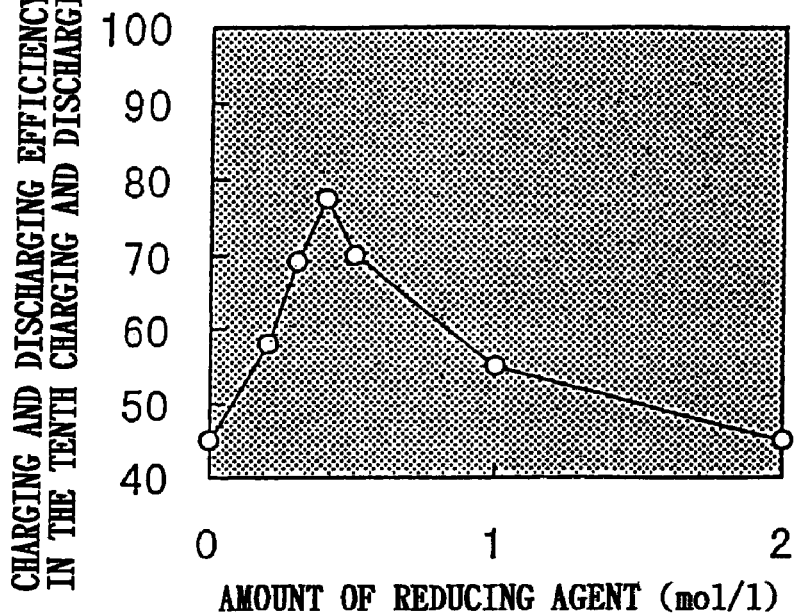
FIG. 22 is a graph showing the effect of the amount of a reducing agent on recovering of the battery performance in the reducing treatment of the regeneration method 2.

The resultant batteries were subjected to 10 times of charging and discharging cycles under predetermined charging and discharging conditions. The charging and discharging efficiency of each battery in the tenth charging and discharging cycle was shown in FIG. 22. This result shows that at the treating temperature of 60° C., the charging and discharging efficiency is the maximum and the battery performance is recovered most preferably when the concentration of the reducing agent is 0.4 mol/l.

{Effect of the Treating Temperature on the Recovery of the Battery Performance}

Nine nickel-hydrogen batteries were prepared, and each battery was similarly subjected to the repetition of charging and discharging cycles (362 cycles) under predetermined charging and discharging conditions. The negative electrode of each battery was oxidized to be degraded. This results in the battery capacity remarkably decreasing to 2.46 Ah and the internal resistance remarkably increasing to 60.5 mΩ. Thus, the level of the degradation of the negative electrode was elevated.

Next, an electrode body was taken from each battery, and dismantled to obtain a negative electrode plate.

Three negative electrode plates were immersed in an electrolyte containing 0.2 mol/l of sodium hypophosphite at predetermined treating temperatures for 2 hours for reducing treatment. The treating temperature for each negative electrode plate was varied as follows: 40° C., 60° C. and 80° C.

The remaining three negative electrode plates were immersed in an electrolyte containing 0.6 mol/l of sodium hypophosphite at predetermined treating temperatures for 2 hours for reducing treatment. The treating temperature for each negative electrode plate was varied as follows: 40° C., 60° C. and 80° C.

By using each negative electrode plate which has been subjected to the reducing treatment, the positive electrode plate and separator which have been dismantled, an electrode body similar to that prior to dismantling was formed.

The resultant electrode body was accommodated in the battery casing to prepare a battery again.

Figure 23:
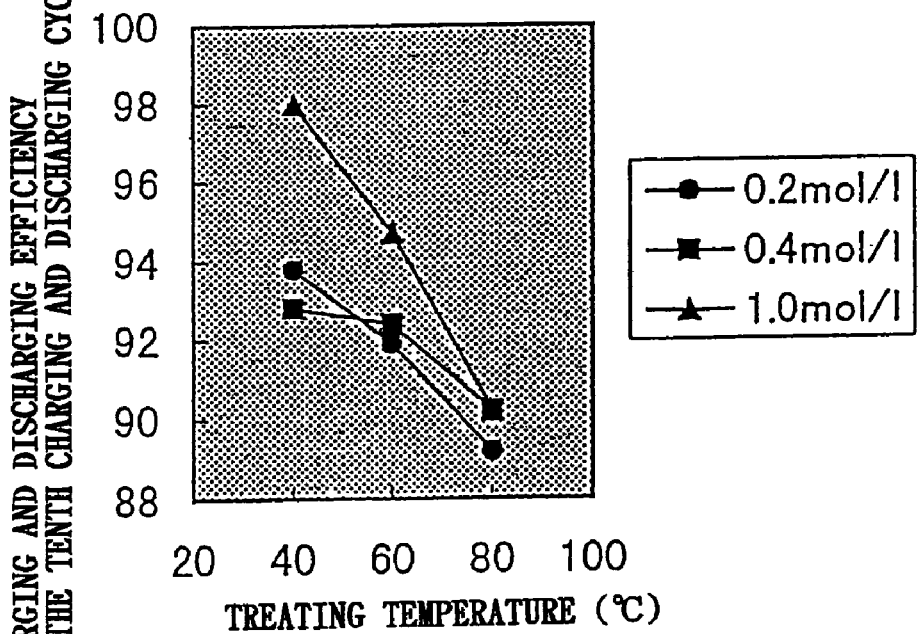
FIG. 23 is a graph showing the effect of the treating temperature on recovering of the battery performance in the reducing treatment of the regeneration method 2.

The resultant batteries were subjected to 10 times of charging and discharging cycles under predetermined charging and discharging conditions. The charging and discharging efficiency of each battery in the tenth charging and discharging cycle was shown in FIG. 23. This result shows that the charging and discharging efficiency with a concentration of reducing agent of 0.2 to 0.6 mol/l is the maximum and the battery performance is recovered most preferably when the treating temperature is 40° C.

{Effect of the Treating Time on the Recovery of the Battery Performance}

Five nickel-hydrogen batteries were prepared, and each battery was similarly subjected to the repetition of charging and discharging cycles (379 cycles) under predetermined charging and discharging conditions. The negative electrode of each battery was oxidized to be degraded. This results in the battery capacity remarkably decreasing to 2.42 Ah and the internal resistance remarkably increasing. Thus, the level of the degradation of the negative electrode was elevated.

Next, an electrode body was taken from each battery, and dismantled to obtain a negative electrode plate. The resultant negative electrode plates were immersed in an electrolyte containing 0.4 mol/l of sodium hypophosphite at 60° C. for a predetermined treating time for reducing treatment. The treating time for each negative electrode plate was varied as follows: 0.5 hour, 1.0 hour, 2.0 hour and 3.0 hour.

By using each negative electrode plate which has been subjected to the reducing treatment, the positive electrode plate and separator which have been dismantled, an electrode body similar to that prior to dismantling was formed.

The resultant electrode body was accommodated in the battery casing to prepare a battery again.

Figure 24:
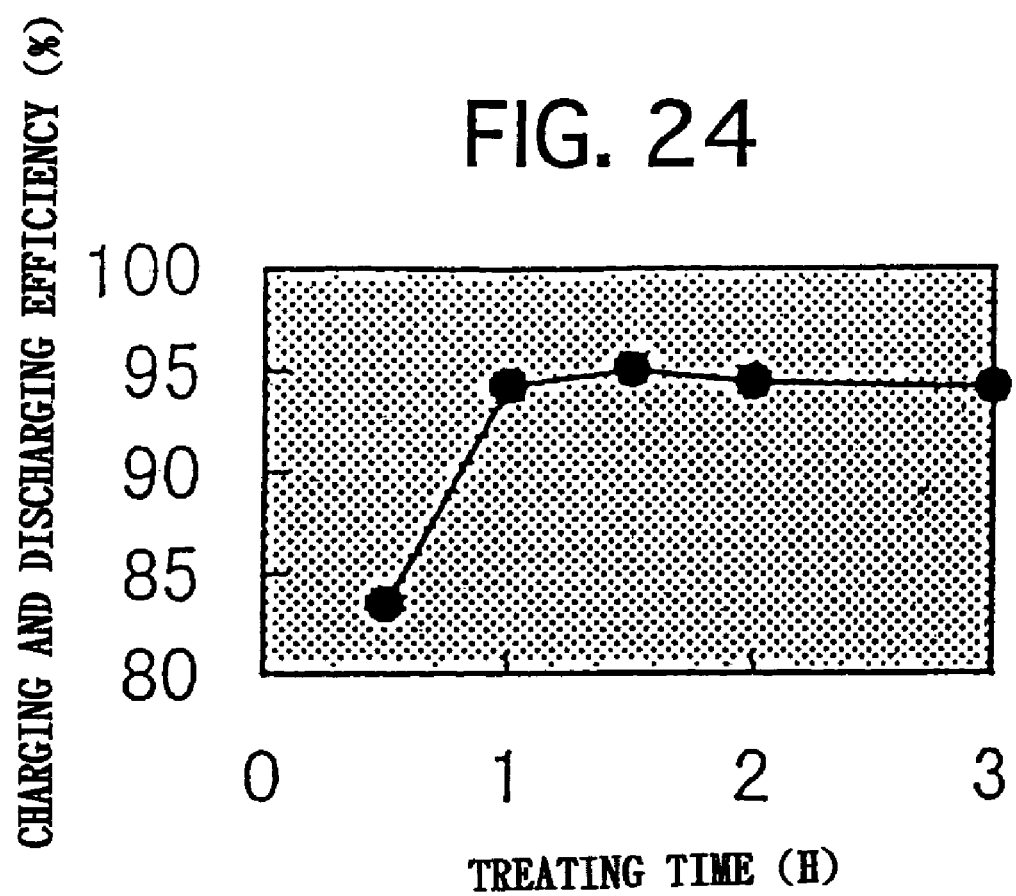
FIG. 24 is a graph showing the effect of the treating time on recovering of the battery performance in the reducing treatment of the regeneration method 2.

The resultant batteries were subjected to 10 times of charging and discharging cycles under predetermined charging and discharging conditions. The charging and discharging efficiency of each battery in the tenth charging and discharging cycle was shown in FIG. 24. This result shows that in the reducing treatment with a concentration of reducing agent of 0.4 mol/l and at a treating temperature of 60° C., the charging and discharging efficiency becomes especially high and the battery performance is recovered especially when the treating time is 60 minutes or more.

[Regenerating Method Disclosed in the Fifty-Sixth Aspect]

In the nickel-hydrogen battery, the negative electrode which is prepared by applying a powdery active material of the negative electrode to the surface of a collector with a bonding agent or the like is frequently used. When the negative electrode of such battery is oxidized to be degraded, not only the active material of the negative electrode but also the collector and bonding agent may be degraded.

And, the degraded negative electrode is in an activated condition so that when the active material is separated from the negative electrode in the air, the active material may react on oxygen in the air to be further degraded.

In accordance with the present aspect, first, the active material is mechanically separated from the degraded negative electrode in a liquid having nonoxidizing properties. So, the surface of the active material of the negative electrode is prevented from being further degraded, as compared with that at the time the negative electrode is taken from the battery. The active material thus separated can be effectively reduced to enable decreasing of the amount of the reducing agent along with the treating time thereof. If the decreased costs with this reducing treatment are greater than the costs required to form a negative electrode again using the reduced active material, the nickel-hydrogen battery can be regenerated at low costs.

With the regenerating method in accordance with the present aspect, the secondary battery can be regenerated at lower costs, as compared with the method disclosed in the fifty-fifth aspect.

The kind of the secondary battery to which the present aspect is applicable is not limited specifically. The present aspect can be applied to a nickel-hydrogen battery, for example, and especially a nickel-hydrogen battery provided with a negative electrode of which the active material is a hydrogen-occluding alloy, and an electrolyte which is interposed between the positive electrode and negative electrode (fifty-seventh aspect). The nickel-hydrogen battery provided with a negative electrode which is prepared by applying a powdery active material to a surface of a collector with a bonding agent or the like is most suitable.

The kind of the liquid having nonoxidizing properties is not limited specifically. Water, electrolyte, solvent of the electrolyte, for example, can be used. Especially, it is preferable to mechanically separate the active material in the liquid having reducing properties. With this method, the degraded negative electrode can be reduced during separating the active material therefrom, and consequently, the active material can be reduced. As a result, the active material can be reduced more sufficiently in addition to the succeeding reducing treatment.

The method for separating the active material from the negative electrode is not limited specifically. For example, the active material can be scraped from the negative electrode with a scraper to be separated from the negative electrode.

The method for reducing the active material thus separated is not limited specifically. The treating method similar to that used in the reducing treatment disclosed in the regenerating method of the fifty-fifth aspect can be used.

The active material thus reduced can be used again. Before using it again, it is preferable to make the powder diameter equal to one another again.

[Regenerating Method 3]

In the present method, the nickel-hydrogen battery was regenerated as follows.

Three nickel-hydrogen batteries were prepared, similarly to the regenerating method 1, and each battery was subjected to the repetition of charging and discharging cycles under predetermined conditions, similarly to the regenerating method 1. Next, the electrode body was oxidized to be degraded. As a result, the battery capacity remarkably decreases and the internal resistance remarkably increases so that the level of the degradation of the negative electrode was elevated. Then, by using these batteries, layered batteries (battery $3a$, battery $3b$ and battery $3c$) were prepared for confirming operational advantages thereof.

Next, an electrode body is taken from each of the battery $3a$ and battery $3b$, and dismantled to obtain a negative electrode. The negative electrode obtained by dismantling the battery $3a$ was immersed in water, and an active material was scraped from the negative electrode with a scraper. The negative electrode obtained by dismantling the battery $3b$ was immersed in a reducing water having reducing properties, and an active material was scraped from the negative electrode with a scraper.

The scraped active material was dried, and pulverized in a mortar. Then the pulverized active material was sifted to make the diameter thereof equal to one another. The active material thus mechanically separated was immersed in an electrolyte containing sodium hypophosphite as a reducing agent at 60° C. for 2 hours for reducing treatment. Then, the active material was filtered, dried, and sifted again to make the diameter thereof equal to one another so as to become 75 μm or less.

By using the active material which has been subjected to the reducing treatment and of which the diameter has been made equal, and newly prepared collector and boding agent, a negative electrode plate similar to that prior to separating was formed. By using the negative electrode plate thus formed, positive electrode plate and separator which have been dismantled, an electrode body similar to that prior to dismantling was formed. The resultant electrode body was accommodated in the battery casing to prepare the batteries $3a'$ and $3b'$ again.

Figure 26:
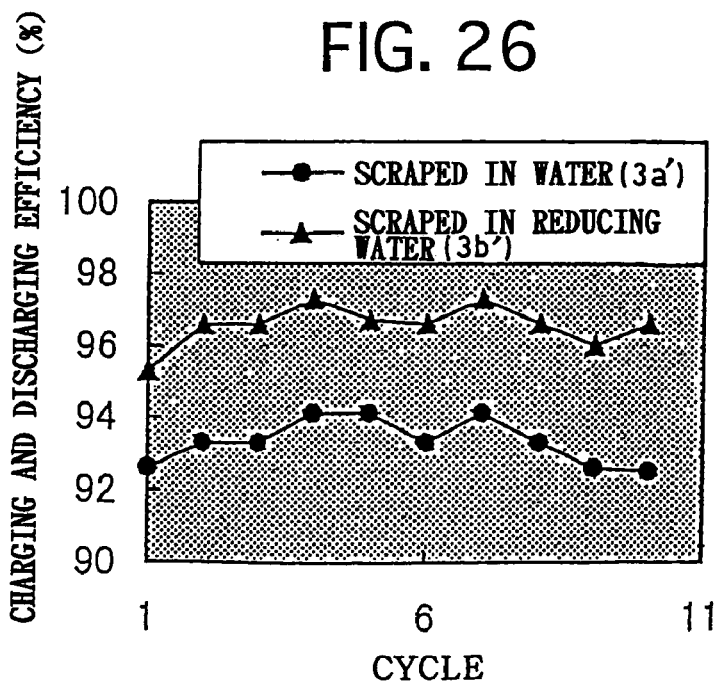
FIG. 26 is a graph showing the difference in recovering of the battery performance between the case where a negative electrode active material is mechanically separated from a negative electrode in a reducing liquid and the case where a negative electrode active material is mechanically separated from a negative electrode in water.

The resultant batteries $3a'$ and $3b'$ were subjected to the repetition of charging and discharging cycles with 25 mA, and the charging and discharging efficiency of each battery in a predetermined number of the charging and discharging cycle was measured. The measurement result is shown in FIG. 26. FIG. 26 shows that the charging and discharging efficiency of the battery $3b'$ is excellent, as compared with that of the battery $3a'$. This result shows that the active material can be reduced more sufficiently by mechanically separating the active material from the negative electrode in the liquid having reducing properties.

[Regenerating Method Disclosed in the Fifty-Eighth Aspect]

As described above, the battery condition can be judged in detail with the condition judging method disclosed in each of the thirty-first through fiftieth aspects. With the present method, the level of the degradation of the negative electrode was judged in detail. The level of the degradation of the negative electrode has a close relation with the second resistance component out of the first resistance component, second resistance component and resistance component ratio. So, it is preferable to judge the level of the degradation of the negative electrode based on at least the second resistance component. With this method, the level of the degradation of the negative electrode can be judged in detail.

After judging the level of the degradation of the negative electrode in detail, a proper regenerating method can be applied so that the secondary battery can be regenerated effectively. This results in the regenerating time of the secondary battery, for example, becoming short, and consequently the regenerating costs can be reduced.

The kind of the secondary battery to which the present aspect is applicable is not limited specifically. The present aspect can be applied to a nickel-hydrogen battery, for example, and especially a nickel-hydrogen battery provided with a negative electrode of which the active material is a hydrogen-occluding alloy, and an electrolyte which is interposed between the positive electrode and negative electrode, With the present regenerating method, when the battery performance of the nickel-hydrogen battery decreases, it can be recovered with ease.

The supplement of the electrolyte or the addition of the reducing agent to the electrolyte can be performed, similarly to the regenerating method disclosed in the fifty-first aspect.

[Regenerating Method Disclosed in One of the Fifty-Ninth through Sixty-First Aspects]

As described above, the degradation mode of the degraded secondary battery can be judged in detail with the condition judging method disclosed in the thirty-seventh aspect or fortieth aspect. When the secondary battery is judged to be in a degraded condition with the condition judging method disclosed in one of the thirty-first through fiftieth aspects, the degradation mode is judged in detail with the condition judging method disclosed in at least one of the thirty-seventh and fortieth aspects.

After judging the degradation mode of the secondary battery in detail, a proper regenerating method can be applied so that the secondary battery can be regenerated effectively. This results in the regenerating time of the secondary battery, for example, becoming short, and consequently the regenerating costs can be decreased.

The kind of the secondary battery to which the present aspect is applicable is not limited specifically. The present aspect can be applied to a nickel-hydrogen battery, for example, and especially a nickel-hydrogen battery provided with a negative electrode of which the active material is a hydrogen-occluding alloy, and an electrolyte which is interposed between the positive electrode and negative electrode, With the present regenerating method, when the battery performance of the nickel-hydrogen battery decreases, it can be recovered with ease.

With the fifty-ninth aspect, the supplement of the electrolyte and the addition of the reducing agent to the electrolyte can be performed, similarly to the fifty-first aspect.

With the sixtieth aspect, the supplement of the electrolyte or the reducing treatment after taking the negative electrode from the battery casing can be performed, similarly to the forty-fifth aspect.

With the sixty-first aspect, mechanically separating of the active material from the negative electrode in the liquid having nonoxidizing properties and reducing of the active material can be performed, similarly to the forty-sixth aspect.

Hereinafter, the condition judging method and regenerating method of the present aspect will be explained with reference to several embodiments.

EMBODIMENT

New nickel-hydrogen batteries (95 Ah layered type) were prepared as secondary batteries. These nickel-hydrogen battery were actually mounted on an electric vehicle, or simulated to be mounted thereon, and used under various environments. The battery condition of each secondary battery thus used was judged, and the regeneration thereof was performed. The results of the judgement and regeneration are as follows.

The secondary batteries were subjected to the charging and discharging test under the conditions of Embodiments 1 through 6 shown in TABLE 1, and the internal resistance thereof was obtained by the DC-IR method.

TABLE 1

| | Charging and discharging condition | Temperature (° C.) | Internal resistance |
|---|---|---|---|
| Embodiment 1 | just after activation | normal | 0.815 |
| Embodiment 2 | after 1000 cycles of 1/3C charging and discharging | normal | 1.103 |
| Embodiment 3 | after 1000 cycles of 120% excess charging and 1/3C discharging | normal | 1.664 |
| Embodiment 4 | monunted on vehicle and degraded (used for commutation) | normal | 1.859 |
| Embodiment 5 | after 1500 cycles of 1/3C charging and discharging | normal | 2.428 |
| Embodiment 6 | after 1000 cycles of 1C charging and discharging | 50 | 1.753 |

As a result of the charging and discharging test, it has been clarified that the secondary battery of which the internal resistance increased to 1.2 mω or more was degraded. These results show that the secondary batteries subjected to the charging and discharging test in Embodiments 3 through 6 were in a degraded condition.

When the degraded condition is divided into a first degraded condition which is mainly caused by the increase of the ion conduction resistance, a second degraded condition which is mainly caused by the increase of both the ion conduction resistance and reaction resistance, and a third degraded condition which is mainly caused by the excess increase of the reaction resistance, the secondary battery subjected to the charging and discharging test in Embodiment 3 was in the third degraded condition, the secondary batteries subjected to the charging and discharging test in Embodiments 4 and 5 were in the second degraded condition, and the secondary battery subjected to the charging and discharging test in Embodiment 6 was in the first degraded condition.

{Judgement with the Current Interrupter Method}

Next, after finishing the charging and discharging test of the secondary batteries in Embodiments 1 through 6, the internal resistance thereof was divided into a first resistance component $(r_{1A})$ and second resistance component $(r_{2A})$ with the current interrupter method, and each resistance component was measured. With this measurement, the variation of the internal resistance upon charging was measured. Accordingly, the above-described $R_1$ corresponds to the first resistance component $r_{1A}$ and the above-described $R_2$ corresponds to the second resistance component $r_{2A}$. With this measurement, $R_1$ and $R_2$ ($r_{1A}$ and $r_{2A}$) were measured four times. The average value of the measured values obtained with these four measurements is shown in TABLE 2.

TABLE 2

| | $r_{1A}$ (mΩ) | $r_{2A}$ (mΩ) | $r_{1A} + r_{2A}$ (mΩ) | $θ_A$ (deg) | Degradation Mode |
|---|---|---|---|---|---|
| Embodiment 1 | 0.331 | 0.348 | 0.679 | 46.4 | no degradation |
| Embodiment 2 | 0.644 | 0.545 | 1.189 | 40.3 | no degradation |
| Embodiment 3 | 0.426 | 1.267 | 1.693 | 71.4 | 3 |
| Embodiment 4 | 1.076 | 0.852 | 1.928 | 38.4 | 2 |
| Embodiment 5 | 1.214 | 1.259 | 2.472 | 46.0 | 2 |
| Embodiment 6 | 1.422 | 0.341 | 1.764 | 13.5 | 1 |

On the other hand, it has been also clarified that upon dividing the internal resistance of a reference battery of the same kind of the secondary battery into a first resistance component $(r_{1A}')$ and second resistance component $(r_{2A}')$, and measuring each resistance component, in the case of the sum of the first resistance component and second resistance component $(r_{1A}'+r_{2A}')$ being less than 1.2 mΩ, the reference battery is in a normal condition, and in the case of the sum of the first resistance component and second resistance component $(r_{1A}'+r_{2A}')$ being 1.2 mΩ or more, the reference battery is in a degraded condition. Namely, it has been clarified that in the reference battery, the degradation judging standard value between the normal condition and degraded condition with respect to the sum of the first resistance component and second resistance component $(r_{1A}'+r_{2A}')$ is 1.2 mΩ.

And the angle calculated by arctan $(r_{2A}'/r_{1A}')$ $(=θ_A')$ was obtained from the degraded reference battery. As a result, it has been clarified that when the condition of $0<θ_A'<π/12$ (15°) is satisfied, the reference battery is in the first degraded condition, when the condition of $π/12<θ_A'<π/3(60°)$ is satisfied, the reference battery is in the second degraded condition, and when the condition of $π/3<θ_A'<π/2$ is satisfied, the reference battery is in the third degraded condition. Accordingly, it has been clarified that a first border value between the first degraded condition and second degraded condition in the angle $θ_A'$ of the reference battery is $π/12$, and a second border value between the second degraded condition and third degraded condition in the angle $θ_A'$ of the reference battery is $π/3$.

Upon judging the battery condition of the secondary battery by comparing with the previously examined relation between the measured values of the first resistance component $r_{1A}'$, second resistance component $r_{2A}'$, and angle $θ_A'$, and the battery condition of the reference battery, the following has been clarified.

At first, upon comparing the sum of the first resistance component and second resistance component $(r_{1A}+r_{2A})$ with the previously obtained relation of the reference battery, it has been clarified that the secondary batteries subjected to the charging and discharging tests of Embodiments 1 and 2 are in a normal condition, and the secondary batteries subjected to the charging and discharging tests of Embodiments 3 to 6 are in a degraded condition. These judging results respectively agree to those judged with the DC-IR method.

Next, the angle $θ_A$ of each of the secondary batteries which had been judged to be in a degraded condition was compared with the previously obtained relation of the reference battery. As a result, the secondary battery subjected to the charging and discharging test of Embodiment 3 was judged to be in the third degraded condition. And the secondary battery subjected to the charging and discharging test of Embodiment 3 was judged to be in the third degraded condition, the secondary batteries subjected to the charging and discharging tests of Embodiments 4 and 5 were judged to be in the second degraded condition, and the secondary batteries subjected to the charging and discharging tests of Embodiment 6 was judged to be in the first degraded condition. These judging results respectively agree to those judged with the DC-IR method.

The internal resistance co-ordinate $R_A'$ which indicates the co-ordinate of the internal resistance of the reference battery was plotted on a plane co-ordinate of which X axis and Y axis intersect perpendicularly with the first resistance component $r_{1A}'$ obtained in the reference battery as the X component and the second resistance component $r_{2A}'$ obtained in the reference battery as the Y component, and the relation between the internal resistance co-ordinate R' and the battery condition was investigated.

As a result, as shown in FIG. 1, it has been clarified that when the internal resistance co-ordinate $R_A'$ is in the region lower than the straight line L (region defined by the X axis, Y axis and straight line L), the reference battery is in a normal condition, and the internal resistance co-ordinate $R_A'$ is in the region higher than the straight line L, the reference battery is in a degraded condition.

Furthermore, the relation between the internal resistance co-ordinate $R_A'$ and degradation mode was investigated, and the first degradation region wherein the secondary battery is in the first degraded condition, the second degradation region wherein the secondary battery is in the second degraded condition and the third degradation region wherein the secondary battery is in the third degraded condition were respectively investigated. As a result, it has been clarified that the border line between the first degradation region and second degradation region is defined by the straight line M of the proportional function, which has an inclination of the above-described first border value ($\pi/12$), and the border line between the second degradation region and third degradation region is defined by the straight line N of the proportional function, which has an inclination of the above-described second border value ($\pi/3$).

Upon investigating the relation between the internal resistance co-ordinate of the reference battery and battery condition thereof beforehand, as shown in FIG. 1, a map wherein the normal region and degradation region are separated from each other, and the degradation region is divided to the first degradation region, second degradation region and third degradation region was obtained on the plane co-ordinate.

Figure 32:
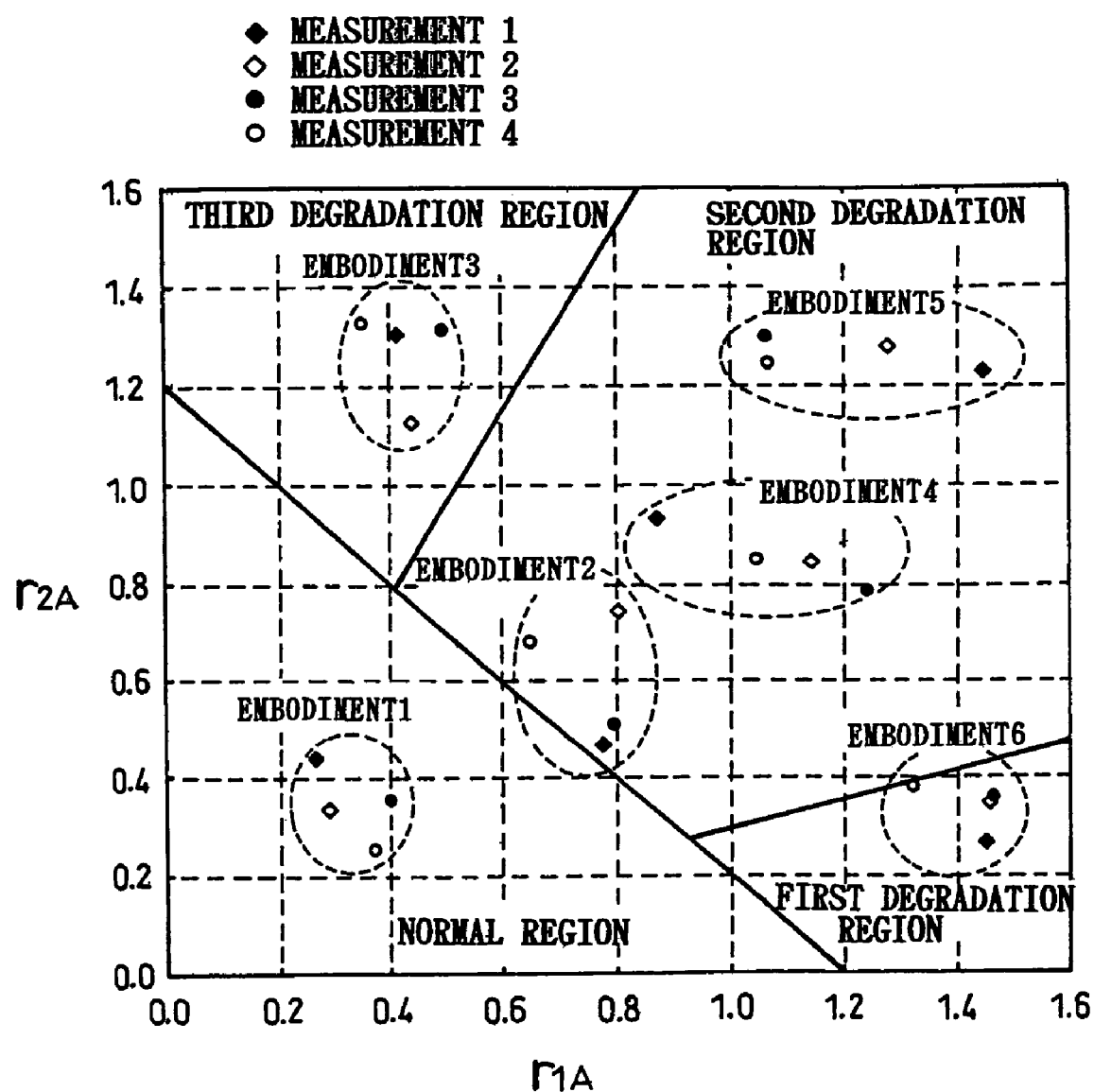
FIG. 32 is a view obtained by plotting a first resistance component and second resistance component which are measured by a current interrupter method in embodiments on the map of FIG. 1.

As described above, the results of plotting the internal resistance co-ordinates ($r_{1A}$, $r_{2A}$) of the secondary batteries subjected to the charging and discharging tests of Embodiments 1 through 6 were shown in FIG. 32.

FIG. 32 shows that the battery condition of each of the secondary batteries can be judged at a glance, and consequently, the judgement of the battery condition can be performed with ease.

{Judgement using the AC Impedance Method}

Next, a first resistance component ($r_{1B}$), second resistance component ($r_{2B}$) and angle ($\theta_B$) of each of the secondary batteries subjected to the charging and discharging tests of Embodiments 1 through 6 were obtained using the AC impedance method. In this measurement, as described above, the AC impedance component Zac and DC imped-ance component Zdc were measured. These impedance components were used as the first resistance component $r_{1B}$ and second resistance component $r_{2B}$. The measurement of the AC impedance component was performed four times. The average value of the measured values are shown in TABLE 3.

TABLE 3

|  | $r_{1B}$ (mΩ) | $r_{2B}$ (mΩ) | $r_{1B} + r_{2B}$ (mΩ) | $\theta_B$ (deg) | Degradation Mode |
|---|---|---|---|---|---|
| Embodiment 1 | 0.413 | 0.394 | 0.807 | 43.7 | no degradation |
| Embodiment 2 | 0.618 | 0.564 | 1.181 | 42.4 | no degradation |
| Embodiment 3 | 0.358 | 1.292 | 1.650 | 74.5 | 3 |
| Embodiment 4 | 1.058 | 0.852 | 1.910 | 38.8 | 2 |
| Embodiment 5 | 1.266 | 1.083 | 2.349 | 40.6 | 2 |
| Embodiment 6 | 1.347 | 0.364 | 1.712 | 15.1 | 1 |

On the other hand, the internal resistance of a reference battery of the same kind as that of the secondary battery was divided into a first resistance component ($r_{1B}'$), and second resistance component ($r_{2B}'$), and they were respectively measured. It has been clarified that when the sum of the first resistance component and second resistance component ($r_{1B}'+r_{2B}'$) is less than 1.2 mΩ, the reference battery is in a normal condition, and when the sum of the first resistance component and second resistance component ($r_{1B}'+r_{2B}'$) is 1.2 mΩ or more, the reference battery is in a degraded condition. Namely, it has been also clarified by the AC impedance method that the degradation judging standard value of the reference battery is 1.2 mΩ.

And the angle calculated by arctan (second resistance component/first resistance component) ($=\theta_B'$) was obtained in the degraded reference battery. As a result, it has been clarified that when the condition of $0<\theta_B'<\pi/12$ is satisfied, the reference battery is in the first degraded condition, when the condition of $\pi/12<\theta_B'<\pi/3$ is satisfied, the reference battery is in the second degraded condition, and when the condition of $\pi/3<\theta_B'<\pi/2$, the reference battery is in the third degraded condition. Consequently, it has been clarified that the first border value of the angle $\theta_B'$ of the reference battery between the first degraded condition and second degraded condition is $\pi/12$, and the second border value of the angle $\theta_B'$ of the reference battery between the second degraded condition and third degraded condition is $\pi/3$.

Upon comparing the battery condition of the secondary battery with the thus investigated relation between the measured values of the first resistance component $r_{1B}'$, second resistance component $r_{2B}'$ and angle, and the battery condition, and judging the battery condition of the secondary battery, the resultant judging results were similar to those obtained using the current interrupter method.

With this AC impedance method, the map indicating the normal region and degradation region in the relation between the internal resistance co-ordinate ($r_{1B}'$, $r_{2B}'$) of the reference battery and the battery condition can be obtained, as shown in FIG. 1, similarly to the current interrupter method.

Figure 33:
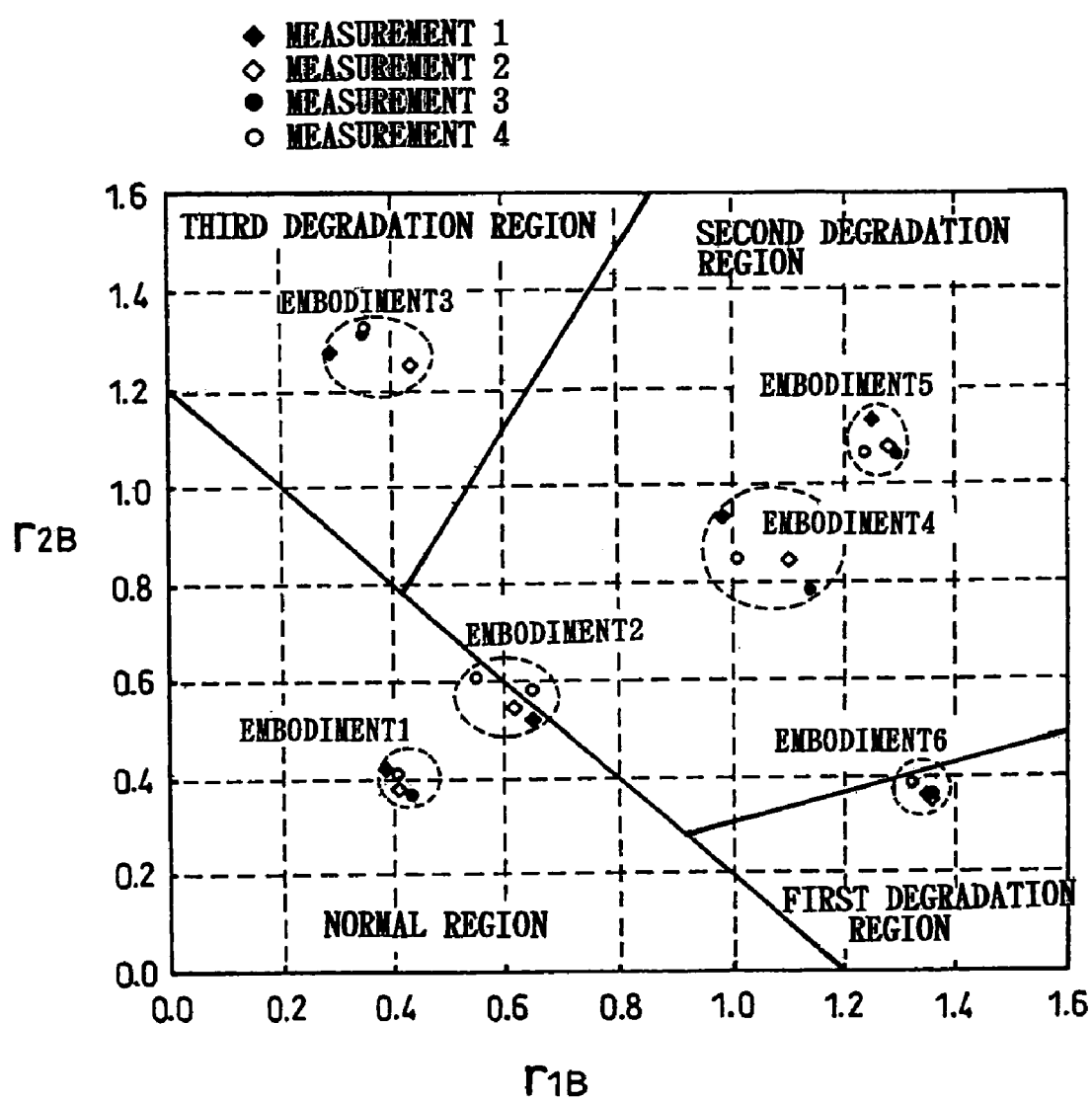
FIG. 33 is a view obtained by plotting a first resistance component and second resistance component which are measured by an AC impedance method in embodiments on the map of FIG. 1.

As described above, the results of plotting the internal resistance co-ordinates ($r_{1B}$, $r_{2B}$) of the secondary batteries subjected to the charging and discharging tests of Embodiments 1 through 6 were shown in FIG. 33.

FIG. 33 shows that the battery condition of each of the secondary batteries can be judged at a glance, and consequently, the judgement of the battery condition can be performed with ease. And it has been clarified from FIGS. 32 and 33 that the measured values obtained with the AC impedance method do not greatly scatter and the measurement accuracy thereof is very high, as compared with those obtained with the current interrupter method.

{Regenerating Treatment}

Furthermore, the above-described secondary batteries subjected to the charging and discharging tests of Embodiments 1 through 6 were subjected to two kinds of regenerating treatments of supplementing an electrolyte, and supplementing an electrolyte to which a reducing agent was added. The electrolyte wherein 0.4 mol/l of sodium hypophosphite is dissolved in water was used as the reducing agent.

The variations of the first resistance component, second resistance component and internal resistance of the secondary battery due to the two kinds of the regenerating treatments are shown in TABLE 4. In TABLE 4, the first resistance component and second resistance component obtained with the AC impedance method were indicated.

TABLE 4

|  |  | just after test | after supplement of electrolyte | after supplement of electrolyte containing reducing agent |
|---|---|---|---|---|
| Embodiment 1 | $r_{1B}$ | 0.413 | 0.405 | 0.407 |
|  | $r_{2B}$ | 0.394 | 0.380 | 0.352 |
|  | $r_{1B} + r_{2B}$ | 0.807 | 0.785 | 0.759 |
|  | Internal resistance | 0.815 | 0.803 | 0.785 |
| Embodiment 2 | $r_{1B}$ | 0.618 | 0.501 | 0.524 |
|  | $r_{2B}$ | 0.564 | 0.551 | 0.530 |
|  | $r_{1B} + r_{2B}$ | 1.181 | 1.052 | 1.054 |
|  | Internal resistance | 1.103 | 1.002 | 0.985 |
| Embodiment 3 | $r_{1B}$ | 0.358 | 0.351 | 0.355 |
|  | $r_{2B}$ | 1.292 | 1.285 | 0.923 |
|  | $r_{1B} + r_{2B}$ | 1.650 | 1.636 | 1.278 |
|  | Internal resistance | 1.664 | 1.629 | 1.312 |
| Embodiment 4 | $r_{1B}$ | 1.058 | 0.573 | 0.582 |
|  | $r_{2B}$ | 0.852 | 0.848 | 0.493 |
|  | $r_{1B} + r_{2B}$ | 1.910 | 1.421 | 1.075 |
|  | Internal resistance | 1.859 | 1.453 | 1.064 |
| Embodiment 5 | $r_{1B}$ | 1.266 | 0.568 | 0.570 |
|  | $r_{2B}$ | 1.083 | 1.068 | 0.510 |
|  | $r_{1B} + r_{2B}$ | 2.349 | 1.636 | 1.080 |
|  | Internal resistance | 2.428 | 1.743 | 1.092 |
| Embodiment 6 | $r_{1B}$ | 1.347 | 0.605 | 0.624 |
|  | $r_{2B}$ | 0.364 | 0.352 | 0.355 |
|  | $r_{1B} + r_{2B}$ | 1.712 | 0.957 | 0.979 |
|  | Internal resistance | 1.753 | 0.931 | 0.943 |

From TABLE 4, the following has been clarified.

In each of the secondary batteries subjected to the charging and discharging tests of Embodiments 4 to 6, lowering of the internal resistance thereof was observed by supplementing only the electrolyte, but, the secondary battery which had reached such a resistance value as to enable the battery to be reused (<1.2 mΩ) was only that subjected to the charging and discharging test of Embodiment 6. The reason for these results is assumed that the ratio of the first resistance component in the internal resistance of the battery of Embodiment 6 is high, and the first resistance component is decreased by the supplement of the electrolyte, whereby the overall internal resistance greatly decreases. The internal resistances of the batteries of Embodiments 4 and 5 did not decrease to such a level as to enable the battery to be reused by supplementing the electrolyte. The reason for these results is assumed that the second resistance component cannot be decreased.

On the other hand, the internal resistances of the secondary batteries of Embodiments 4 and 5 subjected to the charging and discharging tests, in which the internal resistances did not sufficiently decrease by only supplementing the electrolyte, decreased to such a resistance value as to enable the battery to be reused by supplementing the electrolyte to which the reducing agent is added. The reason for these results is assumed that the second resistance component is decreased with the addition of the reducing agent.

Furthermore, the internal resistance of the secondary battery of Embodiment 3 subjected to the charging and discharging test did not decrease to such a resistance value as to enable the battery to be reused with these regenerating treatments.

This secondary battery of Embodiment 3 is difficult to regenerate with a positive electrode and negative electrode held within a battery casing. So, it is necessary to take the negative electrode from the battery casing and regenerate it, or to mechanically separate an active material from the negative electrode in the liquid having nonoxidizing properties, and subject the active material to the reducing treatment.

What is claimed is:

1. A method for judging the condition of a secondary battery by applying an AC voltage to the secondary battery to detect a) a quantity of electricity, which is related to an impedance of the secondary battery, and b) a quantity of electricity, which is related to the maximum power density, and judging the performance of the secondary battery based on the detected quantity of electricity, comprising the steps of:
    obtaining a quantity of electricity related to the component of the impedance of the secondary battery, which does not vary with the frequency component of the AC voltage, as a DC impedance related quantity of electricity;
    obtaining the quantity of electricity related to the component of the impedance of the secondary battery, which varies with the frequency component of the AC voltage, as an AC impedance related quantity of electricity; and
    determining the secondary battery is good when both said DC impedance related quantity of electricity and said AC impedance related quantity of electricity are respectively predetermined values or less while determining the secondary battery is inferior when both said DC impedance related quantity of electricity and said AC impedance related quantity of electricity are respectively more than predetermined values.

2. A method for judging the condition of a secondary battery by applying an AC voltage to the secondary battery to detect a) a quantity of electricity, which is related to an impedance of the secondary battery, and b) a quantity of electricity, which is related to the maximum power density, and judging the performance of the secondary battery based on the detected quantity of electricity, comprising the steps of:
    obtaining a quantity of electricity related to the component of the impedance of the secondary battery, which does not vary with the frequency component of the AC voltage, as a DC impedance related quantity of electricity;

obtaining the quantity of electricity related to the component of the impedance of the secondary battery, which varies with the frequency component of the AC voltage, as an AC impedance related quantity of electricity; and determining the secondary battery is good when both said DC impedance related quantity of electricity and said AC impedance related quantity of electricity are respectively predetermined values or less while determining the secondary battery is inferior when both said DC impedance related quantity of electricity and said AC impedance related quantity of electricity are respectively more than predetermined values, wherein by applying an AC voltage of a large number of frequency values within a predetermined frequency band to the secondary battery, a real axis component and imaginary axis component of said impedance of the secondary battery are obtained against each frequency value, and said quantity of electricity, which is related to the impedance, is calculated from the obtained real axis component and imaginary axis component.

3. A method for judging the condition of a secondary battery by applying an AC voltage to the secondary battery to detect a) a quantity of electricity, which is related to an impedance of the secondary battery, and b) a quantity of electricity, which is related to the maximum power density, and judging the performance of the secondary battery based on the detected quantity of electricity, comprising the steps of:

obtaining a quantity of electricity related to the component of the impedance of the secondary battery, which does not vary with the frequency component of the AC voltage, as a DC impedance related quantity of electricity;

obtaining the quantity of electricity related to the component of the impedance of the secondary battery, which varies with the frequency component of the AC voltage, as an AC impedance related quantity of electricity; and determining the secondary battery is good when both said DC impedance related quantity of electricity and said AC impedance related quantity of electricity are respectively predetermined values or less while determining the secondary battery is inferior when both said DC impedance related quantity of electricity and said AC impedance related quantity of electricity are respectively more than predetermined values, wherein said AC impedance component is calculated based on a diameter of a circular arc-shaped locus of said impedance in a two-dimensional plane of which axes are said real axis component and said imaginary axis component.

* * * * *